(12) United States Patent
Elolampi et al.

(10) Patent No.: US 9,159,635 B2
(45) Date of Patent: Oct. 13, 2015

(54) FLEXIBLE ELECTRONIC STRUCTURE

(75) Inventors: Brian Elolampi, Belmont, MA (US); Roozbeh Ghaffari, Cambridge, MA (US); Bassel de Graff, San Juan (TT); William Arora, Bellevue, WA (US); Xiaolong Hu, Cambridge, MA (US)

(73) Assignee: MC10, Inc., Lexington, MA (US)

( * ) Notice: Subject to any disclaimer, the term of this patent is extended or adjusted under 35 U.S.C. 154(b) by 0 days.

(21) Appl. No.: 13/481,843

(22) Filed: May 27, 2012
(Under 37 CFR 1.47)

(65) Prior Publication Data
US 2013/0099358 A1 Apr. 25, 2013

Related U.S. Application Data

(60) Provisional application No. 61/490,826, filed on May 27, 2011.

(51) Int. Cl.
*H01L 29/06* (2006.01)
*H05K 1/00* (2006.01)
(Continued)

(52) U.S. Cl.
CPC ............ *H01L 23/13* (2013.01); *H01L 21/6835* (2013.01); *H01L 23/4985* (2013.01); *H01L 25/0655* (2013.01); *H01L 25/072* (2013.01); *H01L 25/50* (2013.01); *H01L 23/5389* (2013.01); *H01L 2221/6835* (2013.01);
(Continued)

(58) Field of Classification Search
CPC .. H01L 23/13; H01L 23/4985; H01L 21/6835
USPC ......... 257/773, 778, 787–788, 791–792, 618; 174/254, 258
See application file for complete search history.

(56) References Cited

U.S. PATENT DOCUMENTS 3,716,861 A  2/1973  Root
3,805,427 A  4/1974  Epstein
(Continued)

FOREIGN PATENT DOCUMENTS

CN  1222758   7/1999
CN  1454045   11/2003
(Continued)

OTHER PUBLICATIONS

Ahn, H. et al., "Additive Soft Lithographic Patterning of Submicron and Nanometer-Scale Large Area Resists on Electronic Materials," *Nano Letters*, 5, 2533-2537 (2005).
(Continued)

*Primary Examiner* — Jose R Diaz
(74) *Attorney, Agent, or Firm* — Nixon Peabody LLP

(57) ABSTRACT

Flexible electronic structure and methods for fabricating flexible electronic structures are provided. An example method includes applying a first layer to a substrate, creating a plurality of vias through the first layer to the substrate, and applying a second polymer layer to the first layer such that the second polymer forms anchors contacting at least a portion of the substrate. At least one electronic device layer is disposed on a portion of the second polymer layer. At least one trench is formed through the second polymer layer to expose at least a portion of the first layer. At least a portion of the first layer is removed by exposing the structure to a selective etchant to providing a flexible electronic structure that is in contact with the substrate. The electronic structure can be released from the substrate.

29 Claims, 24 Drawing Sheets

(51) Int. Cl.
*H01L 23/13* (2006.01)
*H01L 23/498* (2006.01)
*H01L 21/683* (2006.01)
*H01L 25/065* (2006.01)
*H01L 25/07* (2006.01)
*H01L 25/00* (2006.01)
*H01L 23/538* (2006.01)

(52) U.S. Cl.
CPC ............. *H01L2221/68318* (2013.01); *H01L 2221/68368* (2013.01); *H01L 2221/68381* (2013.01); *H01L 2224/24137* (2013.01); *H01L 2224/73267* (2013.01); *H01L 2224/92244* (2013.01); *H01L 2924/1461* (2013.01)

(56) References Cited

U.S. PATENT DOCUMENTS

| | | |
|---|---|---|
| 3,949,410 A | 4/1976 | Bassous |
| 4,058,418 A | 11/1977 | Lindmayer |
| 4,392,451 A | 7/1983 | Mickelsen et al. |
| 4,416,288 A | 11/1983 | Freeman |
| 4,471,003 A | 9/1984 | Cann |
| 4,487,162 A | 12/1984 | Cann |
| 4,658,153 A | 4/1987 | Brosh et al. |
| 4,663,828 A | 5/1987 | Hanak |
| 4,761,335 A | 8/1988 | Aurichio et al. |
| 4,763,275 A | 8/1988 | Carlin |
| 4,766,670 A | 8/1988 | Gazdik et al. |
| 4,784,720 A | 11/1988 | Douglas |
| 4,855,017 A | 8/1989 | Douglas |
| 4,900,878 A * | 2/1990 | Ichkhan ............ 174/258 |
| 5,041,973 A | 8/1991 | Lebron et al. |
| 5,086,785 A | 2/1992 | Gentile et al. |
| 5,108,819 A | 4/1992 | Heller et al. |
| 5,118,400 A | 6/1992 | Wollam |
| 5,147,519 A | 9/1992 | Legge |
| 5,178,957 A | 1/1993 | Kolpe et al. |
| 5,204,144 A | 4/1993 | Cann et al. |
| 5,250,903 A | 10/1993 | Limuti |
| 5,306,917 A | 4/1994 | Black et al. |
| 5,313,094 A | 5/1994 | Beyer et al. |
| 5,331,966 A | 7/1994 | Bennett et al. |
| 5,360,987 A | 11/1994 | Shibib |
| 5,403,700 A | 4/1995 | Heller et al. |
| 5,427,096 A | 6/1995 | Bogusiewicz et al. |
| 5,434,751 A | 7/1995 | Cole, Jr. et al. |
| 5,439,575 A | 8/1995 | Thornton et al. |
| 5,455,178 A | 10/1995 | Fattinger |
| 5,455,430 A | 10/1995 | Noguchi et al. |
| 5,469,845 A | 11/1995 | Delonzor et al. |
| 5,477,088 A | 12/1995 | Rockett et al. |
| 5,501,893 A | 3/1996 | Laermer et al. |
| 5,525,815 A | 6/1996 | Einset |
| 5,539,935 A | 7/1996 | Rush, III |
| 5,545,291 A | 8/1996 | Smith et al. |
| 5,549,108 A | 8/1996 | Edwards et al. |
| 5,560,974 A | 10/1996 | Langley |
| 5,567,975 A | 10/1996 | Walsh et al. |
| 5,625,471 A | 4/1997 | Smith |
| 5,648,148 A | 7/1997 | Simpson |
| 5,687,737 A | 11/1997 | Branham et al. |
| 5,691,245 A | 11/1997 | Bakhit et al. |
| 5,746,207 A | 5/1998 | McLaughlin |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,790,151 A | 8/1998 | Mills |
| 5,811,790 A | 9/1998 | Endo et al. |
| 5,817,242 A | 10/1998 | Biebuyck et al. |
| 5,824,186 A | 10/1998 | Smith et al. |
| 5,837,546 A | 11/1998 | Allen |
| 5,860,974 A | 1/1999 | Abele |
| 5,871,443 A | 2/1999 | Edwards et al. |
| 5,904,545 A | 5/1999 | Smith et al. |
| 5,907,189 A | 5/1999 | Mertol |
| 5,907,477 A | 5/1999 | Tuttle et al. |
| 5,915,180 A | 6/1999 | Hara et al. |
| 5,917,534 A | 6/1999 | Rajeswaran |
| 5,919,155 A | 7/1999 | Lattin |
| 5,928,001 A | 7/1999 | Gillette et al. |
| 5,955,781 A | 9/1999 | Joshi et al. |
| 5,968,839 A | 10/1999 | Blatt |
| 5,976,683 A | 11/1999 | Liehrr et al. |
| 5,978,972 A | 11/1999 | Stewart et al. |
| 5,998,291 A | 12/1999 | Bakhit et al. |
| 6,009,632 A | 1/2000 | Douglas |
| 6,024,702 A | 2/2000 | Iversen |
| 6,057,212 A | 5/2000 | Chan et al. |
| 6,063,046 A | 5/2000 | Allum |
| 6,080,608 A | 6/2000 | Nowak |
| 6,097,984 A | 8/2000 | Douglas |
| 6,121,110 A | 9/2000 | Hong |
| 6,148,127 A | 11/2000 | Adams et al. |
| 6,150,602 A | 11/2000 | Campbell |
| 6,165,391 A | 12/2000 | Vedamuttu |
| 6,165,885 A | 12/2000 | Gaynes et al. |
| 6,171,730 B1 | 1/2001 | Kuroda et al. |
| 6,181,551 B1 | 1/2001 | Herman |
| 6,225,149 B1 | 5/2001 | Gan et al. |
| 6,236,883 B1 | 5/2001 | Ciaccio et al. |
| 6,265,326 B1 | 7/2001 | Ueno |
| 6,274,508 B1 | 8/2001 | Jacobsen et al. |
| 6,276,775 B1 | 8/2001 | Schulte |
| 6,277,712 B1 | 8/2001 | Kang et al. |
| 6,281,038 B1 | 8/2001 | Jacobsen et al. |
| 6,282,960 B1 | 9/2001 | Samuels et al. |
| 6,284,418 B1 | 9/2001 | Trantolo |
| 6,287,517 B1 * | 9/2001 | Ackley et al. ............ 422/68.1 |
| 6,291,896 B1 | 9/2001 | Smith |
| 6,301,500 B1 | 10/2001 | Van Herk |
| 6,309,351 B1 | 10/2001 | Kurnik |
| 6,316,278 B1 | 11/2001 | Jacobsen et al. |
| 6,316,283 B1 | 11/2001 | Saurer |
| 6,317,175 B1 | 11/2001 | Salerno et al. |
| 6,322,895 B1 | 11/2001 | Canham |
| 6,322,963 B1 | 11/2001 | Bauer |
| 6,334,960 B1 | 1/2002 | Willson et al. |
| 6,344,616 B1 | 2/2002 | Yokokawa |
| 6,360,615 B1 | 3/2002 | Smela |
| 6,380,729 B1 | 4/2002 | Smith |
| 6,403,397 B1 | 6/2002 | Katz |
| 6,403,944 B1 | 6/2002 | MacKenzie |
| 6,413,790 B1 | 7/2002 | Duthaler et al. |
| 6,414,783 B2 | 7/2002 | Zavracky et al. |
| 6,417,025 B1 | 7/2002 | Gengel |
| 6,420,266 B1 | 7/2002 | Smith et al. |
| 6,433,401 B1 | 8/2002 | Clark et al. |
| 6,451,191 B1 | 9/2002 | Bentsen et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,504,105 B1 | 1/2003 | Acocella et al. |
| 6,517,995 B1 | 2/2003 | Jacobson et al. |
| 6,518,168 B1 | 2/2003 | Clem et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,567,158 B1 | 5/2003 | Falciai et al. |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,613,979 B1 | 9/2003 | Miller et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |

(56) References Cited

U.S. PATENT DOCUMENTS

| | | | |
|---|---|---|---|
| 6,666,821 B2 | 12/2003 | Keimel |
| 6,667,548 B2 | 12/2003 | O'Connor et al. |
| 6,683,663 B1 | 1/2004 | Hadley et al. |
| 6,693,384 B1 | 2/2004 | Vicentini et al. |
| 6,706,402 B2 | 3/2004 | Rueckes et al. |
| 6,720,469 B1 | 4/2004 | Curtis et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 * | 6/2004 | Biegelsen et al. .......... 174/69 |
| 6,762,510 B2 | 7/2004 | Fock et al. |
| 6,780,696 B1 | 8/2004 | Schatz |
| 6,784,450 B2 | 8/2004 | Pan et al. |
| 6,784,844 B1 | 8/2004 | Boakes et al. |
| 6,787,052 B1 | 9/2004 | Vaganov |
| 6,805,809 B2 | 10/2004 | Nuzzo et al. |
| 6,814,898 B1 | 11/2004 | Deeman et al. |
| 6,816,380 B2 | 11/2004 | Credelle et al. |
| 6,826,509 B2 | 11/2004 | Crisco, III et al. |
| 6,836,744 B1 | 12/2004 | Asphahani et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,856,830 B2 | 2/2005 | He |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,881,979 B2 | 4/2005 | Starikov et al. |
| 6,885,030 B2 | 4/2005 | Onozuka et al. |
| 6,887,450 B2 | 5/2005 | Chen et al. |
| 6,900,094 B2 | 5/2005 | Hammond et al. |
| 6,917,061 B2 | 7/2005 | Pan et al. |
| 6,936,181 B2 | 8/2005 | Bulthaup et al. |
| 6,949,199 B1 | 9/2005 | Gauzner et al. |
| 6,949,206 B2 | 9/2005 | Whiteford et al. |
| 6,950,220 B2 | 9/2005 | Abramson et al. |
| 6,967,362 B2 | 11/2005 | Nam et al. |
| 6,984,934 B2 | 1/2006 | Moller et al. |
| 6,989,285 B2 | 1/2006 | Ball |
| 7,029,951 B2 | 4/2006 | Chen et al. |
| 7,033,961 B1 | 4/2006 | Smart et al. |
| 7,054,784 B2 | 5/2006 | Flentov et al. |
| 7,067,903 B2 | 6/2006 | Tachibana et al. |
| 7,081,642 B2 | 7/2006 | Onozuka et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,158,277 B2 | 1/2007 | Berggren et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,190,051 B2 | 3/2007 | Mech et al. |
| 7,195,733 B2 | 3/2007 | Rogers et al. |
| 7,223,609 B2 | 5/2007 | Anvar et al. |
| 7,223,632 B2 | 5/2007 | Onozuka et al. |
| 7,252,664 B2 | 8/2007 | Nasab et al. |
| 7,253,442 B2 | 8/2007 | Huang et al. |
| 7,255,919 B2 | 8/2007 | Sakata et al. |
| 7,265,298 B2 | 9/2007 | Maghribi |
| 7,291,146 B2 | 11/2007 | Steinke et al. |
| 7,291,540 B2 | 11/2007 | Mech et al. |
| 7,293,353 B2 | 11/2007 | Matsuda |
| 7,302,751 B2 | 12/2007 | Hamburgen |
| 7,337,012 B2 | 2/2008 | Maghribi |
| 7,374,968 B2 | 5/2008 | Kornilovich et al. |
| 7,425,523 B2 | 9/2008 | Ikemizu et al. |
| 7,487,587 B2 | 2/2009 | Vanfleteren |
| 7,491,892 B2 | 2/2009 | Wagner |
| 7,509,835 B2 | 3/2009 | Beck |
| 7,521,292 B2 | 4/2009 | Rogers |
| 7,525,304 B1 | 4/2009 | Feng et al. |
| 7,526,389 B2 | 4/2009 | Greenwald et al. |
| 7,552,031 B2 | 6/2009 | Vock et al. |
| 7,557,367 B2 | 7/2009 | Rodgers |
| 7,593,086 B2 | 9/2009 | Jeong et al. |
| 7,618,260 B2 | 11/2009 | Daniel et al. |
| 7,622,367 B1 | 11/2009 | Nuzzo |
| 7,629,691 B2 | 12/2009 | Roush et al. |
| 7,633,761 B2 | 12/2009 | Kim |
| 7,635,755 B2 | 12/2009 | Kaplan et al. |
| 7,674,882 B2 | 3/2010 | Kaplan et al. |
| 7,700,402 B2 | 4/2010 | Wild et al. |
| 7,704,684 B2 | 4/2010 | Rogers et al. |
| 7,705,280 B2 | 4/2010 | Nuzzo et al. |
| 7,709,961 B2 | 5/2010 | Greenberg et al. |
| 7,727,199 B2 | 6/2010 | Fernandes et al. |
| 7,727,575 B2 | 6/2010 | Kaplan et al. |
| 7,732,012 B2 | 6/2010 | Hongu et al. |
| 7,742,795 B2 | 6/2010 | Stone et al. |
| 7,759,167 B2 | 7/2010 | Vanfleteren |
| 7,769,472 B2 | 8/2010 | Gerber |
| 7,799,699 B2 | 9/2010 | Nuzzo et al. |
| 7,838,964 B2 | 11/2010 | Carobolante et al. |
| 7,842,780 B2 | 11/2010 | Kaplan et al. |
| 7,857,781 B2 | 12/2010 | Noda et al. |
| 7,871,661 B2 | 1/2011 | Maghribi et al. |
| 7,884,540 B2 | 2/2011 | Sung et al. |
| 7,909,971 B2 | 3/2011 | Nuzzo et al. |
| 7,932,123 B2 | 4/2011 | Rogers et al. |
| 7,935,056 B2 | 5/2011 | Zdeblick |
| 7,943,491 B2 | 5/2011 | Nuzzo et al. |
| 7,960,246 B2 | 6/2011 | Flamand |
| 7,972,875 B2 | 7/2011 | Rogers et al. |
| 7,982,296 B2 | 7/2011 | Nuzzo |
| 8,008,575 B2 | 8/2011 | De Ceuster et al. |
| 8,039,847 B2 | 10/2011 | Nuzzo et al. |
| 8,097,926 B2 | 1/2012 | De Graff |
| 8,107,248 B2 | 1/2012 | Shin et al. |
| 8,198,621 B2 | 6/2012 | Rogers |
| 8,207,473 B2 | 6/2012 | Axisa |
| 8,217,381 B2 | 7/2012 | Rodgers |
| 8,252,191 B2 | 8/2012 | Heejoon et al. |
| 8,367,035 B2 | 2/2013 | Rogers et al. |
| 8,372,726 B2 | 2/2013 | De Graff |
| 8,389,862 B2 | 3/2013 | Arora |
| 8,394,706 B2 | 3/2013 | Nuzzo et al. |
| 8,431,828 B2 | 4/2013 | Vanfleteren |
| 8,440,546 B2 | 5/2013 | Nuzzo |
| 8,536,667 B2 | 9/2013 | De Graff |
| 8,552,299 B2 | 10/2013 | Rodgers |
| 8,664,699 B2 | 3/2014 | Nuzzo |
| 8,679,888 B2 | 3/2014 | Rodgers |
| 8,729,524 B2 | 5/2014 | Rodgers |
| 8,754,396 B2 | 6/2014 | Rogers |
| 8,865,489 B2 | 10/2014 | Rodgers |
| 8,886,334 B2 | 11/2014 | Ghaffari |
| 8,905,772 B2 | 12/2014 | Rodgers |
| 9,012,784 B2 | 4/2015 | Arora et al. |
| 2001/0003043 A1 | 6/2001 | Metspalu et al. |
| 2001/0012918 A1 | 8/2001 | Swanson |
| 2001/0021867 A1 | 9/2001 | Kordis |
| 2002/0021445 A1 | 2/2002 | Bozhevolnyi et al. |
| 2002/0026127 A1 | 2/2002 | Balbierz et al. |
| 2002/0082515 A1 | 6/2002 | Campbell et al. |
| 2002/0094701 A1 | 7/2002 | Biegelsen et al. |
| 2002/0095087 A1 | 7/2002 | Mourad et al. |
| 2002/0110766 A1 | 8/2002 | Tsai et al. |
| 2002/0113739 A1 | 8/2002 | Howard |
| 2002/0128700 A1 | 9/2002 | Cross, Jr. |
| 2002/0151934 A1 | 10/2002 | Levine |
| 2003/0006527 A1 | 1/2003 | Rabolt et al. |
| 2003/0017848 A1 | 1/2003 | Engstrom et al. |
| 2003/0032892 A1 | 2/2003 | Erlach et al. |
| 2003/0082889 A1 | 5/2003 | Maruyama et al. |
| 2003/0087476 A1 | 5/2003 | Oohata et al. |
| 2003/0097165 A1 | 5/2003 | Krulevitch et al. |
| 2003/0120271 A1 | 6/2003 | Burnside et al. |
| 2003/0138704 A1 | 7/2003 | Mei et al. |
| 2003/0149456 A1 | 8/2003 | Rottenberg et al. |
| 2003/0171691 A1 | 9/2003 | Casscells et al. |
| 2003/0178316 A1 | 9/2003 | Jacobs et al. |

(56) References Cited

U.S. PATENT DOCUMENTS

| | | |
|---|---|---|
| 2003/0214408 A1 | 11/2003 | Grajales |
| 2003/0222282 A1 | 12/2003 | Fjelstad et al. |
| 2003/0227116 A1 | 12/2003 | Halik et al. |
| 2004/0005723 A1 | 1/2004 | Empedocles et al. |
| 2004/0006264 A1 | 1/2004 | Mojarradi et al. |
| 2004/0026684 A1 | 2/2004 | Empedocles et al. |
| 2004/0061543 A1 | 4/2004 | Nam et al. |
| 2004/0079464 A1 | 4/2004 | Kumakura |
| 2004/0081384 A1 | 4/2004 | Datesman et al. |
| 2004/0085469 A1 | 5/2004 | Johnson |
| 2004/0092806 A1 | 5/2004 | Sagon |
| 2004/0095658 A1 | 5/2004 | Buretea et al. |
| 2004/0106334 A1 | 6/2004 | Suzuki et al. |
| 2004/0112964 A1 | 6/2004 | Empedocles et al. |
| 2004/0135094 A1 | 7/2004 | Niigaki et al. |
| 2004/0136866 A1 | 7/2004 | Pontis et al. |
| 2004/0138558 A1 | 7/2004 | Dunki-Jacobs et al. |
| 2004/0146560 A1 | 7/2004 | Whiteford et al. |
| 2004/0149921 A1 | 8/2004 | Smyk |
| 2004/0155290 A1 | 8/2004 | Mech et al. |
| 2004/0171969 A1 | 9/2004 | Socci |
| 2004/0178390 A1 | 9/2004 | Whiteford |
| 2004/0178466 A1 | 9/2004 | Merrill et al. |
| 2004/0192062 A1 | 9/2004 | Mikelson |
| 2004/0192082 A1 | 9/2004 | Wagner et al. |
| 2004/0200734 A1 | 10/2004 | Co |
| 2004/0206448 A1 | 10/2004 | Dubrow |
| 2004/0211458 A1 | 10/2004 | Gui et al. |
| 2004/0211459 A1 | 10/2004 | Suenaga et al. |
| 2004/0229830 A1 | 11/2004 | Tachibana et al. |
| 2004/0239650 A1 | 12/2004 | Mackey |
| 2004/0243204 A1 | 12/2004 | Maghribi |
| 2004/0250950 A1 | 12/2004 | Dubrow |
| 2004/0252559 A1 | 12/2004 | Gupta |
| 2005/0020094 A1 | 1/2005 | Forbes et al. |
| 2005/0021103 A1 | 1/2005 | DiLorenzo |
| 2005/0037511 A1 | 2/2005 | Sharrock |
| 2005/0038498 A1 | 2/2005 | Dubrow et al. |
| 2005/0054939 A1 | 3/2005 | Ben-Ari et al. |
| 2005/0082526 A1 | 4/2005 | Bedell et al. |
| 2005/0107716 A1 | 5/2005 | Eaton et al. |
| 2005/0113744 A1 | 5/2005 | Donoghue |
| 2005/0115308 A1 | 6/2005 | Koram et al. |
| 2005/0124712 A1 | 6/2005 | Anderson et al. |
| 2005/0133954 A1 | 6/2005 | Homola |
| 2005/0136501 A1 | 6/2005 | Kuriger |
| 2005/0171524 A1 | 8/2005 | Stern et al. |
| 2005/0177335 A1 | 8/2005 | Crisco |
| 2005/0203366 A1 | 9/2005 | Donoghue et al. |
| 2005/0214962 A1 | 9/2005 | Daniels et al. |
| 2005/0227389 A1 | 10/2005 | Bhattacharya et al. |
| 2005/0233546 A1 | 10/2005 | Oohata et al. |
| 2005/0238967 A1 | 10/2005 | Rogers et al. |
| 2005/0255686 A1 | 11/2005 | Yamano et al. |
| 2005/0260706 A1 | 11/2005 | Kaplan et al. |
| 2005/0261561 A1 | 11/2005 | Jones et al. |
| 2006/0038182 A1 | 2/2006 | Rodgers |
| 2006/0049485 A1 | 3/2006 | Pan et al. |
| 2006/0056161 A1 | 3/2006 | Shin et al. |
| 2006/0068576 A1 | 3/2006 | Burdick, Jr. et al. |
| 2006/0076561 A1 | 4/2006 | Hioki et al. |
| 2006/0084012 A1 | 4/2006 | Nuzzo et al. |
| 2006/0084394 A1 | 4/2006 | Engstrom et al. |
| 2006/0085976 A1 | 4/2006 | Eldridge et al. |
| 2006/0102525 A1 | 5/2006 | Volkel et al. |
| 2006/0106321 A1 | 5/2006 | Lewinsky et al. |
| 2006/0119853 A1 | 6/2006 | Baumberg et al. |
| 2006/0127817 A1 | 6/2006 | Ramanujan et al. |
| 2006/0129056 A1 | 6/2006 | Leuthardt et al. |
| 2006/0134893 A1 | 6/2006 | Savage et al. |
| 2006/0154398 A1 | 7/2006 | Qing et al. |
| 2006/0159837 A1 | 7/2006 | Kaplan et al. |
| 2006/0169989 A1 | 8/2006 | Bhattacharya et al. |
| 2006/0173364 A1 | 8/2006 | Clancy et al. |
| 2006/0177479 A1 | 8/2006 | Giachelli et al. |
| 2006/0178655 A1 | 8/2006 | Santini et al. |
| 2006/0244105 A1 | 11/2006 | Forbes et al. |
| 2006/0255341 A1 | 11/2006 | Pinnington et al. |
| 2006/0273279 A1 | 12/2006 | Kaplan et al. |
| 2006/0279191 A1 | 12/2006 | Geohegan et al. |
| 2006/0286488 A1 | 12/2006 | Rogers et al. |
| 2006/0286785 A1 | 12/2006 | Rogers |
| 2007/0009968 A1 | 1/2007 | Cunningham et al. |
| 2007/0027514 A1 | 2/2007 | Gerber |
| 2007/0031607 A1 | 2/2007 | Dubson et al. |
| 2007/0032089 A1 | 2/2007 | Nuzzo et al. |
| 2007/0043416 A1 | 2/2007 | Callas et al. |
| 2007/0058254 A1 | 3/2007 | Kim |
| 2007/0073130 A1 | 3/2007 | Finch et al. |
| 2007/0104944 A1 | 5/2007 | Laude et al. |
| 2007/0108389 A1 | 5/2007 | Makela et al. |
| 2007/0122819 A1 | 5/2007 | Wu |
| 2007/0187862 A1 | 8/2007 | Kaplan et al. |
| 2007/0212730 A1 | 9/2007 | Vepari et al. |
| 2007/0213616 A1 | 9/2007 | Anderson et al. |
| 2007/0227586 A1 | 10/2007 | Zapalac |
| 2007/0233208 A1 | 10/2007 | Kurtz et al. |
| 2007/0254468 A1 | 11/2007 | Burdick, Jr. et al. |
| 2008/0000871 A1 | 1/2008 | Suh et al. |
| 2008/0008626 A1 | 1/2008 | Lin et al. |
| 2008/0038236 A1 | 2/2008 | Gimble et al. |
| 2008/0041617 A1 | 2/2008 | Chen et al. |
| 2008/0046080 A1 | 2/2008 | Vanden Bulcke |
| 2008/0054875 A1 | 3/2008 | Saito |
| 2008/0055581 A1 | 3/2008 | Rogers et al. |
| 2008/0077225 A1 | 3/2008 | Carlin et al. |
| 2008/0085272 A1 | 4/2008 | Kaplan et al. |
| 2008/0090322 A1 | 4/2008 | Mech et al. |
| 2008/0102096 A1 | 5/2008 | Molin et al. |
| 2008/0108171 A1 | 5/2008 | Rogers et al. |
| 2008/0108942 A1 | 5/2008 | Brister et al. |
| 2008/0140152 A1 | 6/2008 | Imran |
| 2008/0152281 A1 | 6/2008 | Lundquist et al. |
| 2008/0157234 A1 | 7/2008 | Hong |
| 2008/0157235 A1 | 7/2008 | Rodgers |
| 2008/0183076 A1 | 7/2008 | Witte et al. |
| 2008/0188912 A1 | 8/2008 | Stone et al. |
| 2008/0193749 A1 | 8/2008 | Thompson et al. |
| 2008/0203268 A1 | 8/2008 | Hobbs et al. |
| 2008/0203431 A1 | 8/2008 | Garcia et al. |
| 2008/0204021 A1 | 8/2008 | Leussler et al. |
| 2008/0208268 A1 | 8/2008 | Bartic |
| 2008/0212102 A1 | 9/2008 | Nuzzo et al. |
| 2008/0239755 A1 | 10/2008 | Parker et al. |
| 2008/0257586 A1 | 10/2008 | Chen et al. |
| 2008/0259576 A1 | 10/2008 | Johnson et al. |
| 2008/0280360 A1 | 11/2008 | Kaplan et al. |
| 2008/0287167 A1 | 11/2008 | Caine |
| 2008/0288037 A1 | 11/2008 | Neysmith et al. |
| 2008/0293919 A1 | 11/2008 | Kaplan et al. |
| 2008/0313552 A1 | 12/2008 | Buehler et al. |
| 2009/0000377 A1 | 1/2009 | Shipps et al. |
| 2009/0001550 A1 | 1/2009 | Li et al. |
| 2009/0004737 A1 | 1/2009 | Borenstein et al. |
| 2009/0015560 A1 | 1/2009 | Robinson et al. |
| 2009/0028910 A1 | 1/2009 | Desimone et al. |
| 2009/0054742 A1 | 2/2009 | Kaminska et al. |
| 2009/0088750 A1 | 4/2009 | Hushka et al. |
| 2009/0105605 A1 | 4/2009 | Abreu |
| 2009/0107704 A1 | 4/2009 | Vanfleteren |
| 2009/0149930 A1 | 6/2009 | Schenck |
| 2009/0183986 A1 | 7/2009 | Johnson et al. |
| 2009/0184254 A1 | 7/2009 | Miura |
| 2009/0198293 A1 | 8/2009 | Cauller et al. |
| 2009/0199960 A1 | 8/2009 | Nuzzo et al. |
| 2009/0202614 A1 | 8/2009 | Kaplan et al. |
| 2009/0204168 A1 | 8/2009 | Kallmyer et al. |
| 2009/0208555 A1 | 8/2009 | Kuttler et al. |
| 2009/0215385 A1 | 8/2009 | Waters et al. |
| 2009/0221896 A1 | 9/2009 | Rickert et al. |
| 2009/0232963 A1 | 9/2009 | Kaplan et al. |
| 2009/0234026 A1 | 9/2009 | Kaplan et al. |
| 2009/0247909 A1 | 10/2009 | Mukumoto |
| 2009/0261828 A1 | 10/2009 | Nordmeyer-Massner |

(56) References Cited

U.S. PATENT DOCUMENTS

| | | |
|---|---|---|
| 2009/0264972 A1* | 10/2009 | Zhou et al. .................. 607/116 |
| 2009/0273909 A1 | 11/2009 | Shin et al. |
| 2009/0289246 A1 | 11/2009 | Schneider et al. |
| 2009/0294803 A1 | 12/2009 | Nuzzo |
| 2009/0308455 A1 | 12/2009 | Kirscht et al. |
| 2009/0317639 A1 | 12/2009 | Axisa et al. |
| 2009/0322480 A1 | 12/2009 | Benedict et al. |
| 2010/0002402 A1 | 1/2010 | Rodgers |
| 2010/0028451 A1 | 2/2010 | Kaplan et al. |
| 2010/0046902 A1 | 2/2010 | Kaplan et al. |
| 2010/0052112 A1 | 3/2010 | Rogers et al. |
| 2010/0055438 A1 | 3/2010 | Kaplan et al. |
| 2010/0059863 A1 | 3/2010 | Rogers |
| 2010/0063404 A1 | 3/2010 | Kaplan et al. |
| 2010/0065784 A1 | 3/2010 | Kaplan et al. |
| 2010/0068740 A1 | 3/2010 | Kaplan et al. |
| 2010/0070068 A1 | 3/2010 | Kaplan et al. |
| 2010/0072577 A1 | 3/2010 | Nuzzo |
| 2010/0073669 A1 | 3/2010 | Colvin, Jr. et al. |
| 2010/0087782 A1 | 4/2010 | Ghaffari |
| 2010/0090824 A1 | 4/2010 | Rowell et al. |
| 2010/0096763 A1 | 4/2010 | Kaplan et al. |
| 2010/0116526 A1 | 5/2010 | Arora |
| 2010/0117660 A1 | 5/2010 | Douglas et al. |
| 2010/0120116 A1 | 5/2010 | Kaplan et al. |
| 2010/0121420 A1 | 5/2010 | Fiset et al. |
| 2010/0152619 A1 | 6/2010 | Kalpaxis et al. |
| 2010/0176705 A1 | 7/2010 | Van Herpen et al. |
| 2010/0178304 A1 | 7/2010 | Wang et al. |
| 2010/0178722 A1 | 7/2010 | De Graff |
| 2010/0188799 A1 | 7/2010 | Galvagni et al. |
| 2010/0191328 A1 | 7/2010 | Kaplan et al. |
| 2010/0196447 A1 | 8/2010 | Kaplan et al. |
| 2010/0200752 A1 | 8/2010 | Lee et al. |
| 2010/0203226 A1 | 8/2010 | Kaplan et al. |
| 2010/0245011 A1 | 9/2010 | Chatzopoulos et al. |
| 2010/0252840 A1 | 10/2010 | Ibbetson et al. |
| 2010/0271191 A1 | 10/2010 | De Graff |
| 2010/0279112 A1 | 11/2010 | Kaplan et al. |
| 2010/0283069 A1 | 11/2010 | Rogers et al. |
| 2010/0289124 A1 | 11/2010 | Nuzzo et al. |
| 2010/0298895 A1 | 11/2010 | Ghaffari |
| 2010/0317132 A1 | 12/2010 | Rodgers |
| 2010/0321161 A1 | 12/2010 | Isabell |
| 2010/0327387 A1 | 12/2010 | Kasai et al. |
| 2011/0011179 A1 | 1/2011 | Gustafsson et al. |
| 2011/0018838 A1 | 1/2011 | Lee et al. |
| 2011/0034912 A1 | 2/2011 | De Graff |
| 2011/0054583 A1 | 3/2011 | Litt |
| 2011/0068672 A1 | 3/2011 | Hasnain |
| 2011/0081587 A1 | 4/2011 | Choi et al. |
| 2011/0114894 A1 | 5/2011 | Choi et al. |
| 2011/0121822 A1 | 5/2011 | Parsche |
| 2011/0140897 A1 | 6/2011 | Purks et al. |
| 2011/0147715 A1 | 6/2011 | Rogers et al. |
| 2011/0170225 A1 | 7/2011 | Rogers et al. |
| 2011/0171813 A1 | 7/2011 | Rogers et al. |
| 2011/0177332 A1 | 7/2011 | Park et al. |
| 2011/0184320 A1 | 7/2011 | Shipps |
| 2011/0187798 A1 | 8/2011 | Rogers et al. |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0230747 A1 | 9/2011 | Rogers et al. |
| 2011/0266561 A1 | 11/2011 | Rogers et al. |
| 2011/0272181 A1 | 11/2011 | Koo et al. |
| 2011/0277813 A1 | 11/2011 | Rodgers |
| 2011/0316120 A1 | 12/2011 | Rogers et al. |
| 2012/0016258 A1 | 1/2012 | Webster et al. |
| 2012/0051005 A1 | 3/2012 | Vanfleteren |
| 2012/0052268 A1 | 3/2012 | Axisa |
| 2012/0065937 A1 | 3/2012 | De Graff |
| 2012/0083099 A1 | 4/2012 | Nuzzo et al. |
| 2012/0087216 A1 | 4/2012 | Keung et al. |
| 2012/0092178 A1 | 4/2012 | Callsen |
| 2012/0092222 A1 | 4/2012 | Kato et al. |
| 2012/0105528 A1 | 5/2012 | Alleyne |
| 2012/0157804 A1 | 6/2012 | Rodgers |
| 2012/0157986 A1 | 6/2012 | Stone et al. |
| 2012/0157987 A1 | 6/2012 | Steinke et al. |
| 2012/0157988 A1 | 6/2012 | Stone et al. |
| 2012/0157989 A1 | 6/2012 | Stone et al. |
| 2012/0158101 A1 | 6/2012 | Stone et al. |
| 2012/0165759 A1 | 6/2012 | Rogers et al. |
| 2012/0172697 A1 | 7/2012 | Urman |
| 2012/0226130 A1 | 9/2012 | De Graff |
| 2012/0244848 A1 | 9/2012 | Ghaffari |
| 2012/0251824 A1 | 10/2012 | Hur et al. |
| 2012/0256308 A1 | 10/2012 | Helin |
| 2012/0279762 A1 | 11/2012 | Hur et al. |
| 2012/0316455 A1 | 12/2012 | Rahman et al. |
| 2012/0320581 A1 | 12/2012 | Rogers et al. |
| 2012/0327608 A1 | 12/2012 | Rodgers |
| 2013/0036928 A1 | 2/2013 | Rogers et al. |
| 2013/0041235 A1 | 2/2013 | Rodgers |
| 2013/0099358 A1 | 4/2013 | Elolampi |
| 2013/0100618 A1 | 4/2013 | Rogers |
| 2013/0118255 A1 | 5/2013 | Callsen |
| 2013/0150693 A1 | 6/2013 | D'Angelo |
| 2013/0185003 A1 | 7/2013 | Carbeck |
| 2013/0192356 A1 | 8/2013 | De Graff |
| 2013/0200268 A1 | 8/2013 | Rafferty |
| 2013/0225965 A1 | 8/2013 | Ghaffari |
| 2013/0245388 A1 | 9/2013 | Rafferty |
| 2013/0274562 A1 | 10/2013 | Ghaffari |
| 2013/0313713 A1 | 11/2013 | Arora |
| 2013/0316487 A1 | 11/2013 | De Graff |
| 2013/0320503 A1 | 12/2013 | Nuzzo |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |
| 2014/0039290 A1 | 2/2014 | De Graff |
| 2014/0097944 A1 | 4/2014 | Fastert |
| 2014/0110859 A1 | 4/2014 | Rafferty |
| 2014/0140020 A1 | 5/2014 | Rodgers |
| 2014/0188426 A1 | 7/2014 | Fastert |
| 2014/0191236 A1 | 7/2014 | Nuzzo |
| 2014/0216524 A1 | 8/2014 | Rodgers |
| 2014/0240932 A1 | 8/2014 | Hsu |
| 2014/0249520 A1 | 9/2014 | Ghaffari |
| 2014/0303452 A1 | 10/2014 | Ghaffari |
| 2014/0340857 A1 | 11/2014 | Hsu |
| 2014/0374872 A1 | 12/2014 | Rodgers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0035680 A1 | 2/2015 | Li |
| 2015/0069617 A1 | 3/2015 | Arora et al. |
| 2015/0099976 A1 | 4/2015 | Ghaffari et al. |
| 2015/0100135 A1 | 4/2015 | Ives |

FOREIGN PATENT DOCUMENTS

| | | |
|---|---|---|
| CN | 1864095 | 11/2006 |
| CN | 101772348 A | 7/2010 |
| DE | 4241045 C1 | 5/1994 |
| DE | 19748173 | 5/1999 |
| EP | 0929097 | 7/1999 |
| EP | 1357773 | 10/2003 |
| EP | 1 467 224 | 10/2004 |
| EP | 1 477 230 | 11/2004 |
| EP | 1 498 456 | 1/2005 |
| EP | 1 511 096 | 3/2005 |
| EP | 1 558 444 | 8/2005 |
| EP | 1 613 796 | 1/2006 |
| EP | 1746869 | 1/2007 |
| EP | 1 773 240 | 4/2007 |
| EP | 1 915 436 | 4/2008 |
| EP | 1 726 329 | 8/2009 |
| EP | 2 086 749 | 8/2009 |
| EP | 2 101 975 | 9/2009 |
| EP | 2 107 964 | 10/2009 |

(56) References Cited

FOREIGN PATENT DOCUMENTS

| | | |
|---|---:|---:|
| EP | 2 109 634 | 10/2009 |
| EP | 2 129 772 | 12/2009 |
| EP | 2 206 017 | 7/2010 |
| EP | 2 211 876 | 8/2010 |
| EP | 2 249 886 | 11/2010 |
| JP | 01-223064 | 9/1989 |
| JP | 2005126595 | 5/1993 |
| JP | 2006118441 | 4/1994 |
| JP | 2006-163365 | 6/1994 |
| JP | 2011-026344 | 1/1999 |
| JP | 2001332383 | 11/2001 |
| JP | 2001523631 | 11/2001 |
| JP | 2002092984 | 3/2002 |
| JP | 2003182475 | 7/2003 |
| JP | 2003289136 | 10/2003 |
| JP | 2003297974 | 10/2003 |
| JP | 2004506254 | 2/2004 |
| JP | 2005059800 | 3/2005 |
| JP | 2006-504450 | 2/2006 |
| JP | 2006044383 | 2/2006 |
| JP | 2006-186294 | 7/2006 |
| JP | 2007-515391 | 6/2007 |
| JP | 2008-502739 | 1/2008 |
| JP | 2008-531137 | 8/2008 |
| JP | 2010-508852 | 3/2010 |
| JP | 2010-509593 | 3/2010 |
| JP | 2010-509644 | 3/2010 |
| JP | 2010-509645 | 3/2010 |
| JP | 2010-522583 | 7/2010 |
| JP | 2010-529230 A | 8/2010 |
| KR | 10-2007-0100617 | 10/2007 |
| KR | 10-2008-0069553 | 7/2008 |
| TW | 367570 | 8/1999 |
| TW | 494257 | 7/2002 |
| TW | 200836353 | 9/2008 |
| WO | WO 96/21245 | 7/1996 |
| WO | WO 98/49936 | 11/1998 |
| WO | WO 99/45860 | 9/1999 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/31082 | 5/2001 |
| WO | WO 01/33621 | 5/2001 |
| WO | WO 01/66833 | 9/2001 |
| WO | WO 01/98838 | 12/2001 |
| WO | WO 02/27701 | 4/2002 |
| WO | WO 02/43032 | 5/2002 |
| WO | WO 02/45143 | 6/2002 |
| WO | WO 02/45156 | 6/2002 |
| WO | WO 02/071137 | 9/2002 |
| WO | WO 02/073699 | 9/2002 |
| WO | WO 02/092778 | 11/2002 |
| WO | WO 02/097708 | 12/2002 |
| WO | WO 02/097724 | 12/2002 |
| WO | WO 03/021679 | 3/2003 |
| WO | WO 03/030194 | 4/2003 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 2004/000915 | 12/2003 |
| WO | WO 2004/001103 | 12/2003 |
| WO | WO 2004/003535 | 1/2004 |
| WO | WO 2004/016485 | 2/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/062697 | 7/2004 |
| WO | WO 2004/086289 | 10/2004 |
| WO | WO 2004/094303 | 11/2004 |
| WO | WO 2004/095536 | 11/2004 |
| WO | WO 2004/099068 | 11/2004 |
| WO | WO 2004/100252 | 11/2004 |
| WO | WO 2004/105456 | 12/2004 |
| WO | WO 2004/107973 | 12/2004 |
| WO | WO 2005/000483 | 1/2005 |
| WO | WO 2005/005679 | 1/2005 |
| WO | WO 2005/012606 | 2/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/033786 | 4/2005 |
| WO | WO 2005/033787 | 4/2005 |
| WO | WO 2005/033789 | 4/2005 |
| WO | WO 2005/054119 | 6/2005 |
| WO | WO 2005/099310 | 10/2005 |
| WO | WO 2005/104756 | 11/2005 |
| WO | WO 2005/106934 | 11/2005 |
| WO | WO 2005/122285 | 12/2005 |
| WO | WO 2005/122285 A2 | 12/2005 |
| WO | WO 2005/123114 | 12/2005 |
| WO | WO 2006/028996 | 3/2006 |
| WO | WO 2006/042287 | 4/2006 |
| WO | WO 2006/069323 | 6/2006 |
| WO | WO 2006/076711 | 7/2006 |
| WO | WO 2006/104069 | 10/2006 |
| WO | WO 2006/130558 | 12/2006 |
| WO | WO 2006/130721 | 12/2006 |
| WO | WO 2007/000037 | 1/2007 |
| WO | WO 2007/016524 | 2/2007 |
| WO | WO 2007/028003 | 3/2007 |
| WO | WO 2007/056183 | 5/2007 |
| WO | WO 2007/126412 | 11/2007 |
| WO | WO 2008/030666 | 3/2008 |
| WO | WO 2008/030960 | 3/2008 |
| WO | WO 2008/030960 A2 | 3/2008 |
| WO | WO 2008/036837 | 3/2008 |
| WO | WO 2008/055054 | 5/2008 |
| WO | WO 2008/085904 | 7/2008 |
| WO | WO 2008/103464 | 8/2008 |
| WO | WO 2008/106485 | 9/2008 |
| WO | WO 2008/108838 | 9/2008 |
| WO | WO 2008/118133 | 10/2008 |
| WO | WO 2008/118211 | 10/2008 |
| WO | WO 2008/127401 | 10/2008 |
| WO | WO 2008/127402 | 10/2008 |
| WO | WO 2008/127403 | 10/2008 |
| WO | WO 2008/127404 | 10/2008 |
| WO | WO 2008/127405 | 10/2008 |
| WO | WO 2008/140562 | 11/2008 |
| WO | WO 2008/143635 | 11/2008 |
| WO | WO 2008/150861 | 12/2008 |
| WO | WO 2009/011709 | 1/2009 |
| WO | WO 2009/023615 | 2/2009 |
| WO | WO 2009/061823 | 5/2009 |
| WO | WO 2009/075625 | 6/2009 |
| WO | WO 2009/076088 | 6/2009 |
| WO | WO 2009/090398 | 7/2009 |
| WO | WO 2009/100280 | 8/2009 |
| WO | WO 2009/111641 | 9/2009 |
| WO | WO 2009/111641 A1 | 9/2009 |
| WO | WO 2009/114115 | 9/2009 |
| WO | WO 2009/114689 | 9/2009 |
| WO | WO 2009/114689 A1 | 9/2009 |
| WO | WO 2009/118678 | 10/2009 |
| WO | WO 2009/126689 | 10/2009 |
| WO | WO 2010/005707 | 1/2010 |
| WO | WO 2010/036807 | 4/2010 |
| WO | WO 2010/036807 A1 | 4/2010 |
| WO | WO 2010/036992 | 4/2010 |
| WO | WO 2010/040528 | 4/2010 |
| WO | WO 2010/042653 A1 | 4/2010 |
| WO | WO 2010/042798 | 4/2010 |

(56) References Cited

FOREIGN PATENT DOCUMENTS

| | | |
|---|---|---|
| WO | WO 2010/042957 A2 | 4/2010 |
| WO | WO 2010/049881 | 5/2010 |
| WO | WO 2010/056857 A2 | 5/2010 |
| WO | WO 2010/057142 | 5/2010 |
| WO | WO 2010/065957 | 6/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/126640 | 11/2010 |
| WO | WO 2010/132552 | 11/2010 |
| WO | WO 2010/132552 A1 | 11/2010 |
| WO | WO 2010/141133 | 12/2010 |
| WO | WO 2011/002931 | 1/2011 |
| WO | WO 2011/003181 A1 | 1/2011 |
| WO | WO 2011/005381 | 1/2011 |
| WO | WO 2011/006133 | 1/2011 |
| WO | WO 2011/008842 | 1/2011 |
| WO | WO 2011/011347 | 1/2011 |
| WO | WO 2011/026101 | 3/2011 |
| WO | WO 2011/038401 | 3/2011 |
| WO | WO 2011/041395 | 4/2011 |
| WO | WO 2011/041727 A1 | 4/2011 |
| WO | WO 2011/046652 | 4/2011 |
| WO | WO 2011/084450 | 7/2011 |
| WO | WO 2011/084450 A1 | 7/2011 |
| WO | WO 2011/084709 A2 | 7/2011 |
| WO | WO 2011/112931 | 9/2011 |
| WO | WO 2011/115643 | 9/2011 |
| WO | WO 2011/127331 A2 | 10/2011 |
| WO | WO 2012/097163 | 7/2012 |
| WO | WO 2012/125494 A2 | 9/2012 |
| WO | WO 2012/158709 | 11/2012 |
| WO | WO 2012/166686 A2 | 12/2012 |
| WO | WO 2012/167096 | 12/2012 |
| WO | WO 2013/010113 | 1/2013 |
| WO | WO 2013/010171 A1 | 1/2013 |
| WO | WO 2013/022853 A1 | 2/2013 |
| WO | WO 2013/033724 A1 | 3/2013 |
| WO | WO 2013/049716 A1 | 4/2013 |
| WO | WO 2013/052919 A2 | 4/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |

OTHER PUBLICATIONS

Baca, A.J. et al., "Compact monocrystalline silicon solar modules with high voltage outputs and mechanically flexible designs," *Energy Environ. Sci.*, 2010, 3, 208-211.
Baca, A.J. et al., "Printable single-crystal silicon micro/nanoscale ribbons, platelets and bars generated from bulk wafers," *Adv. Func. Mater.* 17, 3051-3062 (2007).
Bagnall, D.M. et al. "Photovoltaic Technologies," *Energy Policy*, 2008, 36, 4390.
Bergmann, R.B. "Crystalline Si thin-film solar cells: a review," *Appl. Phys. A* 69, 187-194 (1999).
Biancardo, M. et al., "Characterization of microspherical semi-transparent solar cells and modules," *Sol. Energy* 81, 711-716 (2007).
Bossert, R.H. et al., "Thin Film Solar Cells: Technology Evaluation and Perspectives," *ECN*, May 2000.
Brendel, R. "Review of layer transfer processes for crystalline thin-film silicon solar cells," *Jpn. J. Appl. Phys.* 40, 4431-4439 (2001).
Brendel, R. et al., "Ultrathin crystalline silicon solar cells on glass substrates," *Appl. Phys. Lett.* 70, 390-392 (1997).
Burgelman, M. et al. "Modeling Thin-Film PV Devices," *Progress in Photovoltaics* 12, 143-153 (2004).

Cahill, D.G. et al., "Thermal conductivity of epitaxial layers of dilute SiGe alloys," *Phys. Rev. B*, 71:23, 235202-1-4 (2005).
Campbell, P. et al., "Light Trapping Properties of Pyramidally Textured Surfaces," *J. Appl. Phys.* 62, 243-249 (1987).
Clugston, D.A. et al., "Modelling Free-Carrier Absorption in Solar Cells, " *Progress in Phoovoltaics* 5, 229-236 (1997).
Clugston, D.A. et al., "PC1D version 5: 32-bit solar cell modeling on personal computers," *Photovoltaic Specialist Conference, 1997*, Conference Record of the Twenty-Sixth IEEE, 207-210.
Ebong, A. et al., "Rapid Thermal Processing of High Efficiency N-Type Silicon Solar Cells With Al back Junction," 14th World Conference on Photovoltaic Energy Conversion, Hawaii, USA; May 7-12, 2006.
Feng, N.-N. et al., "Design of Highly Efficient Light-Trapping Structures for Thin-Film Crystalline Silocon Solar Cells," *IEEE Trans. Elect. Dev.* 54, 1926-1933 (2007).
First Office Action dated Mar. 5, 2013 from Chinese Patent Application No. 200980116128.1-includes English translation.
Green, M.A. "Crystalline and thin-film silicon solar cells: state of the art and future potential," *Sol. Energy* 74, 181-192 (2003).
Heine, C. et al., "Submicrometer Gratings for Solar-Energy Applications," *Appl. Opt.* 34, 2476-2482 (1995).
International Search Report and Written Opinion, Corresponding to International Application No. PCT/US12/59131, mailed Apr. 8, 2013.
J. Wang et al., "Binding and Diffusion of a Si Adatom Around the Type-A Step on Si(01) c4x2," *Appl. Phys. Lett.*, 66:15, 1954 (1995).
J. Yoon et al., "Arrays of Monocrystalline Silicon Solar Micro-cells for Modules with Ultra-thin, Mechanically Flexible, Semi-transparent and Micro-optic Concentrator Designs," Materials Research Society (MRS) Symposium P: Photovoltaic Materials and Manufacturing Issues, Fall Meeting, Dec. 3, 2008—Abstract provided.
J. Yoon et al., "Ultrathin silicon solar microcells for semitransparent, mechanically flexible and microconcentrator module designs," *Nat. Mater.*, 2008, 7, 907.
Jeon, S. et al., "Fabricating three dimensional nanostructures using two photon lithography in a single exposure step," *Optics Express*, 14:6, 2300-23208 (2006).
Jeon, S. et al., "Optically fabricated three dimensional nanofluidic mixers for microfluidic systems," *Nano Letters*, 5:7, 1351-1356 (2005).
K. J. Weber et al., "A Novel Silicon Texturization Method Based on Etching Through a Silicon Nitride Mask," *Progress in Photovoltaics: Research and Applications* 13, 691-695 (2005).
Kazmerski, L.L. et al., "Solar photovoltaics R&D at the tipping point: A 2005 technology overview." *J. Elect. Spec. Rel. Phenom.* 150, 105-135 (2006).
Kerschaver, E.V. et al., "Back-contact Solar Cells: A Review," *Prog. Photovolt.* 14, 107-123 (2006).
Kunnavakkam, M.V. et al., "Low-cost, low-loss microlens arrays fabricated by soft-lithography replication process," *Appl. Phys. Lett.* 82, 1152-1154 (2003).
Lee, H.H. et al., "Fabrication of Large Area Stamps, Moulds, and Conformable Photomasks for Soft Lithography," *Journal of Nanoengineering and Nanosystems* 218, 105 (2005).
Lee, K.J. et al., "Bendable GaN High Electron Mobility Transistors on Plastic Substrates," *Journal of Applied Physics* 100, 124507 (2006).
Lei, C. et al., "Grain Boundary Compositions in $Cu(InGa)Se_2$," *J. Appl. Phys.*, 101:2, 24909-1-7 (2007).
Lei, C. et al., "Void formation and surface energies in $Cu(InGa)Se_2$," *J. Appl. Phys.* 100:7, 073518 (2006).
Liao, D. et al., "Cu depletion at the $CuInSe_2$ Surface," *Appl. Phys. Lett.*, 82:17, 2829-2831 (2003).
Liu, Z.X. et al., "A concentrator module of spherical Si solar cell," *Sol. Energy Mater. Sol. Cells* 91, 1805-1810 (2007).
Love, J.C. et al., "Self-Assembled Monolayers of Thiolates on metals as a Form of Nanotechnology," *Chem. Rev.*, 105, 1103-1169 (2005).
M.E. Stewart et al., "Quantitative Multispectral Miosensing and 1-D Imaging Using Quasi-3D Plasmonic Crystals," *Proc. Nat. Acad. Sci.*, 103, 17143-17148 (2006).

(56) References Cited

OTHER PUBLICATIONS

Mack, S. et al., "Mechanically flexible thin-film transistors that use ultrathin ribbons of silicon derived from bulk wafers," *Appl. Phys. Lett.*, 88, 213101 (2006).
Malyarchuk, V. et al., "High performance plasmonic crystal sensor formed by soft nanoimprint lithography," *Optics Express*, 13:15, 5669-5675 (2005).
Mercaldo, L.V. et al., Thin film silicon photovoltaics: Architectural perspectives and technological issues, *App. Energy*, 2009, 86, 1836.
Minemoto, T. et al., "Fabrication of spherical silicon crystals by dropping method and their application to solar cells," *Jpn. J. Appl. Phys.* 46, 4016-4020 (2007).
Nelson, B. et al., "Amorphous and Thin-Film Silicon," *NCPV and Solar Program Review*, NREL/CD-520-33586, 583-585, 2003.
Nelson, B. et al., "Project Summary of the NREL Amorphous Silicon Team," *NCPV and Solar Program Review*, NREL/CD-520-33586, 825-828, 2003.
Niggemann, M. et al., Realization of Ultrahigh Photovoltaics with Organic Photovoltaic Nanomodules, *Adv. Mater*. 2008, 20, 4055.
Notice of Allowance, U.S. Appl. No. 12/398,811 mailed May 24, 2013.
Notice of Final Rejection for Japanese Patent Application No. 2006-16159, dated Apr. 16, 2013.
Office Action, Corresponding to Chinese Patent Application No. 2009801161280.1, mailed Mar. 5, 2013.
Office Action, Corresponding to U.S. Appl. No. 13/441,618, mailed May 23, 2013.
Office Action, Corresponding to U.S. Appl. No. 13/120,486, mailed Apr. 12, 2013.
Orega, P. et al., "High Voltage Photovoltaic Mini-modules," *Progr. Photovolt.: Res. Appl.*, 2008, 16, 369.
Pizzini, S., "Bulk solar grade silicon: how chemistry and physics play to get a benevolent microstructured material," *Appl. Phys. A: Mater. Sci. Process.*, 2009, 96, 171.
R. Rockett et al., "Prediction of dopant ionization energies in silicon: The importance of strain," *Physical Review B*, 6823:23, 3208 (2003).
Rockett, A. "The effect of Na in polycrystalline and single crystal $CuIn_{1-x}Ga_xSe_2$," *Thin Solid Films*, 480-1, 2-7 (2005).
Rockett, A. et al., "A Monte Carlo simulation of the growth of si(001)2×1: adatom/SA step interactions and growth mechanisms," *Surf. Sci.*, 312, 201 (1994).
Rockett, A. et al., "Near-surface Defect Distributions in $Cu(In,Ga)Se_2$," *Thin Solid Films*, 431-2, 301-306 (2003).
Roedern, B. "Status of Amorphous and Crystalline Thin-Film Silicon Solar Cell Activities," *NCPV and Solar Program Review*, NREL/CD-520-33586, 552-555, 2003.
Ruby, D.S. et al., "Rie-texturing of multicrystalline silicon solar cells," *Solar Energy Materials & Solar Cells* 74, 133-137 (2002).
Sha, A. et al., "Recent progress on microcrystalline solar cells.," *Photovoltaic Specialists Conference, Conference Record of the Twenty-Sixth IEEE*, 569-574 1997).
Sinton, R.A. et al., "27.5-Percent Silicon Concentrator Solar-Cells," *IEEE Elect. Dev. Lett.* 7, 567-569 (1986).
Sobajima et al., "Microstructures of high-growth-rate (up to 8.3 nm/s) microcrystalline silicon photovoltaic layers and their influence on the photovoltaic performance of thin-film solar cells," *J. Non-Cryst. Solids*, 2008, 354, 2407.
Sun, Y. et al., "Gigahertz Operation in Mechanically Flexible Transistors on Plastic Substrates," *Applied Physics Letters* 88, 183509 (2006).
Sun, Y. et al., "Printed Arrays of Aligned GaAs Wires for Flexible Transistors, Diodes and Circuits on Plastic Substrates," *Small* 2(11), 1330-1334 (2006).
Sun, Y. et al., "Top Down Fabrication of Semiconductor Nanowires With Alternating Structures Along Their Transverse and Longitudinal Axes," *Small* 1(11), 1052-1057 (2005).
Taguchi, M. et al., "HIT™ cells—High efficiency crystalline Si cells with novel structure," *Prog. Photovolt.* 8, 503-513 (2000).

Verlinden, P.J. et al., "Silver (R) solar cells: A new thin-crystalline silicon photovoltaic technology," *Sol. Energy Mater. Sol. Cells* 90, 3422-3430 (2006).
Weber, K.J. et al., "A Novel-Low Cost, High Efficiency Micromachined Silicon Solar Cell," *IEEE Electron Device Letters*, vol. 25, No. 1, 37-39 (2004).
Wenham, S.R. et al., "Buried contact silicon solar cells," *Solar Energy Materials and Solar Cells*, 34, 101-110 (1994).
Yamamoto, K. et al., "Thin-film poly-Si solar cells on glass substrate fabricated at low temperature," *Applied Physics A: Materials Science & Processing* 69, 179-185 (1999).
Zhao et al., "24.5% efficiency silicon PERT cells on MCZ substrates and 24.7% efficiency PERL cells on FZ substrates," *Prog. Photovolt.* 7, 471-474 (1999).
Abbaschian et al. (Dec. 2005) "High Pressure-High Temperature Growth of Diamond Crystals Using Split Sphere Apparatus," *Diamond Relat. Mater*. 14(11-12):1916-1919.
Adachi et al (1982) "Chemical Etching of InGaAsP/inP DH Wafer," *J. Electrochem. Soc.* 129:1053-1062.
Adachi et al. (1983) "Chemical Etching Characteristics of (001) GaAs," *J. Electrochem. Soc.* 130:2427-2435.
Adrega et al. (2010) "Stretchable Gold Conductors Embedded in PDMS and Patterned by Photolithography: Fabrication and Electromechanical Characterization," J. Micromech. Microeng. 20:055025.
Ago et al. (2005) "Aligned Growth of Isolated Single-Walled Carbon Nanotubes Programmed vby Atomic Arrangement of Substrate Surface," Chem. Phys. Lett. 408:433-438.
Ago et al. (2006) "Synthesis of Horizontally-Aligned Single-Walled Carbon Nanotubes with Controllable Density on Sapphire Surface and Polarized Raman Spectroscopy," Chem. Phys. Lett. 421:399-403.
Ahmed et al. (Web Release Oct. 11, 2005) "Extending the 3w-Method to the MHz Range for Thermal Conductivity Measurements of Diamond Thin Films," *Diamond Relat. Mater*. 15(2-3):389-393.
Ahn et al. (2007) "Bendable Integrated Circuits on Plastic Substrates by Use of Printed Ribbons of Single-Crystalline Silicon," *Appl. Phys. Lett*. 90:213501.
Ahn et al. (Dec. 15, 2006) "Heterogeneous Three-Dimensional Electronics by Use of Printed Semiconductor Nanomaterials," *Science* 314:1754-1757.
Ahn et al. (Jun. 2006) "High-Speed Mechanically Flexible Single-Crystal Silicon Thin-Film Transistors on Plastic Substrates," *IEEE Electron Dev. Lett*. 27(6):460-462.
Al-Sarawi et al. (Feb. 1998) "A Review of 3-D Packaging Technology," *IEEE Trans. Compo Packag. Manufac. Technol*. B 21(1):2-14.
Al-Halhouli et al. (2008) "Nanoindentation Testing of SU-8 Photoresist Mechanical Properties," Microelectronic Eng. 85:942-944.
Aliot, E. M. et al. (2009) "EHRA/HRS Expert Consensus on Catheter Ablation of Ventricular Arrhythmias: Developed in a partnership with the European Heart Rhythm Association (EHRA), a Registered Branch of the European Society of Cardiology (ESC), and the Heart Rhythm Society (HRS); in collaboration with the American College of Cardiology (ACC) and the American Heart Association (AHA)," Europace 11:771-817.
Alivisatos et al. (1996) "Semiconductor Clusters, Nanocrystals, and Quantum Dots," *Science* 271 :933-937.
Alivisatos et al. (1998) "From Molecules to Materials: Current Trends and Future Directions," *Adv. Mater*. 10:1297-1336.
Allen et al. (Feb. 20, 2006) "Nanomaterial Transfer Using Hot Embossing for Flexible Electronic Devices," *Appl Phys. Lett*. 88:083112.
Altman et al., "Silk-Based Biomaterials," Biomaterials 2003; 24 (3): 24:401-416.
Amano et al. (Feb. 3, 1986) "Metalorganic Vapor Phase Epitaxial Growth of a High Quality GaN Film Using an AlN Buffer Layer," *Appl. Phys. Lett*. 48(5):353-355.
Ambrosy et al. (1996) "Silicon Motherboards for Multichannel Optical Modules," *IEEE Trans. Compon. Pack. A* 19:34-40.
Amir et al. (2000) "The Influence of Helium-Neon Irradiation on the Viability of Skin Flaps in the Rat," Br. J. Plast. Surg. 53:58-62.

(56) References Cited

OTHER PUBLICATIONS

Amsden et al. (Nov. 9, 2009) "Spectral Analysis of Induced Color Change on Periodically Nanopatterned Silk Films," Opt. Express 17(23):21271-21279.
Andersen et al. (2004) "Selecting the Signals for a Brain—Machine Interface," Curr. Opin. Neurobiol. 14:720-726.
Andersson et al. (Oct. 16, 2002) "Active Matrix Displays Based on All-Organic Electrochemical Smart Pixels Printed on Paper," Adv. Mater. 14:1460-1464.
Ando et al. (2004) "Self-Aligned Self-Assembly Process for Fabricating Organic Thin-Film Transistors," Appl. Phys. Lett. 85:1849-1851.
Aoki et al. (2003) "Microassembly of Semiconductor Three Dimensional Photonic Crystals," Nat. Mater. 2:117-121.
Arnold et al. (Web Release Dec. 28, 2002) "Field-Effect Transistors Based on Single Semiconducting Oxide Nanobelts," J. Phys. Chem. B 107(3):659-663.
Ayon et al. (Jan. 1999) "Characterization of a Time Multiplexed Inductively Coupled Plasma Etcher," J. Electrochem. Soc. 146(1):339-349.
Baca et al. (2008) "Semiconductor Wires and Ribbons for High-Performance Flexible Electronics," Angew. Chem. Int. Ed. 47:5524-5542.
Bachtold et al. (Nov. 9, 2001) "Logic Circuits with Carbon Nanotube Transistors," Science 294:1317-1320.
Bae et al. (Jul. 1, 2002) "Single-Crystalline Gallium Nitride Nanobelts," Appl. Phys. Lett. 81: 126-128.
Ball et al. (2004) "Towards an Implantable Brain-Machine Interface Based on Epicortical Field Potentials," Biomed. Tech. 49:756-759.
Balmer et al. (2005) "Diffusion of Alkanethiols in PDMS and Its Implications on Microcontact Printing (IJCP)," Lanqmuir 21 (2):622-632.
Banerjee et al. (May 2001) "3-D ICs: A Novel Chip Design for Improving Deep-Submicrometerinterconnect Performance and Systems-on-Chip Integration," Proc. IEEE 89(5):602-633.
Bao et al. (1997) "High-Performance Plastic Transistors Fabricated by Printing Techniques," Chem. Mater. 9:1299-1301.
Bao et al. (1999) "Printable Organic and Polymeric Semiconducting Materials and Devices," J. Mater. Chem. 9:1895-1904.
Barquins, M. (1992) "Adherence, Friction and Wear of Rubber-Like Materials," Wear 158:87-117.
Bates, F.S. 1991 "Polymer-Polymer Phase Behavior," Science 251 :898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," J. Mater. Chem. 14:517-526.
Berg et al. (2003) "Tailored Micropatterns Through Weak Polyelectrolyte Stamping," Langmuir 19:2231-2237.
Bernard et al. (1998) "Printing Patterns of Proteins," Langmuir 14(9):2225-2229.
Bett et al. (Aug. 1999) "III-V Compounds for Solar Cell Applications," Appl. Phys. A. Mater. Sci. 69(2):119-129.
Bhunia et al. (2004) "Free-Standing and Vertically Aligned InP Nanowires Grown by Metalorganic Vapor Phase Epitaxy," Physica E 21 :583-587.
Bhushan et al. (2004) "Multiwalled Carbon Nanotube AFM Probes for Surface Characterization of Micro/Nanostructures," Microsyst. Technol. 10:633-639.
Bishay et al. (2000) "Temperature Coefficient of the Surface Resistivity of Two-Dimensional Island Gold Films," J. Phys. D. Appl. Phys. 33(18):2218-2222.
Blanchet et al. (2003) "Large Area, High Resolution, Dry Printing of Conducting Polymers for Organic Electronics," Appl. Phys. Lett. 82:463-465.
Blanchet et al. (2003) "Printing Techniques for Plastic Electronics," J. Imag. Sci. Tech. 47(4):296-303.
Blazdell et al. (Nov. 1999) "Preparation of Ceramic Inks for Solid Freeforming Using a Continuous Jet Printer," J. Mat. Syn. Process. 7(6):349-356.

Boltau et al. (1998) "Surface-Induced Structure Formation of Polymer Blends on Patterned Substrates," Nature 391:877-879.
Boncheva et al. (Mar. 15, 2005) "Magnetic Self-Assembly of Three-Dimensional Surfaces from Planar Sheets," Proc. Natl. Acad. Sci. USA 102(11):3924-3929.
Boncheva et al. (Mar. 18, 2005) "Templated Self-Assembly: Formation of Folded Structures by Relaxation of Pre-Stressed, Planar Tapes. The Path to Ubiquitous and Low-cost Organic Electronic Appliances on Plastic," Ad. Mater. 17(5): 553-557.
Bowden et al. (1997) "Self Assembly of Mesoscale Objects into Ordered Two-Dimensional Arrays," Science 276:233-235.
Bowden et al. (1998) "Spontaneous Formation of Ordered Structures in Thin Films of Metals Supported on an Elastomeric Polymer," Nature 393:146-149.
Bowden et al. (2001) "Molecule-Mimetic Chemistry and Mesoscale Self-Assembly," Ace. Chem. Res. 34:231-238.
Bracher et al. (2009) "Shaped Films of Ionotropic Hydrogels Fabricated Using Templates of Patterns Paper," Adv. Mater. 21 :445-450.
Bradley et al. (2003) "Flexible Nanotube Electronics," Nano Lett., vol. 3, No. 10, pp. 1353-1355.
Braun et al. (1999) "Electrochemically Grown Photonic Crystals," Nature 402:603-604.
Britton et al. (Web Release Oct. 25, 2005) "Microstructural Defect Characterization of a Si:H Deposited by Low Temperature HW-CVD on Paper Substrates," Thin Solid Films 501(1-2):79-83.
Brown et al. (2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," Biomaterials 26:3123-3129.
Brown et al. (Dec. 19, 2001) "Heterogeneous Materials Integration: Compliant Substrates to Active Device and Materials Packaging," Mater. Sci. Eng. B 87(3):317-322.
Brown, H.R. (1991) "The Adhesion Between Polymers," Ann. Rev. Mater. Sci. 21:463-489.
Bruschi et al. (2001) "Micromachined Silicon Suspended Wires With Submicrometric Dimensions," Microelectron. Eng. 57-58:959-965.
Buma et al. (2001) "High-Frequency Ultrasound Array Element Using Thermoelastic Expansion in an Elastomeric Film," Appl. Phvs. Lett. 79:548-550.
Burdinski et al. (2005) "Single Etch Patterning of Stacked Silver and Molybdenum Alloy Layers on Glass Using Microcontat Wave Printing," J. Am. Chem. Soc. 127(31):10786-1 0787.
Burge et al. (Jun. 25, 1997) "X-Ray Holography for VLSI Using Synthetic Bilevel Holograms," Proc. Int. Soc. Opt. Eng. 3183:2-13.
Burgin et al. (2000) "Large Area Submicrometer Contact Printing Using a Contact Aligner," Langmuir 16:5371-5375.
Burns et al. (2003) "Printing of Polymer Thin-Film Transistors for Active-Matrix-Display Applications," J. Soc. Int. Display 11 :599-604.
Campbell et al. (2000) "Fabrication of Photonic Crystals for the Visible Spectrum by Holographic Lithography," Nature 404:53-56.
Cao et al. (2006) "Highly Bendable, Transparent Thin-Film Transistors That Use Carbon-Nanotube-Based Conductors and Semiconductors with Elastomeric Delectrics," Adv. Mater. 18(3):304-309.
Cao et al. (2006) "Bilayer Organic-Inorganic Gate Dielectrics for High-Performance, Low-Voltage, Single-Walled Carbon Nanotube Thin-Film Transistors, Complementary Logic Gates, and p-n Diodes on Plastic Substrates," Adv. Funct. Mater. 16:2355-2362.
Cao et al. (Jan. 5, 2009) "Ultrathin Films of Single-Walled Carbon Nanotubes for Electronics and Sensors: A Review of Fundamental and Applied Aspects," Adv. Mater. 21(1):29-53.
Cao et al. (Jul. 24, 2008) "Medium-Scale Carbon Nanotube Thin-Film Integrated Circuits on Flexible Plastic Substrates," Nature 454:495-500.
Carr et al. (1998) "Measurement of Nanomechanical Resonant Structures in Single-Crystal Silicon," J. Vac. Sci. Technol. B 16:3821-3824.
Chang et al. (1994) "Process Techniques, Lithography and Device-Related Physics and Principles," In; GaAs High-Speed Devices: Physics, Technology and Circuit Application, John Wiley and Sons, New York, pp. 115-278.

(56) References Cited

OTHER PUBLICATIONS

Chen et al. (2003) "Characterization of Pd-GaAs Schottly Diodes Prepared by the Electrodes Plating Technique," Semiconductor. Sci. Technol. 18:620-626.
Chen et al. (2003) "Electronic Paper: Flexible Active-Matrix Electronics Ink Display," Nature 423: 136.
Chen et al. (2004) "Herringbone Buckling Patterns of Compresses Thin Films on Comlliant Substrates," J. Appl. Mech. 71 :597.
Chen et al. (2005) "InGaN Nanorings and Nanodots by Selective Area Epitaxy," Appl. Phys. Lett. 87:143111.
Chen et al. (2005) "The Role of Metal-Nanotube Caontact in the Performance of Carbon Nanotube Field-Effect Transistors," Nano Lett. 5(7)1497-1502.
Chen et al. (Feb. 27, 2006) "Complementary Carbon Nanotube-Gated Carbon Nanotube Thin-Fim Transistor," Appl. Phys. Lett. 88:093502.
Chen et al. (Jun. 2002) Effect of Process Parameters on the Surface Morphology and Mechanical Performance of Silicon Structures After Deep Reactive Ion Etching (DRIE) J. Microelectromech. Syst. 11 (3):264-2775.
Chen et al. (Mar. 2004) "A Family of Herringbone Patterns in Thin Films," Scr. Mater. 50(6):797-801.
Chen et al. (Mar. 24, 2006) "An Integrated Logic Circuit Assembled on a Single Carbon Nanotube," Science 311:1735.
Chen et al. (Sep. 2004) "Herringbone Buckling Patterns of Compressed Thin Films on Compliant Substrates," J. Appl. Mech. 71:597-603.
Cheng et al. (2005) "Ink-Jet Printing, Self-Assembled Polyelectrolytes, and Electroless Plating: Low Cost Fabrication of Circuits on a Flexible Substrate at Room Temperature," Macromol. Rapid Commun. 26:247-264.
Childs et al. (2002) "Decal Transfer Microlithography: A New Soft-Lithographic Patterning Method," J. Am. Chern. Soc. 124:13583-13596.
Childs et al. (2005) "Masterless Soft-Lithography: Patterning UV/Ozone-Induced Adhesion on Poly(dimethylsiloxane) Surfaces," Langmuir 21:10096-10105.
Childs et al. (Aug. 14, 2004) "Patterning of Thin-Film Microstructures on Non-Planar Substrate Surfaces Using Decal Transfer lithography," Adv. Mater. 16(15):1323-1327.
Choi et al. (2007) "Biaxially Stretchable 'Wavy' Silicon Nanomembranes," Nano Lett. 7(6): 1655-1663.
Choi et al. (Web Release Jan. 25, 2005) "Simple Detachment Patterning of Organic Layers and Its Applications to Organic light-Emitting Diodes," Adv. Mater. 17(2):166-171.
Chou et al. (2004) "An Orientation-Controlled Pentacene Film Aligned by Photoaligned Polyimide for Organic Thin-Film Transistor Applications," Adv. Func. Mater. 14:811-815.
Chou et al. (Jun. 8, 1999) "Micromachining on (111 )-Oriented Silicon," Sens. Actuators A 75(3):271-277.
Chu et al. (2005) "High-Performance Organic Thin-Film Transistors with Metal Oxide/Metal Bilayer Electrode," Appl. Phys. Lett. 87: 193508.
Chung et al. (Jul. 1, 2003) "A study on Formation of Al and Al2O3 on the Porous Paper by DC Magnetron Sputtering," Surf. Coat. Technol. 171(1-3):65-70.
Clerc, L. (1976) "Directional Differences of Impulse Spread in Trabecular Muscle from Mammalian Heart," J. Physiol. 255:335-346.
Cohen-Karni et al. (2009) "Flexible Electrical Recording from Cells Using Nanowire Transistor Arrays," Proc. Natl. Acad. Sci. USA 106:7309-7313.
Cole et al. (2008) "Patterned Growth and Transfer of ZnO Micro- and Nanocrystals with Size and Location Control," Adv. Mater. 20:1474-1478.
Collins et al. (Apr. 27, 2001) "Engineering Carbon Nanotubes and Nanotube Circuits Using Electrical Breakdown," Science 292:706-709.

Corazza et al. (2007) "Photobiomodulation on the Angiogenesis of Skin Wounds in Rats Using Different Light Sources," Photomedicine Laser Surg. 25:102-106.
Cox, H. L. (1952) "The Elasticity and Strength of Paper and Other Fibrous Materials," Br. J. Appl. Phys. 3:72-79.
Creagh et al. (2003) "Design and Performance of Inkjet Print Heads for Non-Graphic-Arts Applications," MRS Bull. 28:807-811.
Crone et al. (Feb. 3, 2000) "Large-Scale Complementary Integrated Circuits Based on Organic Transistors," Nature 403:521-523.
Crowder et al. (1998) "Low-Temperature Single-Crystal Si TFTs Fabricated on Si Films Processed via Sequential Lateral Solidification," IEEE Electron. Dev. Lett. 19:306-308.
Cui et al. (2001) "Nanowire Nanosensors for Highly Sensitive and Selective Detection of Biological and Chemical Species," Science 293:1289-1292.
Dai et al. (2002) "Gallium Oxide Nanoribbons and Nanosheets," J. Phys. Chem. B 106(5):902-904.
Dai et al. (2003) "Novel Nanostructures of Functional Oxides Synthesized by Thermal Evaporation," Adv. Funct. Mater. 13:9-24.
Dai et al. (Web Release Jan. 15, 2002) "Gallium Oxide Nanoribbons and Nanosheets," J. Phys. Chem. B 106(5):902-904.
Davidson et al. (2004) "Supercritical Fluid-liquid-Solid Synthesis of Gallium Arsenide Nanowires Seeded by Alkanethiol-Stabilized Gold Nanocrystals," Adv. Mater. 16:646-649.
de Gans (2004) "Inkjet Printing of Polymers: State of the Art and Future Developments," Adv. Mater. 16(3):203-213.
De Sio et al. (Web Release May 18, 2005) "Electro-Optical Response of a Single-Crystal Diamond Ultraviolet Photoconductor in Transverse Configuration," Appl. Phys. Lett. 86:213504.
DeBoer et al. (2004) "Organic Single-Crystal Field-Effect Transistors," *Phys. Stat. Sol.* 201 :1302-1331.
Decision of Refusal corresponding to Japanese Patent Application No. P2007-515549, Issued Sep. 4, 2012.
Decision of Rejection corresponding to Korean Patent Application No. 10-2007-7000216, Issued Sep. 19, 2012—includes English translation.
Deen et al. (2004) "Electrical Characterization of Polymer-Based FETs Fabricated by Spin-Coating Poly(3-alkylthiophene)s," IEEE Trans. Electron Devices 51: 1892-1901.
Deruelle et al. (1995) "Adhesion at the Solid-Elastomer Interface: Influence of Interfacial Chains," Macromol. 28:7419-7428.
Derycke et al. (Sep. 2001) "Carbon Nanotube Inter- and Intramolecular Logic Gates," Nano Lett. 1(9):453-456.
Desai et al. (Feb. 1999) "Nanopore Technology for Biomedical Applications," *Biomed. Microdevices* 2(1):11-40.
Dick et al. (2004) "Synthesis of Branched 'Nanotrees' by Controlled Seeding of Multiples Branching Events," Nat. Mater. 3:380-38.
Dimroth et al. (Mar. 2007) "High-Efficiency Multijunction Solar Cells," *MRS Bull.* 32:230-235.
Ding et al. (Oct. 4, 2004) "Self Catalysis and Phase Transformation in the Formation of CdSe Nanosaws," Adv. Mater. 16(19):1740-1743.
Dinsmore et al. (2002) "Colloidosomes: Selectively Permeable Capsules Composed of Colloidal Particles," Science 298:1006-1009.
Dinyari et al., (2008) "Curving Monolithic Silicon for Nonplanar Focal Plane Aarray Applications," Appl Phys Lett, 92:091114.
Divliansky et al. (2003) "Fabrication of Three-Dimensional Polymer Photonic Crystal Structures Using Single Diffraction Element Interference Lithography," Appl. Phys. Lett. 82(11):1667-1669.
Dodabalapur A. (Apr. 2006) "Organic and Polymer Transistors for Electronics," *Mater Today* 9(4):24-30.
Dodabalapur et al. (1995) "Organic Transistors: Two-Dimensional Transport and mproved Electrical Characteristics," Science 268:270-27.
Duan et al. (2000) "General Synthesis of Compound Semiconductor Nanowires," *Adv. Mater.* 12:298-302.
Duan et al. (2003) "High-performance Thin-Film Transistors Using Semiconductor Nanowires and Nanoribbons," Nature 425:274-278.
Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.

(56) References Cited

OTHER PUBLICATIONS

Duboz et al. (1998) "Transistors and Detectors Based on GaN-Related Materials," In; Group III Nitride Semiconductor Compounds, Gill, B. ed., Clarendon, Oxford, pp. 343-387.
Duesberg et al. (2000) "Polarized Raman Spectroscopy on Isolated Single-Wall Carbon Nanotubes," Phys. Rev. Lett., vol. 85, No. 25, pp. 5436-5439.
Duffy et al. (1998) "Rapid Prototyping of Microfluidic Systems in Poly(dimethylsiloxane)," Anal. Chern. 70(23):4974-4984.
Dupuis et al. (2008) "History, Development, and Applications of High-Brightness Visible Light-Emitting Diodes," IEEE J. Lightwave Tech. 26:1154-1171.
Durkop et al. (2004) "Extraordinary Mobility in Semiconducting Carbon Nanotube," *Nano Lett.* 4(1):35-39.
Eder et al. (Apr. 5, 2004) "Organic Electronics on Paper," *Appl. Phys. Lett.* 84(14):2673-2675.
Edrington et al. (2001) "Polymer-Based Photonic Crystals," *Adv. Mater.* 13:421-425.
Efimenko et al. (Oct. 15, 2002) "Surface Modification of Sylgard-184 Poly(dimethyl Siloxane) Networks by Ultravioloet and UltravioleUOzone Treatment," J. Colloid Interface Sci. 254(2):306-315.
Eftekhari, G. (1993) "Variation in the Effective Richardson Constant of Metal—GaAs and Metal—InP Contacta Due to the Effect of Processing Parameters," Phys. Status Solid A-Appl. Res. 140:189-194.
Ensell, G. (1995) "Free Standing Single-Crystal Silicon Microstructures," *J.Micromech. Microeng.* 5: 1-4.
European Extended Search Report dated Feb. 9, 2012 in Application No. 09826745.3.
Examination and Search Report, Corresponding to Malaysian Patent Application No. PI 20090622, Mailed Sep. 28, 2012.
Examination Report, Corressonding to European Application No. 07 841 968.6.
Examination Report, Corresponding to European Application No. EP 05 756 327.2, Dated Jan. 20, 2010.
Examination Report, Corresponding to Malaysian Patent Application No. PI 20062672, Mailed Aug. 28, 2009.
Examination Report, Corresponding to Malaysian Patent Application No. PI20092343, Mailed Jun. 15, 2010.
Examination Report, Corresponding to Malaysian Patent Publication No. PI20052553, Mailed Mar. 13, 2009.
Examination Report, Corresponding to Singapore Patent Application No. 200608359-6, Completed on Aug. 27, 2008.
Faez et al. (1999) "An Elastomeric Conductor Based on Polyaniline Prepared by Mechanical Mixing," Polymer 40:5497-5503.
Felgner et al. (1996) "Flexural Rigidity of Microtubules Measured with the Use of Optical Tweezers," J. Cell Sci. 109:509-516.
Final Office Action mailed Nov. 21, 2012 corresponding to U.S. Appl. No. 12/921,808.
Final Office Action, Corresponding to U.S. Appl. No. 12/575,008, mailed Oct. 17, 2011.
Final Office Action, Corresponding to U.S. Appl. No. 11/851,182, Mailed Oct. 29, 2010.
Fink et al. (1999) "Block Copolymers as Photonic Bandgap Materials," *J. Lightwave Tech.* 17:1963-1969.
Flewitt et al. (2005) "Low-Temperature Deposition of Hydrogenated Amorphous Silicon in an Electron Cyclotron Resonance Reactor for Flexible Displays," Proc. IEEE 93: 1364-1373.
Folch et al. (1999) "Wafer-Level In-Registry Microstamping," *J. Microelectromech. Syst.* 8:85-89.
Forment et al. (2004) "Influence of Hydrogen Treatment and Annealing Processes Upon the Schottky Barrier Height of Au/n-GaAs and Ti/n-GaAs Diodes," Semicond. Sci. Technol. 19:1391-1396.
Forrest et al. (2004) "The Path to Ubiquitous and Low-Cost Organic Electronic Appliances on Plastic," Nature 428:911-918.
Fortunato et al. (2005) "Flexible a-Si: H Position-Sensitive Detectors," *Proc. IEEE* 93:1281-1286.
Fortunato et al. (Sep. 2008) "High-Performance Flexible Hybrid Field-Effect Transistors Based on Cellulose Fiber Paper," IEEE Electron. Dev. Lett. 29(9):988-990.
Freeman et al. (2000) "Spatial Spectral Analysis of Human Electrocardiograms Including the Alpha and Gamma Bands," J. Neurosci. Methods 95:111-121.
Freire et al. (1999) "Thermal Stability of Polyethylene Terephthalate (PET): Oligomer Distribution and Formation of Volatiles," Packag. Technol. Sci. 12:29-36.
Freund, L.B. (2000) "The Mechanics of Electronic Materials," *Int. J. Solids Struct.* 37:185-196.
Fu et al. (Jan. 10, 2003) "Patterning of Diamond Microstructures on Si Substrate by Bulk and Surface Micromachining," J. Mater. Process. Technol. 132(1-3):73-81.
Furneaux et al. (1989) "The Formation of Controlled-Porosity Membranes from Anodically Oxidized Aluminum," Nature 337:147-149.
Gan et al. (2002) "Preparation of Thin-Film Transistors with Chemical Bath Deposited CdSe and CdS Thin Films," IEEE Trans. Electron. Dev. 49:15-18.
Gao et al. (Sep. 9, 2005) "Conversion of Zinc Oxide Nanobelts into Superlattice-Structures Nanohelices," Science 309: 1700-1704.
Garcia et al. (Oct. 2004) "Etchant Anisotropy Controls the Step Bunching Instability in KOH Etching of Silicon," Phys. Rev. Lett. 93(16):166102.
Gardner et al. (1965) "Physical Aspects of the Internal Water Relations of Plant Leaves," Plant Physiol. 40:705-710.
Garnier et al. (1994) "All-Polymer Field-Effect Transistor Realized by Printing Techniques," Science 265:1684-1686.
Geim et al. (Mar. 2007) "The Rise of Graphene," *Nature Mater.* 6:183-191.
Geissler et al. (2003) "Fabrication of Metal Nanowires Using Microcontact Printing," Langmuir 19(15):6301-6311.
Geissler et al. (Jun. 2003) "Selective Wet-Etching of Microcontact-Printed Cu Substrates with Control Over the Etch Profile," Microelec. Eng. 67-68:326-332.
Gelinck et al. (2000) "High-Performance All-Polymer Integrated Circuits," *Appl. Phys. Lett.* 77:1487-1489.
Gelinck et al. (2004) "Flexible Active-Matrix Displays and Shift Registers Based on Solution-Processed Organic Transistors," Nat. Mater. 3: 106-110.
Georgakilas et al. (2002) "Wafer-Scale Integration of GaAs Optoelectronic Devices with Standard Si Integrated Circuits Using a Low-Temperature Bonding Procedure," Appl. Phys. Lett. 81:5099-5101.
Givargizov, E.I. (1991) "Applications," In; *Oriented Crystallization on Amorphous Substrates*, Plenum Press, New York, pp. 341-363.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Apple. Phys.* 80:6849-6854.
Goldmann et al. (2004) "Hole Mobility in Organic Single Crystals Measured by a "Flip Crystal" Field-Effect Technique," *J. Appl. Phys.* 96:2080-2086.
Goldsmith, T.H. (Sep. 1990) "Optimization, Constraint, and History in the Evolution of Eyes," *Quart. Rev. Biol.* 65(3):281-322.
Gratz et al: (1991) "Atomic Force Microscopy of Atomic-Scale Ledges and Etch Pits Formed During Dissolution of Quartz," Science 251:1343-1346.
Gray et al. (2004) "High-Conductivity Elastomeric Electronics," *Adv. Mater.* 16:393 397.
Gray et al. (Dec. 2001) "Screen Printed Organic Thin Film Transistors (OTFTs) on a Flexible Substrate," *Proc. SPIE* 4466:89-94.
Grayson, T. (2002) "Curved Focal Plane Wide Field of View Telescope Design," *Proc. SPIE* 4849:269-274.
Gruen et al. (Mar. 21, 1994) "Fullerenes as Precursors for Diamond Film Growth Without Hydrogen or Oxygen Additions," *Appl. Phys. Lett.* 65(12):1502-1504.
Gudiksen et al. (Web Release Apr. 18, 2001) "Synthetic Control of the Diameter and Length of Single Crystal Semiconductor Nanowires," *J. Phys. Chem.* B 105:4062-4064.

(56) References Cited

OTHER PUBLICATIONS

Guo et al. (Aug. 19, 2002) "Metal-Insulator-Semiconductor Electrostatics of Carbon Nanotubes," Appl. Phys. Lett. 81(8):1486-1488.
Gur et al. (2005) "Air-Stable All-Inorganic Nanocrystal Solar Cells Processed from Solution," Science 310:462-465.
Gurbuz et al. (Jul. 2005) "Diamond Semiconductor Technology for RF Device Applications." Solid State Electron. 49(7): 1055-1070.
Haisma et al. (2002) "Contact Bonding, Including Direct-Binding in a Historical and Recent Context of Materials Science and Technology, Physics and Chemistry—Historical Review in a Broader Scope and Comparative Outlook," Mater. Sci. Eng. R 37:1-60.
Halik et al. (2004) "Low-Voltage Organic Transistors with an Amorphous Molecular Gate Dielectric," Nature 431 :963-966.
Hamedi et al. (May 2007) "Towards Woven Logic from Organic Electronic Fibres," Nat. Mater. 6:357-362.
Hamilton et al. (2004) "Field-Effect Mobility of Organic Polymer Thin-Film Transistors," Chem. Mater. 16:4699-4704.
Han et al. (2005) "Template-Free Directional Growth of Single-Walled Carbon Nanotues on a- and r-Plane Sapphire," J. Am. Chem. Soc. 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," J. Am. Chem. Soc. 123:8709-8717.
Harkonen et al. (Jun. 8, 2006) "4 W Single-Transverse Mode VECSEL Utilizing Intra-Cavity Diamond Heat Spreader," Electron Lett. 42(12):693-694.
Hayase et al. (2001) "Photoangioplasty with Local Motexafin Lutetium Delivery Reduces Macrophages in a Rabbit Post-Balloon Injury Model," Cardiovascular Res. 49:449-455.
He et al. (2005) "Si Nanowire Bridges in Microtrenches: Integration of Growth into Device Fabrication," Adv. Mater. 17:2098-2102.
Heffelfinger et al. (1997) "Steps and the structure of the (0001) α-alumina surface," Surf. Sci., 370:L168-L172.
Hillbrog et al. (Web Release Dec. 30, 2003) "Nanoscale Hydrophobic Recovery: Chemical Force Microscopy Study of UV/Ozone-Treated Cross-Linker Poly(dimethylsiloxane)," Langmuir 20(3):785-794.
Hines et al. (2005) "Nanotransfer Printing of Organic and Carbon Nanotube Thin-Film Transistors on Plastic Substrates," Appl. Phys. Lett. 86:163101.
Hollenberg et al. (2006) "A MEMS Fabricated Flexible Electrode Array for Recording Surface Field Potentials," J. Neurosci. Methods 153:147-153.
Holmes et al. (Feb. 25, 2000) "Control of Thickness and Orientation of Solution-Grown Silicon Nanowires," Science 287:1471-1473.
Horan et al. (Jun. 2005) "In Vitro Degradation of Silk Fibroin," Biomaterials 26(17):3385-3393.
Horn et al. (1992) "Contact Electrification and Adhesion Between Dissimilar Materials," Science 256:362-364.
Hoyer, P. (1996) "Semiconductor Nanotube Formation by a Two-Step Template Process," Adv. Mater. 8:857-859.
Hsia et al. (2005) "Collapse of Stamps for Soft Lithography Due to Interfacial Adhesion," Appl. Phys. Lett. 86:154106.
Hsu et al. (2002) "Amorphous Si TFTs on Plastically Deformed Spherical Domes," J. Non-Crystalline Solids 299-302: 1355-1359.
Hsu et al. (2003) "Nature of Electrical Contacts in a Metal-Molecule-Semiconductor System," J. Vac. Sci. Technol. B 21(4):1928-1935.
Hsu et al. (2004) "Effects of Mechanical Strain on TFTs on Spherical Domes," IEEE Trans. Electron. Dev. 51 :371-377.
Hsu et al. (Jan. 15, 2004) "Spherical Deformation of Compliant Substrates with Semiconductor Device Islands," J. Appl. Phys. 95(2):705-712.
Hu et al. (1997) "Using Soft Lithography to Fabricate GaAs/AlGaAs Heterostructure Field Effect Transistors," Appl. Phys. Lett. 71 :2020-2022.
Hu et al. (1999) Chemistry and Physics in One Dimension: Synthesis and Properties of Nanowires and Nanotubes, Ace. Chem. Res. 32:435-445.
Hu et al. (2004) "Percolation in Transparent and Conducting Carbon Nanotube Networks," Nano Lett., vol. 4, No. 12, pp. 2513-2517.
Hu et al. (2009) "Highly Conductive Paper for Energy-Storage Devices," Proc. Natl. Acad. Sci. USA 106:21490-21494.
Hu et al. (2010) "Stretchable, Porous, and Conductive Energy Textiles," Nano Lett. 10:708-714.
Huang et al. (2001) "Directed Assembly of One-Dimensional Nanostructures into Functional Networks," Science 291 :630-633.
Huang et al. (2001) "Room-Temperature Ultraviolet Nanowire Nanolasers," Science 292:1897-1899.
Huang et al. (2003) "Growth of Millimeter-Long and Horizontally Aligned Single-Walled Carbon Nanotubes on Flat Substrates," J. Am. Chem. Soc., 125:5636-5637.
Huang et al. (2004) "Long and Oriented Single-Walled Carbon Nanotubes Grown by Ethanol Chemical Vapor Deposition," J. Phys. Chem. B. 108:16451-16456.
Huang et al. (2004) "Self-Organizing High-Density Single-Walled Carbon Nanotube Arrays from Surfactant Suspensions," Nanotechnol. 15:1450-1454.
Huang et al. (2005) "Nanomechanical Architecture of Strained Bilayer Thin Films: From Design Principles to Experimental Fabrication," Adv. Mater. 17(23):2860-2864.
Huang et al. (2005) "Nanowires for Integrated Multicolor Nanophotonics," Small 1(1):142-147.
Huang et al. (2005) "Nonlinear Analyses of Wrinkles in a Film Bonded to a Compliant Substrate," J. Mech. Phys. Solids 53:2101-2118.
Huang et al. (2005) "Stamp Collapse in Soft Lithography," Langmuir 21 :8058-8068.
Huang et al. (Jan. 16, 2001) "Catalytic Growth of Zinc Oxide Nanowires by Vapor Transport," Adv. Mater. 13(2):113-116.
Huck et al. (2000) "Ordering of Spontaneously Formed Buckles on Planar Surfaces," Langmuir 16:3497-3501.
Huie, J.C. (2003) "Guided Molecular Self-Assembly: A Review of Recent Efforts," Smart Mater. Struct. 12:264-271.
Huitema et al. (2001) "Plastic Transistors in Active-Matrix Displays," Nature 414:599.
Hur et al. (2005) "Organic Nanodelectrics for Low Voltage Carbon Nanotube Thin Film Transistors and Complementary Logc Gates," J. Am. Chem. Soc. 127:13808-13809.
Hur et al. (2005) "Printed thin-film transistors and complementary logic gates that use polymer-coated single-walled carbon nanotube networks " J. Appl. Phys., 98, 114302.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," Appl. Phys. Lett. 85(23):5730-5732.
Hur et al. (Jun. 13, 2005) "Extreme Bendability of Single Walled Carbon Nanotube Networks Transferred From High-Temperature Growth Substrates to Plastic and Their Use in Thin-Film Transistors," Appl. Phys. Lett. 243502.
Hutchinson et al. (1992) "Mixed Mode Cracking in Layered Materials," Adv. Appl. Mech. 29:63-191.
Imparato et al. (2005) "Excimer Laser Induced Crystallization of Amorphous Silicon on Flexible Polymer Substrates," Thin Solid Films 487:58-62.
International Preliminary Report on Patentability for PCT Application No. PCT/US2010/060425, mailed May 25, 2011.
International Preliminary Report on Patentability for PCT Application PCT/US2009/067670, mailed Jun. 14, 2011.
International Search Report and Written Opinion Corresponding to International Application No. PCT/US2012/053701 mailed Jan. 15, 2013.
International Search Report and Written Opinion corresponding to International Application No. PCT/US2012/058114 mailed Feb. 1, 2013.
International Search Report and Written Opinion dated Aug. 14, 2012, corresponding to International Patent Application No. PCT/US12/37973.
International Search Report and Written Opinion, Corresponding to Inernational Application No. PCT/US12/46930 mailed Dec. 10, 2012.

(56) References Cited

OTHER PUBLICATIONS

International Search Report and Written Opinion, Corresponding to International Application No. PCT/US10/50468, Mailed Jan. 6, 2011.
International Search Report and Written Opinion, Corresponding to International Application No. PCT/US10/60425, Mailed May 25, 2011.
International Search Report and Written Opinion, Corresponding to International Application No. PCT/2005/014449, Mailed Jul. 3, 2008.
International Search Report and Written Opinion, Corresponding to International Application No. PCT/US07/77759, Mailed Apr. 11, 2008.
International Search Report and Written Opinion, Corresponding to International Application No. PCT/US07/74293, Mailed Jul. 24, 2008.
International Search Report and Written Opinion, Corresponding to International Application No. PCT/US07/77217, Mailed Jun. 3, 2008.
International Search Report and Written Opinion, Corresponding to International Application No. PCT/US07/82633, Mailed May 16, 2008.
International Search Report and Written Opinion, Corresponding to International Application No. PCT/US09/47442, Mailed Sep. 21, 2009.
International Search Report and Written Opinion, Corresponding to International Application No. PCT/US2006/032125, Mailed Mar. 21, 2008.
International Search Report and Written Opinion, Corresponding to International Application No. PCT/US2009/036192, Mailed Jul. 6, 2009.
International Search Report and Written Opinion, Corresponding to International Application No. PCT/US2009/058231, Mailed Nov. 17, 2009.
International Search Report and Written Opinion, Corresponding to International Application No. PCT/US2010/027209, Mailed Nov. 11, 2010.
International Search Report and Written Opinion, Corresponding to International Application No. PCT/US2010/034520, Mailed Sep. 24, 2010.
International Search Report and Written Opinion, Corresponding to International Application No. PCT/US2010/042585, Mailed May 25, 2011.
International Search Report and Written Opinion, Corresponding to International Application No. PCT/US2011/028094, Mailed Jul. 14, 2011.
International Search Report and Written Opinion, Corresponding to International Application No. PCT/US2012/039779, mailed Feb. 1, 2013.
International Search Report and Written Opinion, Corresponding to International PCT Application No. PCT/US05/19354 Mailed Apr. 18, 2007.
International Search Report and Written Opinion, Corresponding to International PCT Application No. PCT/US2006/021161, Mailed Feb. 28, 2008.
International Search Report and Written Opinion, Corresponding to International PCT Application No. PCT/US2007/077759, Mailed Apr. 11, 2008.
International Search Report and Written Opinion, Corresponding to International PCT Application No. PCT/US2007/079070, Mailed Apr. 23, 2008.
International Search Report and Written Opinion, Corresponding to International PCT US2010/061151.
International Search Report Corresponding to International Application No. PCT/US2009/036956, mailed Jun. 29, 2009.
International Search Report Corresponding to International Application No. PCT/US2011/031648, mailed Dec. 15, 2011.
International Search Report Corresponding to International Application No. PCT/US2012/028590, mailed Jun. 13, 2012.
International Search Report, Corresponding to International Application No. PCT/US2009/059892, mailed Jan. 7, 2010.
International Search Report, Corresponding to International Application No. PCT/US2009/064199, mailed May 20, 2011.
International Search Report, Corresponding to International Application No. PCT/US2009/065806, mailed Jun. 1, 2010.
International Search Report, Corresponding to International Application No. PCT/US2009/067670, mailed Aug. 4, 2010.
International Search Report, Corresponding to International Application No. PCT/US2010/020742, mailed Sep. 14, 2010.
International Search Report, Corresponding to International Application No. PCT/US2010/051196, mailed Dec. 1, 2010.
Isberg et al. (Sep. 6, 2002) "High Carrier Mobility in Single-Crystal Plasma-Deposited Diamond," *Science* 297:1670-1672.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Templated Formation or a Single Wall Carbon Nanotube Patterns," *Angew. Chem. Int. Ed.* 43:6140-6143.
Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30: 1604-1608.
Jabbour et al. (2001) "Screen Printing for the Fabrication of Organic Light-Emitting Devices," *IEEE J. Select. Top. Quantum. Electron.* 7(5):769-773.
Jackman et al. (Aug. 4, 1995) "Fabrication of Submicrometer Features on Curved Substrates by Microcontact Printing," *Science* 269:664-666.
Jacobs et al. (2001) "Submicrometer Patterning of Charge in Thin-Film Electrets," *Science* 291:1763-1766.
Jacobs et al. (2002) "Fabrication of a Cylindrical Display by Patterned Assembly," *Science* 296:323-325.
Jain et al. (2000) "III-Nitrides: Growth, Characterization, and Properties," *J. Appl. Phys.* 87:965-1006.
Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.
James et al. (1998) "Patterned Protein Layers on Solid Substrates by This Stamp Microcontact Printing," *Langmuir* 14:742-744.
Jang et al. (2006) "Low-Voltage and High-Field-Effect Mobility Organic Transistors with a Polymer Insulator," *Appl. Phys. Lett.* 88:072101.
Javey et al. (2002) "High-K Dielectrics for Advanced Carbon-Nanotube Transistors and Logic Gates," *Nature Mater.* 1:241-246.
Javey et al. (2005) "High Performance n-Type Carbon Nanotube Field-Effect Transistors with Chemically Doped Contacts," *Nano Lett.*, vol. 5, No. 2, pp. 345-348.
Javey et al. (Aug. 7, 2003) "Ballistic Carbon Nanotube Field-Effect Transistors," *Nature* 424:654-657.
Jenkins et al. (1994) "Gallium Arsenide Transistors: Realization Through a Molecularly Designed Insulator," *Science* 263:1751-1753.
Jeon et al. (1995) "Patterning of Dielectric Oxide Thin Layers by Microcontact Printing of Self-Assembled Monolayers," *J. Mater. Res.* 10:2996-2999.
Jeon et al. (2003) "Structural and Mechanical Properties of Woven Fabrics Employing Peirce's Model," Textile Res. J. 73:929-933.
Jeon et al. (2004) "Three Dimensional Nanofabrication with a rubber sub-wavelength optical element," Nanotechnology E-Bulletin, 2 pp.
Jeon et al. (Aug. 4, 2004) "Three Dimensional Nanofabrication with Rubber Stamps and Conformable Photomasks," *Adv. Mater.* 16(15):1369-1373.
Jiang et a. (Oct. 2, 2007) "Finite Deformation Mechanics in Buckled Thin Films on Compliant Supports," *Proc. Natl. Acad. Sci. USA* 104(40):15607-15612.
Jiang et al. (1999) "Preparation of Macroporous Metal Films from Colloidal Crystals," *J. Am. Chem. Soc.* 121 :7957-7958.
Jiang et al. (2002) "Polymer-on-Polymer Stamping: Universal Approaches to Chemically Patterned Surfaces," *Langmuir* 18:2607-2615.

(56) References Cited

OTHER PUBLICATIONS

Jiang et al. (2007) "Mechanical Properties of Robust Ultrathin Silk Fibroin Films," Adv. Funct. Mater. 17:2229-2237.
Jin et al. (2004) "Scalable Interconnection and Integration of Nanowire Devices Without Registration," Nano Lett. 4:915-919.
Jin et al. (2004) "Soft Lithographic Fabrication of an Image Senbsor Array on a Curved Substrate," J. Vac. Sci. Technol. B 22:2548-2551.
Jin et al. (Aug. 2005) "Water-Stable Silk Films with Reduced β-Sheet Content," Adv. Funct. Mater. 15(8):1241-1247.
Jin et al. (Web Release Jan. 23, 2004) "Biomaterial Films of Bombyx mori Silk Fibroin with Poly(ethylene oxide)," Biomacromolecules 5(3):711-717.
Joachim et al. (Nov. 30, 2000) "Electronics Using Hybrid-Molecular and Mono-Molecular Devices," Nature 408:541-548.
Johnson et al. (1999) "Ordered Mesoporous Polymers of Tunable Pore Size from Colloidal Silica Templates," Science 283:963-965.
Jones et al. (Jul./Aug. 2004) "Stretchable Wavy Metal Interconnects," J. Vac. Sci. Technol. A 22(4):1723-1725.
Joo et al. (2006) "Low-Temperature Solution-Phase Synthesis of Quantum Well Structures CdSe Nanoribbons," J. Am. Chem. Soc. 128(17):5632-5633.
Jortner et al. (2002) "Nanostructured Advanced Materials Perspectives and Directions," Pure Appl. Chem. 74(9):1491-1506.
Joselevich (2002) "Vectorial Growth of Metallic and Semiconducting Single-Wall Carbon Nanotubes," Nano Lett. vol. 2, No. 10, pp. 1137-1141.
Kadish et al. (1988) "Interaction of Fiber Orientation and Direction of Impulse Propagation with Anatomic Barriers in Anisotropic Canine Myocardium," Circulation. 78:1478-1494.
Kagan (1999) "Organic-Inorganic Hybrid Materials as Semiconducting Channels in Thin-Film Field-Effect Transistors," Science 286:945-947.
Kagan et al. (2001) "Patterning Organic-Inorganic Thin-Film Transistors Using Microcontact Printed Templates," Appl. Phvs. Lett. 79(21):3536-3538.
Kagan et al. (2003) "Thin Film Transistors—A Historical Perspective," In; Thin Film Transistors, Dekker, New York, pp. 1-34.
Kane et al. (2000) "Analog and Digital Circuits Using Organic Thin-Film Transistors on Polyester Substrates," IEEE Electron. Dev. Lett. 21:534-536.
Kang et al. (2007) "High-Performance Electronics Using Dense, Perfectly Aligned Arrays of Single-Walled Carbon Nanotubes," Nat. Nanotechnol. 2:230-236.
Kang et al. (2007) "Printed Multilayer Superstructures of Aligned Single-Walled Carbon Nanotubes for Electronic Applications," Nano Lett. 7(11):3343-3348.
Kar et al. (Web Release Feb. 18, 2006) "Shape Selective Growth of CdS One-Dimensional Nanostructures by a Thermal Evaporation Process," J. Phys. Chem. B. 110(10):4542-4547.
Kar et al. (Web Release Feb. 8, 2005) "Controlled Synthesis and Photoluminescence Properties of ZnS Nanowires and Nanoribbons," J. Phys. Chem. B 109(8):3298-3302.
Kar et al. (Web Release Sep. 28, 2005) "Synthesis and Optical Properties of CdS Nanoribbons," J. Phys. Chem B. 109(41):19134-19138.
Karnik et al. (2003) "Lateral Polysilicon $p^+$-p-$n^+$ and $p^+$-n-$n^+$ Diodes," Solid-State Electronics 47:653-659.
Karnik et al. (2003) "Multiple Lateral Polysilicon Diodes as Temperature Sensors for Chemical Microreaction Systems," Jpn. J. Appl. Phys. 42:1200-1205.
Kato et al. (2004) The Characteristic Improvement of Si(111) Metal-Oxide-Semiconductor Field-Effect Transistor by Long-Time Hydrogen Annealing, Jpn. J. Appl. Phys. 43(10):6848-6853.
Katz et al. (2001) "Synthetic Chemistry for Ultrapure, Processable, and High-Mobility Organic Transistor Semiconductors," Ace. Chem. Res. 34:359-369.
Katz, H.E. (2004) "Recent Advances in Semiconductor Performance and Printing Processes for Organic Transistor-Based Electronics," Chem. Mater. 16:4748-4756.
Kawata et al. (2001) "Finer Features for Functional Microdevices," Nature 412:697-698.
Kellis et al. (2009) "Human Neocortical Electrical Activity Recorded on Nonpenetrating Microwire Arrays: Applicability for Neuroprostheses," Neurosurg. Focus 27(1):E9.
Kendall, D.L. (1979) "Vertical Etching of Silicon at Very High Apect Ratios," Ann. Rev. Mater. Sci. 9:373-403.
Khakani et al. (2006) "Lateral Growth of Single Wall Carbon Nanotubes on Various Substrates by Means of an 'All-Laser' Synthesis Approach," Diamond Relat. Mater. 15:1064-1069.
Khan et al. (1993) "High Electron Mobility Transistor Based on a GaN-$Al_xGa_{1-x}$N Heterojunction," Appl. Phys. Lett. 63:1214-1215.
Khang et al. (2006) "A Stretchable Form of Single-Crystal Silicon for High-Performance Electronics on Rubber Substraights," Science 311:208-212.
Kilby, J.S. (1976) "Invention of the Integrated Circuit," IEEE Trans. Electron. Dev 23:648-654.
Kim et al. (2000) "Field Emission from Carbon Nanotubes for Displays," Diamond and Related Mater. 9(3-6): 1184-1189.
Kim et al. (2002) "Nanolithography Based on Patterned Metal Transfer and its Application to Organic Electronic Devices," Appl. Phys. Lett. 80:4051-4053.
Kim et al. (2003) "Epitaxial self-assembly of block copolymers on lithographically defined nanopatterned substrates," Nature 424:411-414.
Kim et al. (2008) "Materials and Noncoplanar Mesh Designs for Integrated Circuits with Linear Elastic Responses to Extreme Mechanical Deformations," Proc. Natl. Acad. Sci. USA 105(48):18675-18680.
Kim et al. (2008) "Stretchable and Foldable Silicon Integrated Circuits," Science 320:507-511.
Kim et al. (2008) "Stretchable Electronics: Materials Strategies and Devices," Adv. Mater. 20:4887-4892.
Kim et al. (2009) "Integrated Wireless Neural Interface Based on the Utah Electrode array," Biomed. Microdevices 11:453-466.
Kim et al. (2009) "Optimized Structural Designs for Stretchable Silicon Integrated Circuits," Small 5(24):2841-2847.
Kim et al. (Dec. 2, 2008) "Materials and Noncoplanar Mesh Designs for Integrated Circuits with Linear Elastic Responses to Extreme Mechanical Deformations," Proc. Natl. Acad. Sci. USA 105(48)18675-18680.
Kim et al. (Jan. 2008) "Complementary Logic Gates and Ring Oscillators Plastic Substrates by Use of Printed Ribbons Single-Crystalline Silicon," IEEE Electron. Dev. Lett. 29(1):73-76.
Kim et al. (Nov. 15, 1999) "Direct Observation of Electron Emission Site on Boron-Doped Polycrystalline Diamond Thin Films Using an Ultra-High-Vacuum Scanning Tunneling Microscope," Appl. Phys. Lett. 75(20):3219-3221.
Kim et al. (Oct. 17, 2010) "Waterproof AlInGaP optoelectronics on stretchable substrates with applications in biomedicine and robotics," Nature Materials 9:929-937.
Kim et al. (Oct. 2004) "Organic TFT Array on a Paper Substrate," IEEE Electron. Dev.Lett. 25(10):702-704.
Kim et al. (Web Release Apr. 18, 2010) "Dissolvable Films of Silk Fibroin for Ultrathin Conformal Bio-Integrated Electronics," Nature Materials 9:511-517.
Kim et al. (Web Release Feb. 29, 2008) "Highly Emissive Self-Assembled Organic Nanoparticles Having Dual Color Capacity for Targeted Immunofluorescence Labeling," Adv. Mater. 20(6):1117-1121.
Kim et al. (Web Release Jul. 31, 2008) "Complementary Metal Oxide Silicon Integrated Circuits Incorporating Monolithically lntegrated Stretchable Wavy Interconnects," Appl. Phys. Lett. 93(4):044102.
Kim et al. (Web Release Jul. 6, 2009) "Ultrathin Silicon Circuits with Strain-lsolation Layers and Mesh Layouts for High-Performance Electronics on Fabric, Vinyl, Leather and Paper," Adv. Mater. 21 (36):3703-3707.
Kim et al. (Web Release Sep. 29, 2009) "Silicon Electronics on Silk as a Path to Bioresorbable, Implantable Devices," Appl. Phys. Lett. 95:133701-133703.
Kim et al., (2008) "Complimentary Metal Oxide Silicon Integrated Circuits Incorporating Monolithically Integrated Stretchable Wavy Interconnects," Appl Phys Lett, 93:044102.

(56) References Cited

OTHER PUBLICATIONS

Kim, Y.S. (Web Release Aug. 9, 2005) "Microheater-Integrated Single Gas Sensor Array Chip Fabricated on Flexible Polyimide Substrate," *Sens. Actuators* B 114(1):410-417.
Klauk et al. (2002) "High-Mobility Polymer Gate Dielectric Pentacene Thin Film Transistors," *J. Appl. Phys.* 92:5259-5263.
Klein-Wiele et al. (2003) "Fabrication of Periodic Nanostructures by Phase-Controlled Multiple-Beam Interference," *Appl. Phys. Lett.* 83(23):4707-4709.
Knipp et al. (2003) "Pentacine Thin Film Transistors on Inorganic Dielectrics: Morphology, Structural Properties, and Electronic Transport," *J Appl. Phys.* 93:347-355.
Ko et al. (2006) "Bulk Quantities of Single-Crystal Silicon Micro-/Nanoribbons Generated from Bulk Wafers," *Nano Lett.* 6(10):2318-2324.
Ko et al. (2008) "A Hemispherical Electronic Eye Camera Based on Compressible Silicon Optoelectronics," *Nature* 454:748-753.
Ko et al. (2010) "Flexible Carbon Nanofiber Connectors with Anisotropic Adhesion Properties," *Small* 6:22-26.
Ko et al. (Web Release Oct. 28, 2009) "Curvilinear Electronics Formed Using Silicon Membrane Circuits and Elastomeric Transfer Elements," *Small* 5(23):2703-2709.
Kocabas et al. (2004) "Aligned Arrays of Single-Walled Carbon Nanotubes Generated from Random Networks by Orientationally Selective Laser Ablation," Nano Lett., vol. 4, No. 12, pp. 2421-2426.
Kocabas et al. (2005) "Guided Growth of Large-Scale, Horizontally Aligned Arrays of Single-Walled Carbon Nanotubes and Their Use in Thin-Film Transstors," *Small* 1(11): 111 0-1116.
Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.
Kocabas et al. (2006) "Large Area Aligned Arrays of SWNTs for High Performance Thin Film Transistors," American Physical Society, APS March Meeting, Mar. 13-17, Abstract #W31.004.
Kocabas et al. (2007) "Experimental and Theoretical Studies of Transport Through Large Scale, Partially Aligned Arrays of Single-Walled Carbon Nanotubes ni Thin Film Type Transistors," Nano Lett. 7(5):1195-1202.
Kocabas et al. (Feb. 5, 2008) "Radio Frequency Analog Electronics Based on Carbon Nanotube Transistors," *Proc. Natl. Acad. Sci. USA* 105(5):1405-1409.
Kodambaka et al. (2006) "Control of Si Nanowire Growth by Oxygen," *Nano Lett.* 6(6):1292-1296.
Koide et al. (2000) "Patterned Luminescence of Organic Light-Emitting Diodes by Hot Microcontact Printing (H1JCP) of Self-Assembled Monolayers," *J. Am. Chem. Soc.* 122:11266-11267.
Konagai et al. (1978) "High Efficiency GaAs Thin Film Solar Cells by Peeled Film Technology," *J. Cryst. Growth* 45:277-280.
Kong et al. (2004) "Single-Crystal Nanorings Formed by Epitaxial Self-Coiling of Polar Nanobelts," *Science* 303: 1348-1351.
Kong et al. (Jan. 28, 2000) "Nanotube Molecular Wires as Chemical Sensors," *Science* 287:622-625.
Kong et al. (Oct. 2003) "Structure of Indium Oxide Nanobelts," *Solid State Commun.* 128(1): 1-4.
Kong et al. (Oct. 29, 1998) "Synthesis of Individual Single-Walled Carbon Nanotubes on Patterned Silicon Wafers," *Nature* 395:878-881.
Kudo et al. (Web Release Jun. 13, 2006) "A Flexible and Wearable Glucose Sensor Based on Functional Polymers with Soft-MEMS Techniques," *Biosens. Bioelectron.* 22:558-562.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(14):2002-2004.
Kumar et.al. (1994) "Patterning Self-Assembled Monolayers: Applications in Material Science," *Langmuir* 10:1498-1511.

Kumar et al. (2002) "Thermally-Stable Low-Resistance Ti/Al/Mo/Au Multilayer Ohmic Contacts on n-GaN," *J. Appl. Phys.* 92:1712-1714.
Kumar et al. (2005) "Percolating in Finite Nanotube Networks," Phys. Rev. Lett., 95, 066802.
Kuo et al. (1985) "Effect of Mismatch Strain on Band Gap in III-V Semiconductors," *J. Appl. Phys.* 57:5428-5432.
Kuykendall et al. (Aug. 2004) "Crystallographic Alignment of High Density Gallium Nitride Nanowire Arrays," *Nat. Mater.* 3:524-528.
Lacour et al. (2003) "Stretchable Gold Conductors on Elastomeric Substrates," *Appl. Phys. Lett.* 82(15):2404-2406.
Lacour et al. (2005) "Stretchable Interconnects for Elastic Electronic Surfaces," *Proc.IEEE* 93(8):1459-1467.
Lacour et al. (2010) "Flexible and Stretchable Micro-Electrodes for in Vitro and n Vivo Neural Interfaces," Med. Biol. Eng. Comput. 48:945-954.
Lacour et al. (Apr. 2004) "Design and Performance of Thin Metal Film Interconnects for Skin-Like Electonic Circuits," *IEEE Electron. Dev. Lett.* 25(4):179-181.
Lacour et al. (Dec. 2004) "An Elastically Stretchable TFT Circuit," *IEEE Electron Dev. Lett.* 25(12):792-794.
Lacour et al. (Web Release Jul. 14, 2006) "Stiff Subcircuit Islands of Diamondlike Carbon for Stretchable Electronics," *J. Appl. Phys.* 100:014913.
Lacour et al. (Web Release May 16, 2006) "Mechanisms of Reversible Stretchability of Thin Metal Films on Elastomeric Substrates," *Appl. Phys. Lett.* 88:204103.
Laimer et al. (Mar. 1997) "Diamond Growth in a Direct-Current Low-Pressure Supersonic Plasmajet," *Diamond Relat. Mater.* 6:406-410.
Lambacher et al. (2004) "Electrical Imaging of Neuronal Activity by Multi-Transistor-Array (MTA) Recording at 7.8 μm Resolution," *Appl. Phys. A* 79:1607-1611.
Landes et al. (2002) "Some Properties of Spherical and Rod-Shaped Semiconductorand Metal Nanocrystals," *Pure Appl. Chem.* 74(9):1675-1692.
Law et al. (2004) "Semiconductor Nanowires and Nanotubes," *Ann. Rev. Mater. Res.*34:83-122.
Law et al. (Aug. 27, 2004) "Nanoribbon Waveguides for Subwavelength PhotonicsIntegration," *Science* 305:1269-1273.
Lawrence et al. (2008) "Bioactive Silk Protein Biomaterial Systems for Optical Devices," Biomacromolecules 9:1214-1220.
Lay et al. (2004) "Simple Route to Large-Scale Ordered Arrays of Liquid-Deposited Carbon Nanotubes," Nano Lett. vol. 4, No. 4 pp. 603-606.
Leclercq et al. (1998) "II I-V Micromachined Devices for Microsystems,"*Microelectronics J.* 29:613-619.
Lecomte et al. (Apr. 2006) "Degradation Mechanism of Diethylene Glycol Units in aTerephtalate Polymer," *Polym. Degrade. Stab.* 91(4):681-689.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24: 19-21.
Lee et al. (2004)"Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexable Optoelectronic Systems," *Small* 1:1164-1168.
Lee et al. (2005) "Large-Area, Selective Transfer of Microstructured Silicon (μs-Si): A Printing-Based Approach to High-Performance Thin-Film Transistors Supported on Flexible Substraights," *Adv. Mater.* 17:2332-2336.
Lee et al. (Apr. 2005) "Fabrication of Stable Metallic Patterns Embedded in Poly(dimethylsiloxane) and Model Applications in Non-Planar Electronic and Lab-on a-Chip Device Patterning," *Adv. Funct. Mater.* 15(4):557-566.
Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.
Lee et al. (Feb. 2001) "Application of Carbon Nanotubes to Field Emission Displays," *Diamond and Related Mater.* 10(2):265-270.

(56) References Cited

OTHER PUBLICATIONS

Lee et al. (Feb. 2005) "Weave Patterned Organic Transistors on Fiber for E-Textiles," *IEEE Trans. Electron. Dev.* 52(2):269-275.
Leong et al. (2009) "Tetherless Thermobiochemicall Actuated Microgrippers," Proc. Natl. Acad. Sci. USA 106:703-709.
Létant et al. (Jun. 2003) "Functionalized Silicon Membranes for Selective Bio-Organisms Capture," Nat. Mater. 2:391-395.
Li et al. (2002) "High-Resolution Contact Printing with Dendrimers," *Nano Lett.* 2(4):347-349.
Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.
Li et al. (2004) "Electrospinning of Nanofibers: Reinventing the Wheel," *Adv. Mater.*16(14):1151-1170.
Li et al. (2006) "Catalyst-Assisted Formation of Nanocantilever Arrays on ZnS Nanoribbons by Post-Annealing Treatment," J. Phys. Chem. B 110(13):6759-6762.
Li et al. (Dec. 2005) "Compliant Thin Film Patterns of Stiff Materials as Platforms for Stretchable Electronics," *J. Mater. Res.* 20(12):3274-3277.
Li et al. (Jul. 1, 2002) "ZnO Nanobelts Grown on Si Substrate," *Appl. Phys. Lett.* 81 (1): 144-146.
Lieber, C. (2001) "The Incredible Shrinking Circuit," *Sci. Am.* 285(3):58-64.
Lieber, C.M. (2003) "Nanoscale Science and Technology: Building a Bog Future from Small Things," *MRS. Bull.* 28:486-491.
Lim et al. (2005) "Flexible Membrane Pressure Sensor," *Sens. Act. A* 119:332-335.
Lima et al. (2007) "Creating Micro- and Nanostructures on Tubular and Spherical Surfaces,"*J. Vac. Sci. Technol.* 825(6):2412-2418.
Lin et al. (2005) "High-Performance Carbon Nanotube Field-Effect Transistor with Tunable Polarities," *IEEE Trans. Nano* 4(5):481-489.
Linder et al. (1994) "Fabrication Technology for Wafer Through-Hole Interconnections and Three-Dimensional Stacks of Chips and Wafers," *Proc. IEEE Micro. Electro Mech. Syst.* 349-354.
Ling et al. (2004) "Thin Film Deposition, Patterning, and Printing in Organic Thin Film Transistors," *Chem. Mater.* 16:4824-4840.
Liu et al. (1999) "Controlled deposition of individual single-walled carbon nanotubes on chemically functionalized templates," Chem. Phys. Lett., 303:125-129.
Long et al. (1990) "Heterostructure FETs and Bipolar Transistors," in; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics,"*Appl. Physics Lett.* 81 :562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16): 10252-1 0256.
Loo et al. (2003) "Electrical Contacts to Molecular Layers by Nanotransfer Printing," *Nano Lett.* 3(7):913-917.
Lopes et al. (Sep. 2004) "Thermal Conductivity of PET/(LDPE/AI) Composites Determined by MDSC," *Polym. Test.*23(6):637-643.
Lu et al. (Apr. 2010) "Water-Insoluble Silk Films with Silk I Structure " Acta Biomater. 6(4):1380-1387.
Lu et al. (Dec. 2006) "Electronic Materials—Buckling Down for Flexible Electronics," *Nat. Nanotechnol.* 1:163-164.
Lu et al. (Jul. 19, 2005) "One Dimensional Hole Gas in Germanium/ Silicon Nanowire Heterostructures," *Proc. Nat. Acad. Sci. USA* 102(29):10046-10051.
Lu et al. (Nov. 2008) "Nanowire Transistor Performance Limits and Applications," *IEEE Trans Electron Dev.* 55(11 ):2859-2876.
Luan et al. (1992) "An Experimental Study of the Source/Drain Parasitic Resistance Effects in Amorphous Silicon Thin Film Transistors," *J. Appl. Phys*. 72:766-772.

Ma et al. (2004) "Single-Crystal CdSe Nanosaws," *J. Am. Chem. Soc.* 126(3):708-709.
Mack et al. (2006) "Mechanically Flexible Thin-Film Transistors that Use Ultrathin Ribbons of Silicon Derived from Bulk Wafers," *Appl. Phvs. Lett.* 88:213101.
Madou, M. (1997) "Etch-Stop Techniques," in; *Fundamentals of Microfabrication*, CRC Press, New York, pp. 193-199.
Maikap et al. (2004) "Mechanically Strained-Si NMOSFETs," *IEEE Electron. Dev. Lett.* 25:40-42.
Maldovan et al. (2004) "Diamond-Structured Photonic Crystals," *Nature Materials* 3:593-600.
Mandlik et al. (Aug. 2006) "Fully Elastic Interconnects on Nanopatterned Elastomeric Substrates," *IEEE Electron Dev. Lett.* 27(8):650-652.
Manna et al. (Web Release May 25, 2003) "Controlled Growth of Tetrapod-Branched Inorganic Nanocrystals," *Nat. Mater*. 2:382-385.
Markovich et al. (1999) "Architectonic Quantum Dot Solids," *Ace. Chem. Res.* 32:415-423.
Marquette et al. (2004) "Conducting Elastomer Surface Texturing: A Path to Electrode Spotting Application to the Biochip Production," *Biosens. Bioelectron*. 20:197-203.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Ace. Chem. Res.* 28:61-68.
Mas-Torrent et al. (2006) "Large Photoresponsivity in High-Mobility Single-Crystal Organic Field-Effect Phototransistors," *ChemPhysChem* 7:86-88.
Masuda et al. (2000) "Fabrication of Ordered Diamonds/Metal Nanocomposite Structures," *Chem. Lett.* 10:1112-1113.
Matsunaga et al, (2003) "An Improved GaAs Device Model for the Simulation of Analog Integrated Circuit," *IEEE Trans. Elect. Dev.* 50:1194-1199.
McAlpine et al. (2003) "High-Performance Nanowire Electronics and Photonics on Glass and Plastic Substrates," *Nano Lett.* 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett.* 19:524-527.
Mehring C. et al. (2003) Inference of hand movements from local field potentials in monkey motor cortex. Nature Neurosci. 6, 1253-1254.
Meisel et al. (2004) "Three-Dimensional Photonic Crystals by Holographic Lithography Using the Umbrella Configuration: Symmetries and Complete Photonic Band Gaps," *Phys. Rev.* B. 70:165101:1-10.
Meitl et al. (2004) "Solution Casting and Transfer Printing Single-Walled Carbon Nanotube Films," *Nano Lett*. 4(9):1643-1947.
Meitl et al. (2006) "Transfer Printing by Kinetic Control of Adhesion to an Elastomeric Stamp," *Nat. Mater*. 5:33-38.
Meitl et al. (Web Release Feb. 22, 2007) "Stress Focusing for Controlled Fracture in Microelectromechanical Systems," Appl. Phys. Lett. 90:083110.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," Appl. Phys. Lett. 84:5398-5400.
Menard et al. (2004) "High-Performance n- and p-Type Single-Crystal Organic Transistors with Free-Space Gate Dielectrics," Adv. Mat. 16:2097-2101.
Menard et al. (2004) "Improved Surface Chemistries, Thin Film Deposition Techniques, and Stamp Designs for Nanotransfer Printing," Langmuir 20:6871-6878.
Menard et al. (2005) Bendable Single Crystal Silicon Thin Film Transistors Formed by Printing on Plastic Substrates Appl. Phys. Lett. 86:093507.
Menard et al. (2007) Micro- and Nanopatterning Techniques for Organic Electronic and Optoelectronic Systems, Chem. Rev. 107:1117-1160.

(56) References Cited

OTHER PUBLICATIONS

Miao et al. (2003) "Micromachining of Three-Dimensional GaAs Membrane Structures Using High-Energy Nitrogen Implantation," J. Micromech. Microenq. 13:35-39.
Michalske et al. (1985) "Closure and Repropagation of Healed Cracks in Silicate Glass," J. Am. Ceram. Soc. 68:586-590.
Michel et al. (2001) Printing Meets Lithography: Soft Approaches to High-Resolution Patterning, IBM J. Res. Dev. 45(5):697-719.
Miller et al. (2002) "Direct Printing of Polymer Microstructures on Flat and Spherical Surfaces Using a Letterpress Technique," J. Vac. Sci. Technol. B 20(6):2320-2327.
Milliron et al. (2004) "Colloidal Nanocrystal Heterostructures with Linear and Branched Topoloqy," Nature 430:190-195.
Min, G. (Apr. 4, 2003) "Plastic Electronics and Their Packaging Technologies," *Syn. Metals*. 135:141-143.
Minev et al. (2010) "Impedance Spectroscopy on Stretchable Microelectrode Arrays," Appl. Phys. Lett. 97:043707.
Mirkin et al. (Jul. 2001) "Emerging Methods for Micro- and Nanofabrication," *MRS Bull*. 26(7):506-507.
Misewich et al. (May 2, 2003) "Electronically Induced Optical Emission from a Carbon Nanotube FET," Science 300:783-786.
Mishra et al. (2002) "AlGaN/GaN HEMTs-an Overview of Device Operation and Applications," Proc. IEEE 90:1022-1031.
Mitzi et al. (2004) "High-Mobility Ulltrathin Semiconducting Films Prepared by Spin Coating," Nature 428:299-303.
Moon et al. (2002) "Ink-Jet Printing of Binders for Ceramic Compinents," *J. Am. Ceram. Soc*. 85(4):755-762.
Moore et al. (Sep. 9, 2003) "Individually Suspended Single-Walled Carbon Nanotubes in Various Surfactants," Nano Lett. 3(10):1379-1382.
Morales et al. (Jan. 9, 1998) "A Laser Ablation Method for the Synthesis of Crystalline Semiconductor Nanowires," Science 279:208-211.
Morent et al. (2007) "Adhesion Enhancement by a Dielectric Barrier Discharge of PDMS used for Flexible and Stretchable Electronics," J. Phys. D. Appl. Phys. 40:7392-7401.
Mori et al. (1978) "A New Etching Solution System, H3P04-H202-H20, for GaAs and Its Kinetics," J. Electrochem. Soc. 125:1510-1514.
Morkoc et al. (1995) "High-Luminosity Blue and Blue-Green Gallium Nitride Light-Emitting Diodes," Science 267:51-55.
Morkved et al. (1994) "Mesoscopic Self-Assembly of Gold Islands on Diblock-Copolymer Films," Appl. Phys. Lett. 64:422-424.
Morra et al. (1990) "On the Aging of Oxygen Plasma-Treated Polydimethylsiloxane Surfaces," J. Colloid Interface Sci. 137:11-24.
Murakami et al. (2005) "Polarization Dependence of the Optical Absorption of Single-Walled Carbon Nanotubes," Phys. Rev. Lett., 94, 087402.
Murphy et al. (2008) "Modification of Silk Fibroin Using Diazonium Coupling Chemistry and the Effects on hMSC Proliferation and Differentiation," Biomaterials 29:2829-2838.
Namazu et al. (2000) "Evaluation of Size Effect on Mechanical Properties of Single Crystal Silicon by Nanoscale Bending Test Using AFM," J. MEMS 9:450-459.
Nath et al. (2002) "Nanotubes of the Disulfides of Groups 4 and 5 Metals," *Pure Appl. Chem*. 74(9):1545-1552.
Nathan et al. (2000) "Amorphous Silicon Detector and Thin Film Transistor Technology for Large-Area Imaging of X-Rays,." Microelectron J. 31 :883-891.
Nathan et al. (2002) "Amorphous Silicon Technology for Large Area Digital X-Ray and Optical Imaging," Microelectronics Reliability 42:735-746.
Newman et al. (2004) "Introduction to Organic Thin Film Transistors and Design of n-Channel Organic Semiconductors," Chem. Mater. 16:4436-4451.
Nirmal et al. (1999) "Luminescence Photophysics in Semiconductor Nanocrystals," Ace. Chem. Res. 32:407-414.
Noda et al. (1996) "New Realization Method for Three-Dimensional Photonic Crystal in Optical Wavelength Region," Jpn. J. Appl. Phys. 35:L909-L912.
Nomura et al. (2004) "Room-Temperature Fabrication of Transparent Flexible Thin-Film Transistors Using Oxide Semiconductors," Nature 432:488-492.
Notice of Allowance corresponding to Korean Patent Application No. 10-20102-7010094, dated Feb. 25, 2013—includes English translation.
Notice of Allowance, Corresponding to U.S. Appl. No. 11/423,287, Mailed Jan. 12, 2009.
Notice of Allowance, Corresponding to U.S. Appl. No. 12/723,475, mailed on Oct. 14, 2011.
Notice of Allowance, U.S. Appl. No. 12/686,076, mailed Oct. 5, 2012.
Notice of Allowance, U.S. Appl. No. 11/851,182, mailed Februaty 16, 2012.
Notice of Allowance, U.S. Appl. No. 12/405,475, mailed Mar. 1, 2012.
Notice of Allowance, U.S. Appl. No. 12/616,922, mailed Oct. 19, 2012.
Notice of Final Rejection for Japanese Patent Application No. 2007-515549, dated Sep. 19, 2012.
Notice of Preliminary Rejection corresponding to Korean Patent Application No. 10-2007-7000216, dated Feb. 21, 2013—includes English translation.
Notice of Preliminary Rejection corresponding to Korean Patent Application No. 10-2012-7030789, dated Feb. 25, 2013—includes English translation.
Notice of Reasons for Rejection corresponding to Japanese Patent Application No. P2006-165159, Dispatched Apr. 24, 2012—includes English translation.
Notice of Reasons for Rejection corresponding to Japanese Patent Application No. P2008-514820, Dispatched May 8, 2012—includes Enslish translation.
Notice of Reasons for Rejection corresponding to Japanese Patent Application No. P2009-546361, Dispatched Jul. 3, 2012—includes English translation.
Notice of Reasons of Rejection corresponding to Japanese Patent Application No. 2009-527564, mailed Jan. 29, 2013.
Notification Concerning Transmittal of International Preliminary Report on Patentability, Corresponding to International Application No. PCT/US2009/059892, mailed Jan. 7, 2010.
Notification Concerning Transmittal of International Preliminary Report on Patentability, Corresponding to International Application No. PCT/US2009/064199, mailed May 17, 2011.
Notification of Grant of Patent Right and Notice of Registration corresponding to Chinese Patent App. No. 200780041127.6 issued Dec. 26, 2012.
Novoselov et al. (Oct. 22, 2004) "Electric Field Effect in Atomically Thin Carbon Films," Science 306:666-669.
O'Riordan et al. (2004) "Field Configured Assembly: Programmed Manipulation and Self-Assembly at the Mesoscale," Nano Lett. 4:761-765.
O'Connell et al. (Jul. 26, 2002) "Band Gap Fluorescence from Individual Single-Walled Caarbon Nanotubes," Science 297:593-596.
Odom et al. (2002) "Improved Pattern Transfer in Soft Lithography Using Compasite Stamps," Langmuir 18:5314-5320.
Office Action and Response, Corresponding to U.S. Appl. No. 11/423,287, Mailed Feb. 13, 2008.
Office Action and Response, Corresponding to U.S. Appl. No. 11/421,654, Mailed Sep. 29, 2009.
Office Action and Response, Corresponding to U.S. Appl. No. 11/858,788, Mailed Beginning Jan. 28, 2011.
Office Action Corresponding to Chinese Patent Application No. 200780041127.6, issued Apr. 8, 2011.
Office Action Corresponding to Chinese Patent Application No. 200780049982.1, Issued May 12, 2010.
Office Action Corresponding to European Patent Application No. 05755193.9, issued Jul. 7, 2011.
Office Action for U.S. Appl. No. 11/851,182 mailed Apr. 1, 2010.
Office Action for U.S. Appl. No. 12/405,475 mailed Jun. 8, 2011.
Office Action for U.S. Appl. No. 12/636,071 mailed Jan. 3, 2013.
Office Action for U.S. Appl. No. 13/441,598 mailed Jan. 14, 2013.
Office Action, Corresponding to Chinese Paten Application No. 200580013574.1, Issued May 11, 2010.

(56) References Cited

OTHER PUBLICATIONS

Office Action, Corresponding to Taiwan Patent Application No. 095121212, Issued May 7, 2010.
Office Action, Corresponding to U.S. Appl. No. 11/423,287, Mailed Feb. 13, 2008.
Office Action, Corresponding to U.S. Appl. No. 11/851,182, Mailed Apr. 1, 2010.
Office Action, Corresponding to U.S. Appl. No. 11/851,182, Mailed Jun. 7, 2011.
Office Action, Corresponding to U.S. Appl. No. 12/686,076.
Office Action, Corresponding to U.S. Appl. No. 11/421,654, Mailed Sep. 29, 2009.
Office Action, Corresponding to U.S. Appl. No. 11/981,380, Mailed Sep. 23, 2010.
Office Action, Corresponding to U.S. Appl. No. 12/398,811 mailed Nov. 26, 2012.
Office Action, Corresponding to U.S. Appl. No. 12/616,922, mailed Apr. 9, 2012.
Office Action, Corresponding to U.S. Appl. No. 12/636,071, mailed Jun. 6, 2012.
Office Action, Corresponding to U.S. Appl. No. 12/778,588 mailed Jan. 8, 2013.
Office Actions, Corresponding to Chinese Patent Application No. 200580018159.5, Issued Jan. 23, 2009 and Feb. 12, 2010.
Office Actions, Corresponding to U.S. Appl. No. 11/145,542, Mailed between Apr. 5, 2007 and Dec. 23, 2008.
Ohzono et al. (Web Release Jul. 7, 2005) "Geometry-Dependent Stripe Rearrangement Processes Induced by Strain on Preordered Microwrinkle Patterns," Langmuir 21(16):7230-7237.
Omenetto et al. (2008) "A New Route for Silk," Nature Photon. 2:641-643.
Ong et al. (2004) "High-Performance Semiconducting Poolythiophenes for Organic Thin-Film Transistors," J. Am. Chem. Soc. 126:3378-3379.
Ong et al. (2005) "Design of High-Performance Regioreular Polythiophenes for Organic Thin-Film Transistors," Proc. IEEE 93:1412-1419.
Origin Energy (May 2004) "Fact Sheet—Sliver Cells," www.oriqinenergY.com.au/sliver Ouyang et al. (2002) "High-Performance, Flexible Polymer Light-Emitting Diodes Fabricated by a Continuous Polymer Coating Process," Adv. Mat, 14:915-918.
Ouyang et al. (2002) "High-Performance, Flexible Polymer Light-Emitting Diodes Fabricated by a Continuous Polymer Coating Process," Adv. Mat. 14:915-918.
Ouyang et al. (2008) "High Frequency Properties of Electro-Textiles for Wearable Antenna Applications," IEEE Trans. Antennas Propaq. 56(2):381-389.
Ouyang et al. (Web Release Mar. 20, 2000) "Conversion of Some Siloxane Polymers to Silicon Oxide by UV/Ozone Photochemical Processes," Chem. Mater. 12(6): 1591-1596.
Overholt et al. (2005) "Photodynamic Therapy for Esophageal Cancer using a 180° Windowed Esophageal Balloon," Lasers in Surg. Med. 14:27-33.
Pan et al. (2001) "Nanobelts of Semiconducting Oxides," Science 291: 1947-1949.
Panev et al. (2003) "Sharp Exciton Emission from Single InAs Quantum Dots in GaAs Nanowires," Appl. Phys. Lett. 83:2238-2240.
Pardo et al. (2000) "Application of Screen Printing in the Fabrication of Organic Ligh-Emitting Devices," Adv. Mater. 12(17):1249-1252.
Park et al. (1997) "Block Copolymer Lithography: Periodic Arrays of ~10 Holes in 1 Square Centimeter," Science 276:1401-1404.
Park et al. (1998) "Fabrication of Three-Dimensional Macroporous Membranes with Assemblies of Microspheres as Templates," Chem. Mater. 10:1745-1747.
Park et al. (Aug. 2009) "Printed Assemblies of Inorganic Light-Emitting Diodes for Deformable and Semitransparent Displays," Science 325:977-981.
Park et al. (Web Release Feb. 22, 2009) "Biodegradable Luminescent Porous Silicon Nanoparticles for in Vivo Applications," Nature Mater. 8:331-336.

Parker et al. (2009) "Biocompatible Silk Printed 0ptical Waveguides," Adv. Mater. 21:2411-2415.
Patolsky et al. (2006) "Detection, Stimulation, and Inhibition of Neuronal Signals with High-Density Nanowire Transistor Arrays," Science 313:1100-1104.
Patton et al. (Mar. 1998) "Effect of Diamond like Carbon Coating and Surface Topography on the Performance of Metal Evaporated Magnetic Tapes," IEEE Trans Magn. 34(2):575-587.
Paul et al. (Apr. 2003) "Patterning Spherical Surfaces at the Two Hundred Nanometer Scale Using Soft Lithography," Adv. Func. Mater. 13(4):259-263.
Pearton et al. (1999) "GaN: Processing, Defects, and Devices," J. Appl. Phys. 86:1-78.
Peng et al. (Mar. 2, 2000) "Shape Control of CdSe Nanocrystals," Nature 404:59-61.
Perry et al. (2008) "Nano- and Micropatterning of Optically Transparent, Mechanically Robust, Biocompatible Silk Fibroin Films," Adv. Mater. 20:3070-3072.
Piazza et al. (2005) "Protective Diamond-Like Carbon Coatings for Future Optical Storage Disks," Diamond Relat. Mater. 14:994-999.
Pimparkar et al. (Feb. 2007) "Current-Voltage Characteristics of Long-Channel Nanobundle Thin-Film Transistors: A 'Bottom-Up' Perspective," IEEE Electron Dev. Lett. 28(2):157-160.
Podzorov et al. (2005) "Hall Effect in the Accumulation Layers on the Surface of Orgaic Semiconductors," Phys. Rev. lett. 95:226601.
Pushpa et al. (2002) "Stars and Stripes. Nanoscale Misfit Dislocation Patterns on Surfaces," Pure Appl. Chem. 74(9):1663-1671.
Qian et al. (2006) "Scaling Effects of Wet Adhesion in Biological Attachment Systems," Acta Biomaterialia 2:51-58.
Quake et al (2000) "From Micro- to Nanofabrication with Soft Materials," Science 290: 1536-1540.
Radtke et al. (Feb. 5, 2007) "Laser-Lithography on Non-Planar Surfaces," Opt. Exp. 15(3):1167-1174.
Randall et al. (2005) "Permeation-driven flow in poly(dimethylsiloxane) microfluidic devices," Proc. Nat. Acad. Sci. USA 102(31):10813-10818.
Rao et al. (2003) "Large-scale assembly of carbon nanotubes," Nature, 425:36-37.
Razeghi et al. (1994) "High-Power Laser Diodes Based on InGaAsP Alloys," Nature 369:631-633.
Razouk et al. (Sep. 1979) "Dependence of Interface State Density on Silicon Thermal Oxidation Process Variables," J. Electrochem. Soc. 126(9):1573-1581.
Reuss et al. (2005) "Macroelectronics: Perspectives on Technology and Applications," Proc. IEEE 93:1239-1256.
Reuss et al. (Jun. 2006) "Macroelectronics," MRS Bull. 31 :447-454.
Ribas et al. (1998) "Bulk Micromachining Characterization of 0.2 μm HEMT MMIC Technology for GaAs MEMS Design," Mater. Sci. Eng. B 51 :267-273.
Ridley et al. (1999) "All-Inorganic Field Effect Transistors Fabricated by Printing," Science 286:746-749.
Roberts et al. (1979) "Looking at Rubber Adhesion," Rubber Chem. Technol. 52:23-42.
Roberts et al. (May 2006) "Elastically Relaxed Free-Standing Strained-Silicon Nanomembranes," Nat. Mater. 5:388-393.
Robinson et al. (1983) "GaAs Readied for High-Speed Microcircuits," Science 219:275-277.
Roelkens et al. (Dec. 2005) "Integration of InP/InGaAsP Photodetectors onto Siliconon-Insulator Waveguide Circuits," Optics Express 13(25):10102-10108.
Rogers et al. (1997) "Using an Elastomeric Phase Mask for Sub-100 nm Photolithography in the Optical Near Field," Appl. Phys. Lett. 70:2658-2660.
Rogers et al. (1998) "Generating ~90 Nanometer Features Using Near Field Contact Mode Photolithography with an Elastomeric Phase Mask," J. Vac. Sci. Technol. 16(1 ):59-68.
Rogers et al. (1998) "Quantifying Distortions in Soft Lithography," J. Vac. Sci. Technol. 16:88-97.
Rogers et al. (1998) "Using Printing and Molding Techniques to Produce Distributed Feedback and Bragg Reflector Resonators for Plastic Lasers," Appl. Phys. Lett. 73: 1766-1768.

(56) References Cited

OTHER PUBLICATIONS

Rogers et al. (1999) Printing Process Suitable for Reel-to-Reel Production of High-Performance Organic Transistors and Circuits, Adv. Mater. 11 (9):741-745.
Rogers et al. (2000) "Organic Smart Pixels and Complementart Inverter Circuits Formed on Plastic Substrates by Casting and Rubber Stamping," IEEE Electron Dev. Lett. 21 (3): 100-103.
Rogers et al. (2001) "Paper-Like Electronic Displays: Large-Area Rubber-Stamped Plastic Sheets of Electronics and Microencapsulated Electrophoretic Inks," Proc. Nat/Acad. Sci. USA 98:4835-4840.
Rogers et al. (2002) "Printed Plastic Electronics and Paperlike Displays," J. Polym. Sci. Part A. Polym. Chem. 40:3327-3334.
Rogers, J. (Jul. 9, 2010) "Farewell to Flatland," Science 329:138139.
Rogers, JA (2001) "Rubber Stamping for Plastic Electronics and Fiber Optics," MRS Bulletin 26(7):530-534.
Rogers, JA (2001) "Toward Paperlike Displays," Science 291: 1502-1503.
Rosenblatt et al. (2002) "High Performance Electrolyte Gated Carbon Nanotube Transistors," Nano Lett. 2(8):869-872.
Rotkin et al. (2003) "Universal Description of Channel Conductivity for Nanotube and Nanowire Transistors," Appl. Phys. Lett. 83:1623-1625.
Roundy et al. (2003) "Photonic Crystal Structure with Square Symetry within EachLayer and a Three-Dimensional Band Gap," Appl. Phys Lett. 82:3835-3837.
Rubehn et al. (2009) "A MEMS based Flexible Multichannel ECoG-Electrode Array," J. Neural Eng. 6:036003.
Ruchehoeft et al. (2000) "Optimal Strategy for Controlling Linewidth on Spherical Focal Surface Arrays," J. Vac. Sci. Technol. B 18(6):3185-3189.
Ryu et al. (2009) "Human Cortical Prostheses: Lost in Translation?" Neurosurg Focus 27(1):E5.
Samuelson et al. (2004) "Semiconductor Nanowires for Novel One-Dimensional Devices," Physica E 21:560-567.
Sangwal et al. (1997) "Nature of multilayer steps on the {100} cleavage planes of MgO single crystals," Surf. Sci., 383:78-87.
Santin et al. (1999) "In vitro Evaluation of the Inflammatory Potential of the Silk Fibroin," J. Biomed. Mater. Res. 46:382-389.
Sanyal et al. (2002) "Morphology of Nanostructures Materials," Pure Appl. Chem. 74(9): 1553-1570.
Sazonov et al. (2005) "Low-Temperature Materials and Thin-Film Transistors for Flexible Electronics," Proc. IEEE 93:1420-1428.
Scherlag et al. (1969) "Catheter Technique for Recording His Bundle Activity in Man," Circulation 39:13-18.
Schermer et al. (2005) "Thin-Film GaAs Epitaxial Lift-Off Solar Cells for Space Applications," Prog. Photovolt. Res. Appl. 13:587-596.
Schermer et al. (2006) "Photon Confinement in High-Efficiency, Thin Film II I-V Solar Cells Obtained by Epitaxial Lift-Off," Thin Solid Films 211-512:645-653.
Schindl et al. (2003) "Direct Stimulatory Effect of Low-Intensity 670-nm Laser Irradiation on Human Endothelial Cell Proliferation," Br. J. Dermatol. 148:334-336.
Schlegel et al. (2002) "Structures of quartz (1010)- and (1011)-water interfaces determined by X-ray reflectivity and atomic force microscopy of natural growth surfaces," Geochim. Cosmochim. Acta, vol. 66, No. 17, pp. 3037-3054.
Schmid et al. (2003) "Preparation of Metallic Films on Elastomeric Stamps and Their Application for Contact Processing and Contact Printing," Adv. Funct. Mater. 13:145-153.
Schmid et al. (Mar. 25, 2000) "Siloxene Polymers for High-Resolution, High-Accuracy Soft Lithography," Macromolecules 33(8):3042-3049.
Schmid et al. (May 11, 1998) "Light-Coupling Masks for Lensless, Sub-wavelength Optical Lithography," Appl. Phys. Lett. 72(19):2379-2381.
Schmidt et al. (Mar. 8, 2001) "Thin Solid Films Roll up into Nanotubes," Nature 410:168.
Schnable et al. (1969) "Aluminum Metallization; Advantages and Limitations for Integrated Circuit Applications," IEEE 57: 1570-1580.
Schneider et al. (2008) "Mechanical Properties of Silicones for MEMS," J. Micromech. Microeng. 18:065008.
Schon et al. (1995) "Ambipolar Pentacene Field-Effect Transistors and Inverters,"Science 287: 1022-1 023.
Scorzoni et al. (Oct. 4, 2004) "On the Relationship Between the Temperature coefficient of Resistance and the Thermal Conductance of Integrated Metal Resistors," Sens Actuators A 116( 1): 137-144.
Search and Examination Report, Corresponding to Singapore Patent Application No. 200607372-0, Mailed Oct. 17, 2007.
Shi et al. (2001) "Free-Standing Single Crystal Silicon Nanoribbons," J. Am. Chem. Soc. 123(44):11095-11096.
Shi et al. (Sep. 2000) "Synthesis of Large Areas of Highly Oriented, Very Long Silicon Nanowires," Adv. Mater. 12(18):1343-1345.
Shi et al. (Web Release Oct. 11, 2001) "Free-Standing Single Crystal Silicon Nanoribbons," J. Am. Chem. Soc. 123(44):11095-11096.
Shin et al. (2003) "PDMS-Based Micro PCR Chip with Parylene Coating," J. Micromech. Microeng. 13:768-774.
Shtein et al. (Oct. 15, 2004) "Direct Mask-Free Patterning of Molecular Organic Semiconductors Using Organic Vapor Jet Printing," J. Appl. Phys. 96(8):4500-4507.
Shull et al. (1998) "Axisymmetric Adhesion Tests of Soft Materials," Macramol. Chem. Phys.199:489-511.
Siegel et al. (2009) "Thin, lightweight, Foldable Thermochromic Displays on Paper," Lab Chip 9:2775-2781.
Siegel et al. (2010) "Foldable Printed Circuit Boards on Paper Substrates," Adv. Funct. Mater. 20:28-35.
Siegel et al. (Web Release Feb. 7, 2007) "Microsolidics: Fabrication of Three-Dimensional Metallic Microstructures in Poly(dimethylsiloxane)," Adv. Mater. 19(5):727-733.
Sim et al. (1993) "An Analytical Back-Gate Bias Effect Model for Ultrathin SOI CMOS Devices," IEEE Trans. Elec. Dev. 40:755-765.
Sirringhaus et al. (2003) "Inkjet Printing of Functional Materials," MRS Bull. 28:802-806.
Sirringhaus et al. (Dec. 15, 2000) "High-Resolution Inkjet Printing of All-Polymer Transistor Circuits," Science 290:2123-2126.
Sirringhaus, H. (2005) "Device Physics of Solution-Processed Organic Field-Effect Transistors," Adv. Mater. 17:2411-2425.
Smay et al. (2002) "Colloidal Inks for Directed Assembly of 3-D Periodic Structures," Langmuir 18:5429-5437.
Smith et al. (2000) "Electric-Field Assisted Assembly and Alignment of Metallic Nanowires," Appl. Phys. Lett. 77(9):1399-1401.
Snow et al. (2003) "Random networks of carbon nanotubes as an electronic material," Appl. Phys. Lett., vol. 82, No. 13, pp. 2145-2147.
Snow et al. (2005) "High-mobility carbon-nanotube transistors on a polymeric substrate," Appl. Phys. Lett., 86, 033105.
So et al. (2008) Organic Light-Emitting Devices for Solid-State Lighting, MRS Bull. 33:663-669.
Sofia et al. (2001) "Functionalized Silk-Based Biomaterials for Bone Formation," J. Biomed. Mater. Res. 54:139-148.
Someya et al. (2005) "Conformable, Flexible, Large-Area Networks of Pressure and Thermal Sensors with Organic Transistor Active Matrixes," Proc. Nat. Acad. Sci. USA 102:12321-12325.
Someya et al. (2005) "Integration of Organic FETs with Organic Photodiodes for a Large Area, Flexible, and Lightweight Sheet Image Scanners," IEEE Trans. Electron Devices 52:2502-2511.
Someya et al. (Jul. 6, 2004) "A Large-Area, Flexible Pressure Sensor Matrix With Organic Field-Effect Transistors for Artificial Skin Applications," Proc. Nat. Acad. Sci. USA 101 (27):9966-9970.
Someya, T. (Aug. 7, 2008) "Electronic Eyeballs," Nature 454:703-704.
Soole et al. (Mar. 1991) "InGaAs Metal-Semiconductor-Metal Photodetectors for Long Wavelength Optical Communications," IEEE J. Quantum Electron. 27(3):737-752.
Soong et al. (1984) "Adverse Reactions to Virgin Silk Sutures in Cataract Surgery," Ophthalmology 91:479-483.
Srinivasan et al. (Web Release Mar. 26, 2007) "Piezoelectric/ Ultrananocrystalline Diamond Heterostructures for High-Performance Multifunctional Micro/Nanoelectromechanical Systems," Appl. Phys. Lett. 90: 1341 01.

(56) References Cited

OTHER PUBLICATIONS

Stafford et al. (2004) "A Buckling-Based Metrology for Measuring the Elastic Moduli of Polymeris Thin Films," Nature Mater. 3:545-550.
Star et al. 2004 "Nanotube Optoelectric Memo Devices," Nano Lett., vol. 4, No. 9, pp. 1587-1591.
Storm et al. (Web Release Jul. 13, 2003) "Fabrication of Solid-State Nanopores with Single-Nanometre Precision," Nat. Mater. 2:537-540.
Strukov et al. (2005) "CMOL FPGA: A Reconfigurable Architecture for Hybrid Digital Circuits with Two-Terminal Nanodevices," Nanotechnology 16:888-900.
Su et al. (2000) "Lattice-Oriented Growth of Single-Walled Carbon Nanotubes," J. Phys. Chem. B 104(28):6505-6508.
Sum et al. (2009) "Near-Infrared Spectroscopy for the Detection of Lipid Core Coronary Plagues," Curr. Cardiovasc. Imag. Rep. 2:307-315.
Sumant et al. (Apr. 2005) "Toward the Ultimate Tribological Interface: Surface Chemistry and Nanotribology of Ultrananocrystalline Diamond," Adv. Mater 17(8):1039-1045.
Sun et al. (2004) "Fabricating Semiconductor Nano/Microwires and Transfer Printing Ordered Arrays of them onto Plastic Substrates," Nano Lett. 4: 1953-1959.
Sun et al. (2005) "Advances in Organic Field-Effect Transistors," *J. Mater. Chem.*15:53-65.
Sun et al. (2005) "Bendable GaAs Metal-Semiconductor Field-Effect Transistors Formed with a Printed GaAs Wire Arrays on Plastic Substrates," Appl. Phys. Lett. 87:083501.
Sun et al. (2005) "Photolithographic Route to the Fabrication of Micro/Nanowires of II I-V Semiconductors," Adv. Funct. Mater. 15:30-40.
Sun et al. (2007) "Inorganic Semiconductors for Flexible Electronics," *Adv. Mater*. 19:1897-1916.
Sun et al. (2007) "Controlled Buckling of Semiconductor Nanoribbons for Stretchable Electronics," Nat. Nanotechnol. 1:201-207.
Sun et al. (Nov. 2006) "Buckled and Wavy Ribbons of GaAs for High-Performance Electronics on Elastomeric Substrates," Adv. Mater. 18(21):2857-2862.
Sun et al. (Web Release Dec. 5, 2006) "Controlled Buckling of Semiconductor Nanoribbons for Stretchable Electronics," Nature Nanotech. 1:201-207.
Sundar et al. (2004) "Elastomeric Transistor Stamps: Reversible Probing of Charge Transport in Organic Crystals," Science 303: 1644-1646.
Suo et al. (Feb. 22, 1999) "Mechanics of Rollable and Foldable Film-on-Foil Electronics," Appl. Phys. Lett. 74(8):11771179.
Supplementary European Search Report dated Jun. 15, 2012, corresponding to European Patent Application No. 09 71 6695.
Supplementary European Search Report, Corresponding to European Application No. 04 81 2651, Completed Oct. 19, 2010.
Supplementary European Search Report, Corresponding to European Application No. EP 05 75 6327, Completed Sep. 25, 2009.
Swain et al. (2004) "Curved CCD Detector Devices and Arrays for Multi-Spectral Astrophysical Application and Terrestrial Stereo Panoramic Cameras," Proc. SPIE 5499:281-301.
Sze, S. (1985) "Lithography and Etching," in; *Semiconductor Devices: Physics and Technology*, New York: Wiley, pp. 428-467.
Sze S. 1988 VLSI Technology, Chapter 8, ION Implantation, McGraw-Hill, 327-374, 566-611.
Sze, S. (1994) "Semiconductor Sensor Technologies," in; *Semiconductor Sensors*,John Wiley and Sons: New York pp. 17-95.
Takamoto et al. (Jan. 20, 1997) "Over 30% Efficient InGaP/GaAs Tandem Solar Cells," Appl. Phys. Lett. 70(3):381-383.
Talapin et al. (Oct. 7, 2005) "PbSe Nanocrystal Solids for n- and p-Channel Thin Film Field-Effect Transistors," Science 310:86-89.
Tan et al. (Apr. 12, 2004) "Performance Enhancement of InGaN Light Emitting Diodes by Laser-Lift-off and Transfer from Sapphire to Copper Substrate," Appl. Phys. Lett. 84(15):2757-2759.
Tanase et al. (2002) "Magnetic Trapping and Self-Assembly of Multicomponent Nanowires," J. Appl. Phys. 91 :8549-8551.
Tang et al. (2005) "One-Dimensional Assemblies of Nanoparticles: Preparation,Properties, and Promise," Adv. Mater. 17:951-962.
Tao et al. (2003) "Langmuir-Blodgett Silver Nanowire Monolayers for Molecular Sensing Using Surface-Enhanced Raman Spectroscopy," Nano Lett. 3:1229-1233.
Tate et al. (2000) "Anodization and Microcontact Printing on Elotroless Silver: Solution-Based Fabrication Procedures for Low-Voltage Electronic Systems with Organic Active Components," Langmuir 16:6054-6060.
Teshima et al. (2001) "Room-Temperature Deposition of High-Purity Silicon Oxide Films by RF Plasma-Enhanced CVD," Surf. Coat. Technol. 146-147:451-456.
Theiss et al. (1998) "PolySilicon Thin Film Transistors Fabricated at 100° C on a Flexible Plastic Substrate," IEDM 98:257-260.
Thornwood et al. (Oct. 1, 1990) "Utilizing Olptical Lithography in the Sub-Micron Dimensional Regime," IBM Tech. Disc. Bull. 33(5):187-188.
Timko et al. (2009) "Electrical Recording from Hearts with Flexible Nanowire Device Arrays," Nano Lett. 9:914-918.
Toader et al. (2004) "Photonic Band Gap Architectures for Holographic lithography," Phy. Rev. Lett. 043905/1-043905/4.
Toader et al. (2004) "Photonic Band Gaps Based on Tetragonal Lattices of Slanted Pores," Phys. Rev. Lett. 90:233901/1-233901/4.
Tong (1999) "Stresses in Bonded Wafers," in; *Semiconductor Wafer Bonding: Science and Technology*, John Wiley; New York, pp. 187-221.
Tong (1999) Semiconductor Wafer Bonding: Science and Technology, John Wiley; New York, pp. 187-221.
Trau et al. (1997) "Microscopic Patterning of Orientated Mesoscopic Silica Through Guided Growth," Nature 390:674-676.
Trentler et al. (1995) "Solution-liquid-Solid Growth of Crytalline III-V Semiconductors: An Analogy to Vapor-liquid-Solid Growth," Science 270:1791-1794.
Tseng et al. (Web Release Dec. 19, 2003) "Monolithic Integration of Carbon Nanotube Devices with Silicon MOS Technology" Nano Lett. 4(1):123-127.
Ucjikoga, S. (2002) "Low-Temperature Polycrystalline Silicon Thin-Film Transistor Technologies of System-on-Glass Displays," MRS Bull. 27:881-886.
Upon the Schottky Barrier Height of Au/n-GaAs and Ti/n-GaAs Diodes, *Semicond. Sci. Technol*. 19:1391-1396.
Urruchi et al. (2000) "Etching of DLC Films Using a Low Intensity Oxygen Plasma Jet," Diamond Relat. Mater. 9:685-688.
US Office Action for U.S. Appl. No. 12/575,008 mailed Feb. 17, 2011.
Vanhollenbeke et al. (2000) "Compliant Substrate Technology: Integration of Mismatched Materials for Opto-Electronic Applications," Prog. Cryst. Growth Charact. Mater. 41(1-4):1-55.
Velev et al. (1997) "Porous silica via colloidal crystallization," *Nature* 389:447-448.
Vepari et al. (Aug.-Sep. 2007) "Silk as a Biomaterial," Prog. Polym. Sci. 32(8-9):991-1007.
Vilan et al. (2000) "Molecular Control Over Au/GaAs Diodes," *Nature* 404:166-168.
Vinck et al. (2003) "Increased Fibroblast Proliferation Induced by Light Emitting Diode and Low Power Laser Irradiation," Lasers Med. Sci. 18:95-99.
Viventi et al. (Mar. 2010) "A Conformal, Bio-Interfaced Class of Silicon Electronics for Mapping Cardiac Electrophysiology," Sci. Trans. Med. 2(24):24ra22.
Vlasov et al. (2001) "On-Chip Natural Assembly of Silicon Photonic Bandgap Crystals," Nature 414:289-293.
Voss, D. (2000) "Cheap and Cheerful Circuits," *Nature* 407:442-444.
Wagner et al. (2003) "Silicon for Thin-Film Transistors," *Thin Solid Films* 430: 15-19.
Wagner et al. (2005) "Electronic Skin: Architecture and Components," *Physica E* 25:326-334.
Wagner et al. (Mar. 1, 1964) "Vapor-liquid-Solid Mechanism of Single Crystal Growth," Appl. Phys. Lett. 4(5):89-90.
Waksman et al.(2008) "Photopoint Photodynamic Therapy Promotes Stabilization of Atherosclerotic Plaques and Inhibits Plaque Progression," J. Am. Coll. Cardiol. 52:1024-1032.

(56) References Cited

OTHER PUBLICATIONS

Wang et al. (2003) "A Solution-Phase, Precursor Route to Polycrystalline $SnO_2$ Nanowores That can be Used for Gas Sensing under Ambient Conditions," J. Am. Chem. Soc. 125:16176-16177.
Wang et al. (2005) "Oxidation Resistant Germanium Nanowires: Bulk Synthesis, Long Chain Alkanethiol Functionalization, and Langmuir-Blodgett Assembly," J. Am. Chem. Soc. 127(33):11871-11875.
Wang et al. (2005) "Electronically Selective Chemical Functionalization of Carbon Nanotubes: Correlation between Raman Spectral and Electrical Responses," J. Am. Chem. Soc., 127:11460-11468.
Wang et al. (2006) "Direct Synthesis and Characterization of CdS Nanobelts," *Appl. Phys. Lett.* 89:033102.
Wang et al. (Aug.-Sep. 2008) "In Vivo Degradation of Three-Dimensional Silk Fibroin Scaffolds," Biomaterials 29(24-25):3415-3428.
Waxman et al. (2009) "In vivo Validation of a Catheter-Based Near-Infrared Spectroscopy System for Detection of Lipid Core Coronary Plaques: Initial Results of the Spectacl Study," J. Am. Coll. Cardiol. Img. 2:858-868.
Waxman, S. (2008) "Near-Infrared Spectroscopy for Plaque Characterization," J. Interv. Cardiol. 21:452-458.
Whang et al. (2003) "Large-Scale Hierarchical Organization of Nanowire Arrays for Integrated Nanosystems," Nano Lett. 3(9): 1255-1259.
Williams et al. (Oct. 2006) "Growth and Properties of Nanocrystalline Diamond Films," Phys. Stat. Sol. A 203(13):3375-3386.
Williams et al. (Web Release Jan. 23, 2006) "Comparison of the Growth and Properties of Ultranocrystalline Diamond and Nanocrystalline Diamond," Diamond Relat. Mater. 15:654-658.
Willner et al. (2002) "Functional Nanoparticle Architectures for Senoric, Optoelectronic, and Bioelectronic Applications," Pure Appl. Chem. 74(9): 1773-1783.
Wilson et al. (2006) "ECoG Factors Underlying Multimodal Control of a Brain-Computer Interface," IEEE Trans. Neural Syst. Rehabil. Eng. 14:246-250.
Wind et al. (May 20, 2002) "Vertical Scaling of Carbon Nanotube-Field-Effect Transitors Using Top Gate Electrodes," Appl. Phys. Lett. 80(20):3871-3819.
Wise et al. (Jul. 2008) "Microelectrodes, Microelectronics, and Implantable Neural Microsystems," Proc. IEEE 96(7):1184-1202.
Won et al. (2004) "Effect of Mechanical and Electrical Stresses on the Performance of an a-Si:H TFT on Plastic Substrate," J. Electrochem. Soc. 151:G167-G170.
Wong-Riley et al. (2005) "Photobiomodulation Directly Benefits Primary Neurons Functionally Inactivated by Toxins," J. Biol. Chem. 280:4761-4771.
Woodburn et al. (1996) "Phototherapy of Cancer and Atheromatous Plaque with Texaphyrins," J. Clin. Laser Med. Surg. 14:343-348.
Written Opinion of the International Search Authority Corresponding to International patent Application No. PCT/US05/19354 Issued Apr. 18, 2007.
Wu et al. (2001) "Amorphous Silicon Crystallization and Polysilicon Thin Film Transistors on SiO2 Passivated Steel Foil Substrates," Apple. Surf. Sci 175-176:753-758.
Wu et al. (2001) "Thermal Oxide of Polycrystalline Silicon on Steel Foil as a Thin-Film Transitor Gate Dielectric," Appl. Phys. Lett. 78:3729-3731.
Wu et al. (2001) "Direct Observation of Vapor-Liquid-Solid Nanowire Growth," J. Am. Chem. Soc. 123(13):3165-3166
Wu et al. (2002) "Growth of Au-Catalyzed Ordered GaAs Nanowire Arrays by Molecular-Beam Epitaxy," Appl. Phys. Lett. 81 :5177-5179.
Wu et al. (2002) "Inorganic Semiconductor Nanowires: Rational Growth, Assembly, and Novel Properties," Chem. Eur. J. 8(6):1261-1268.
Wu et al. (2003) "Growth, Branching, and Kinking of Molecular-Beam Epitaxial (110) GaAs Nanowires," Appl. Phys. Lett. 83:3368-3370.
Wu et al. (Jul. 1, 2004) "Single-Crystal Metallic Nanowires and Metal/Semiconductor Nanowire Heterostructures," Nature 430:61-65.
Wu et al. (Nov. 2002) "Complementary Metal-Oxide-Semiconductor Thin-Film Transistor Circuits from a High-Temperature Polycrystalline Silicon Process on Steel Foil Substrates," IEEE Trans. Electr. Dev. 49(11): 1993-2000.
Wu et al. (Web Release Jan. 19, 2002) "Block-by-Block Growth of Single-Crystalline Si/SiGe Superlattice Nanowires," Nano Lett. 2(2):83-86 Si/SiGe Superlattice Nanowires, Nano Lett. 2(2):83-86.
Wu et al. (Web Release Mar. 13, 2001) "Direct Observation of Vapor-Liquid-Solid Nanowire Growth," J. Am. Chem. Soc. 123(13):3165-3166.
Xia et al. (1996) "Shadowed Sputtering of Gold on V-Shaped Microtrenches Etched in Silicon and Applications in Microfabrication," Adv. Mater. 8(9):765-768.
Xia et al. (1998) "Soft Lithography," *Annu. Rev. Mater. Sci.* 28:153-184.
Xia et al. (1999) "Unconventional Methods for Fabricating and Patterning Nanostructures," Chem. Rev. 99: 1823-1848.
Xia et al. (2003) "One-Dimensional Nanostructures: Synthesis, Characterization and Applications," Adv. Mater. 15:353-389.
Xia et al. (Jul. 19, 1996) "Complex Optical Surfaces Formed by Replica Molding Against Elastomeric Masters," Science 273:347-349.
Xiang et al. (Mar. 25, 2006) "Ge/Si Nanowire Heterostructures as High-Performance Field-Effect Transistors," Nature 441 :489-493.
Xiao et al. (2003) "High-mobility thin-film transistors based on aligned carbon nanotubes," Appl. Phys. Lett., vol. 83, No. 1, pp. 150-152.
Xie et al. (May 2003) "Polymer-Controlled Growth of $Sb_2Se_3$ Nanoribbons Via a Hydrothermal Process," J. Cryst. Growth 252(4):570-574.
Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," Biomaterials 26(16):3123-3129.
Yang et al. (1997) "Mesoporous Silica with Micrometer-Scale Desgns," *Adv. Mater.* 9:811-814.
Yang et al. (2000) "Stability of Low-Temperature Amorphous Silicon Thin Film Transistors Formed on Glass and Transparent Plastic Substrates," J. Vac. Sci. Technol. B 18:683-689.
Yang et al. (2002) "Creating Periodic Three-Dimensional Structures by Multibeam Interface of Visible Laser," Chem. Mater. 14:2831-2833.
Yang et al. (Dec. 2007) "RFID Tag and RF Structures on a Paper Substrate Using Inkjet-Printing Technology," IEEE Trans. Microw. Theory Tech. 55(12):2894-2901.
Yang, P. (2005) "The Chemistry and Physics of Semiconductor Nanowires," MRS Bull. 30:85-91.
Yanina et al. (2002) "Terraces and ledges on (001) spinel surfaces," Surf. Sci., 513:L402-L412.
Yao et al. (2008) "Seeing Molecules by Eye: Surface Plasmon Resonance Imaging at Visible Wavelengths with High Spatial Resolution and Submonolayer Sensitivity," Agnew. Chem. 47:5013-5017.
Yao et al. (2010) "Functional Nanostructured Plasmonic Materials," Adv. Mater. 22:1102-1110.
Yao et al. (Mar. 2000) "High-Field Effect Electrical Transport in Single-Walled Carbon Nanotubes," Phys. Rev. Lett. 84(13):2941-2944.
Yeager et al. (Aug. 30, 2008) "Characterization of Flexible ECoG Electrode Arrays for Chronic Recording in Awake Rats," J. Neurosci. Methods 173(2):279-285.
Yeh et al. (1994) "Fluidic Self-Assembly for the Integration of GaAs light-Emitting Diodes on Si Substrates," IEEE Photon. Technol. Lett. 6:706-708.
Yin et al. (2000) "A Soft lithography Approach to the Fabrication of Nanostructures of Single Crystalline Silicon with Well-Defined Dimensions and Shapes," Adv. Mater. 12:1426-1430.
Yin et al. (2005) "Colloidal Nanocrystal Synthesis and the Organic-Inorganic Interface," Nature 437:664-670.

(56) References Cited

OTHER PUBLICATIONS

Yoon et al. (2005) "Low-Voltage Organic Field-Effect Transistors and Inverters Enabled by Ultrathin Cross-linked Polymers as Gate Dielectrics," J. Am. Chem. Soc. 127: 10388-10395.
Yu et al. (2000) "Silicon Nanowires: preparation, Device Fabrication, and Transport Properties," J. Phys. Chem. B 104(50):11864-11870.
Yu et al. (2003) "Solution-liquid-Solid Growth of Soluble GaAs Nanowires," *Adv. Mater.* 15:416-419.
Yu et al. (2003) "Two- Versus Three-Dimensional Quantum Confinement in Indium Phosphide Wires and Dots," Nat. Mater. 2:517-520.
Yu et al. (2004) "The Yield Strength of Thin Copper Films on Kapton," J. Appl. Phys. 95:2991-2997.
Yuan et al. (2006) "High-Speed Strained-Single-Crystal-Silicon Thin-Film Transistors on Flexible Polymers," J. Appl. Phys. 100:013708.
Yurelki et al. (Jul. 24, 2004) "Small-Angle Neutron Scattering from Surfactant-Assisted Aqueous Dispersions of Carbon Nanotubes," J. Am. Chem. Soc. 126(32):9902-9903.
Zakhidov et al. (1998) "Carbon Structure with Three-Dimensional Periodicity at Optical Wavelengths," Science 282:897-901.
Zaumseil et al. (2003) "Nanoscale Organic Transistors that use Source/Drain Electrodes Supported by High Resolution Rubber Stamps," Appl. Phys. Lett. 82(5):793-795.
Zaumseil et al. (2003) "Three-Dimensional and Multilayer Nanostructures Formed by Nanotransfer Printing," Nano Lett. 3(9):1223-1227.
Zhang et al. (2001) "Electric-field-directed growth of aligned single-walled carbon nanotubes," Appl. Phys. Lett., vol. 79, No. 19. pp. 3155-3157.
Zhang et al. (2005) "Low-Temperature Growth and Photoluminescence Property of ZnS Nanoribbons," J. Phys. Chem. B 109(39)18352-18355.
Zhang et al. (Apr. 2003) "Oxide-Assisted Growth of Semiconducting Nanowires," *Adv. Mater.* 15(7-8):635-640.
Zhang et al. (Apr. 5, 2004) "Structure and Photoiluminescence of ZnSe Nanoribbons Grown by Metal Organic Chemical Vapor Deposition," Appl. Phys. Lett. 84(14):2641-2643.
Zhang et al. (Feb. 9, 2006) "Electronic Transport in Nanometre-Scale Silicon-on-Insulator Membranes," Nature 439:703-706.
Zhang et al. (Jun. 6, 2006) "Anomalous Coiling of SiGe/Si and SiGe/Si/Cr Helical Nanobelts," Nano Lett. 6(7)1311-1317.
Zhao et al. (Mar. 2007) "Improved Field Emission Properties from Metal-Coated Diamond Films," Diamond Relat Mater. 16(3):650-653.
Zheng et al. (1998) "Sudden Cardiac Death in the United States, 1989 to 1998," Circulation 104, 2158-2163.
Zheng et al. (2004) "Shape-and Solder-Directed Self-Assembly to Package Semiconductor Device Segments," Appl. Phys. Lett. 85:3635-3637.
Zheng et al. (Aug. 31, 2004) "Sequential Shape-and-Solder-Directed Self Assembly of Functional Microsystems," Proc. Natl. Acad. Sci. USA 101(35):12814-12817.
Zhou et al. (2002) "An Efficient Two-Photon-Generated Photoacid Applied to Positive-Tone 3D Microfabrication," Science 296:1106-1109.
Zhou et al. (2004) "p-Channel, n-Channel Thin Film Transistors and p-n. Diodes Based on Single Wall Carbon Nanotube Networks," Nano Lett. 4:2031-2035.
Zhou et al. (2005) "Band Structure, Phonon Scattering, and the Performance Limit of Single-Walled Carbon Nanotube Transistors," Phys. Rev. Lett. 95:146805.
Zhou et al. (2005) "Mechanism for Stamp Collapse in Soft Lithography," *Appl. Phys.Lett.* 87:251925.
Zhu et al. (2005) "Spin on Dopants for High-Performance Single Crystal Silicon Transistors on Flexible Plastic Substrates" Applied Physics Letters 86, 133507 (2005).
Zipes et al. (2006) "ACC/AHA/ESC 2006 Guidelines for Management of Patients With Ventricular Arrhythmias and the Prevention of Sudden Cardiac Death: A Report of the American College of Cardiology/American Heart Association Task Force and the European Society of Cardiology Committee for Practice Guidelines (Writing Committee to Develop Guidelines for Management of Patients With Ventricular Arrhythmias and the Prevention of Sudden Cardiac Death," Circulation 114:385-484.
MY P-020607: Malaysian Office Action for Malaysian application No. PI 20094997 dated Aug. 15, 2012 (English).
Angadi et al. (Web Release Jun. 1,2006) "Thermal Transport and Grain Boundary Conductance in Ultrananocrystalline Diamond Thin Films," J. Appl. Phys. 99:114301-1 to 114301-6.
Bietsch et al. (2000) "Conformal Contact and Pattern Stability of Stamps Used for Soft Lithography," J. Appl. Phys. 88:4310-4318.
Bioflex—Biocompatible Flexible Electronic Circuits. Available at tfcg.elis.Ugent.be/projects. Accessed Feb. 8, 2012 (6 pages, print out dated Jul. 23, 2012).
Bourzac, K. (May/Jun. 2010) "TR10: Implantable Electronics," Technology Review, Published by MIT, www.technologyreview.com/biomedicine/25086/?a=f (2 pages, print out dated Mar. 26, 2012).
Burdinski, D. (non-dated) "Soft Lithography and Microcontact Wave Printing," www.research.philips.com/technologies/light_dev_microsys/softlitho/index.html, Downloaded May 23, 2007 (3 pages).
Cao et al. (2006) "Transparent flexible organic thin-film transistors that use printed single-walled carbon nanotube electrodes," Applied Physics Letters 88:113511-1 to 113511-3.
Chaudhury et al. (1991) "Direct Measurement of Interfacial Interactions Between Semispherical Lenses and Flat Sheets of Poly(dimethylsiloxane) and their Chemical Derivatives," Langmuir 7: 1013-1025.
Chung et al. (2000) "Silicon Nanowire Devices," Appl. Phys. Lett. 76(15):2068-2070.
Ciesinski, Michael, "Flexible Electronics: Why the Interest? Where are the Markets? What's Next?" Flextech Alliance Apr. 14, 2010, [retrieved online Apr. 29, 2011] www.aysusergroups.org/tfug_pdfs/tfug2010_4ciesinski.pdf (33 pages).
Delamarche et al. (1997) "Stability of Molded Polydimethylsiloxane Microstructures," Adv. Mat. 9:741-746.
Substantive Examination Adverse Report, Corresponding to Malaysian Patent Application No. PI 20062672, dated Aug. 28, 2006 (English, 3 pages).
Substantive Examination Adverse Report, Corresponding to Malaysian Patent Application No. PI 20052553, dated Mar. 13, 2009 (4 pages)(English).
Substantive Examination Adverse Report, Corresponding to Malaysian Patent Application No. PI 20092343, dated Jun. 15, 2010 (3 pages)(English).
Friedman et al. (2005) "High-Speed Integrated Nanowire Circuits," Nature 434: 1085.
International Search Report on Patentability for PCT Application PCT/US2010/051196, mailed Dec. 1, 2010 (3 pages).
Jang et al. (2003) "Lateral Growth of Aligned Mutilwalled Carbon Nanotubes Under Electric Field," Solid State Commun. 126:305-308.
Jiyun C. Hule. (2003) Abstract of "Guided Molecular Self-Assembly: A Review of Recent Efforts," Smart Mater. Struct. 12:264-271 (2 pages).
Ahn et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," Journal of Applied Physics 100. 0894907-1 to 0894907-7 (2006).
Li et al. (Web Release Mar. 16, 2006) "Catalyst-Assisted Formation of Nanocantilever Arrays on ZnS Nanoribbons by Post-Annealing Treatment," J. Phys. Chem. B 110(13):6759-6762.
"Solution Casting and Transfer Printing Single-Walled Carbon Nanotube Films," Nano Lett. 4(9):1643-1647 (2004).
Substantive Examination Adverse Report, Corresponding to Malaysian Patent App. No. PI 20052553, mailed Mar. 13, 2009 (4 pages, English).
Ramam et al. (1989) "Study of Mesa Undercuts Produced in GaAs with $H_3PO_4$-Based Etchants," J. Electrochem. Soc. 136:2405-2410.
Fan et al. (2009) Letter abstract of "Three Dimensional Nanopillar-Array Photovoltaics on Low Cost and Flexible Substrates," Nature Materials 8:648-653 (2 pages).

(56) References Cited

OTHER PUBLICATIONS

Schreiber et al. (1998) "The Effectiveness of Silane Adhesion Promotors in the Performance of Polyurethane Adhesives," J. Adhesion 68:31-44.
Search Report and Examination Report Corresponding to Singapore Patent Application No. 200901178-4, completed Mar. 13, 2010.
Servati et al. (2005) "Functional Pixel Circuits for Elastic AMOLED displays," Proceedings of the IEEE 93:1257-1264.
Stella Newsletter IV, Stretchable Electronics for Large Area Applications [online: Apr. 29, 2011] www.stella-project.de/Portals/0/Stella_Newsletter_6.pdf (8 pages).
Streetman et al. (2000) "Intrinsic Material," In; Solid State Electronic Devices, 5th Ed., Prentice Hall; Upper Saddle River, NJ; pp. 74-75.
Sun et al. (2007) "Structural Forms of Single Crystal Semiconductor Nanoribbons for High-Performance Stretchable Electronics," J. Mater Chem. 17:832-840.
Supplemental European Search Report dated Apr. 4, 2011 for European Application 07 84 1968, completed Mar. 31, 2011 (6 pages).
Vanfleteren, Sweet: Stretchable and Washable Electronics for Embedding Textiles. Available at tfcg.elis.ugent.be/projects/sweet. Access Feb. 8, 2012 (printout dated Jun. 20, 2012, pp. 1-3 of printout) last page states Page created by Jan Vanfleteren. Latest update: Apr. 6, 2007.
Sze et al. (1985) Semiconductor Devices, Physics and Technology, 2nd ed., Wiley, New York, pp. 190-192.
Demura et al., "Immobilization of Glucose Oxidase with *Bombyx Mori*Silk Fibroin by Only Stretching Treatment and its Application to Glucose Sensor," Biotechnology and Bioengineering, vol. 33, 598-603 (6 pages) (1989).
Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).
Kim et al., "Dissolvable Films of Silk Fibroin for Ultrathin Conformal Bio-Integrated Electronics," Nature, 1-8 (8 pages) (Apr. 18, 2010).
Kim et al., "Materials and Noncoplanar Mesh Designs for Integrated Circuits with Linear Elastic Responses to Extreme Mechanical Deformations," PNAS, vol. 105, No. 48, 18675-18680 (6 pp.) (Dec. 2, 2008).
Kim et al., "Stretchable and Foldable Silicon Integrated Circuits," Science, vol. 320, 507-511 (5 pages) (Apr. 25, 2008).
Ko et al., "A Hemispherical Electronic Eye Camera Based on Compressible Silicon Optoelectronics," Nature, vol. 454, 748-753 (6 pages) (Aug. 7, 2008).
Lawrence et al., "Bioactive Silk Protein Biomaterial Systems for Optical Devices," Biomacromolecules, vol. 9, 1214-1220 (7 pages) (Nov. 4, 2008).
Meitl et al., "Transfer Printing by Kinetic Control of Adhesion to an Elastomeric Stamp," Nature, vol. 5, 33-38 (6 pages) (Jan. 2006).
Omenetto et al., "A New Route for Silk," Nature Photonics, vol. 2, 641-643 (3 pages) (Nov. 2008).
Omenetto et al., "New Opportunities for an Ancient Material," Science, vol. 329, 528-531 (5 pages) (Jul. 30, 2010).
Tsukada et al., "Structural Changes of Silk Fibroin Membranes Induced by Immersion in Methanol Aqueous Solutions," Journal of Polymer Science, vol. 32, 961-968 (8 pages) (1994).
Wang et al., "Controlled Release From Multilayer Silk Biomaterial Coatings to Modulate Vascular Cell Responses" Biomaterials, 29, 894-903 (10 pages) (Nov. 28, 2008).
Supplementary European Search Report for EP 12 793 583.1, Aug. 6, 2015, 2 pages.
European Search Report for EP 12 793 583.1, Aug. 6, 2015, 5 pages.

* cited by examiner

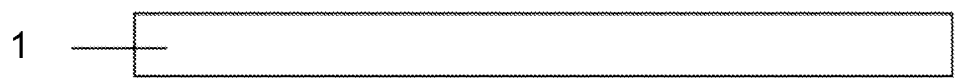
FIG. 1
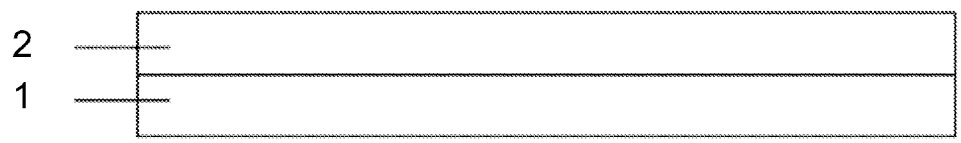
FIG. 2
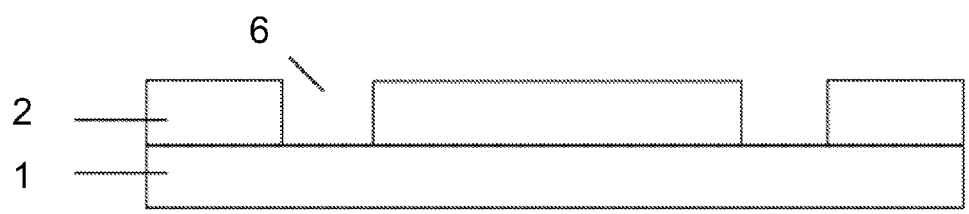
FIG. 3
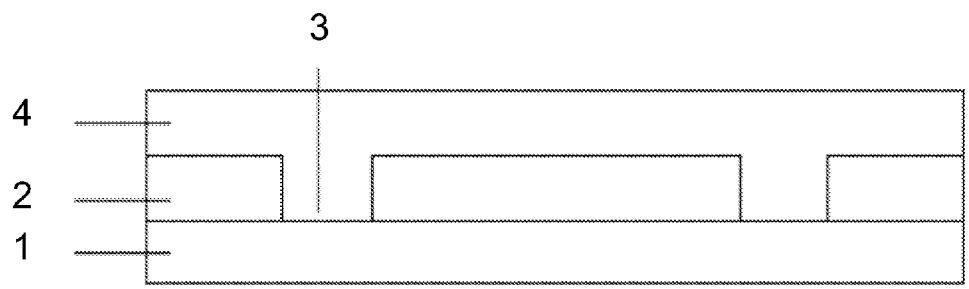
FIG. 4
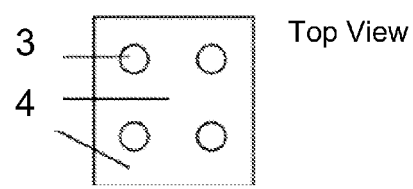

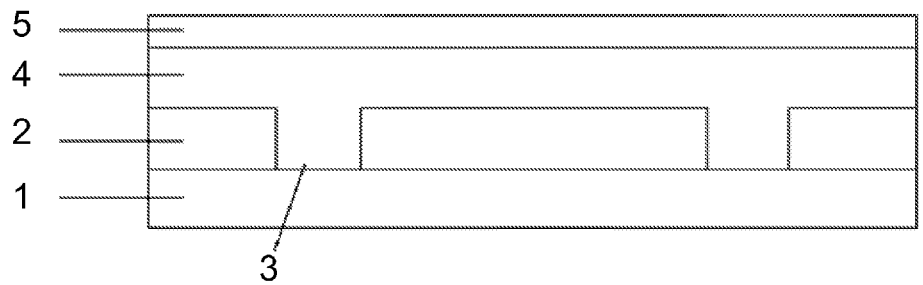
FIG. 5
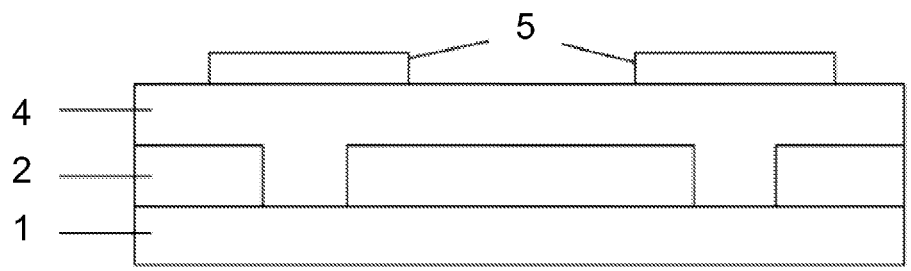
FIG. 6
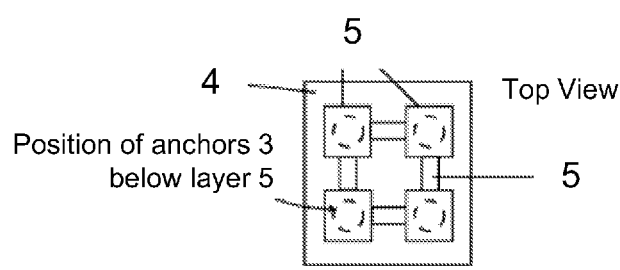
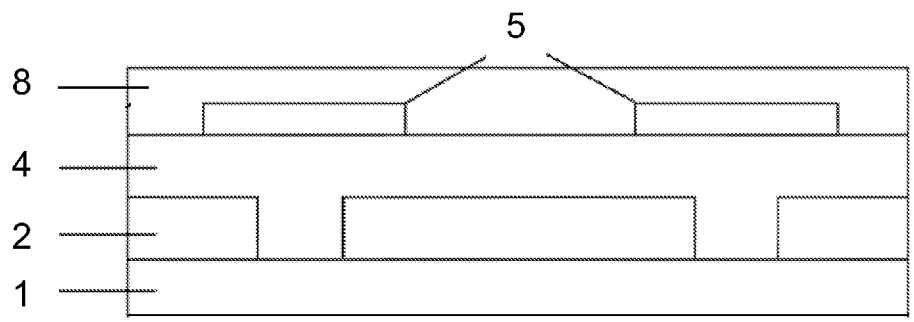
FIG. 7

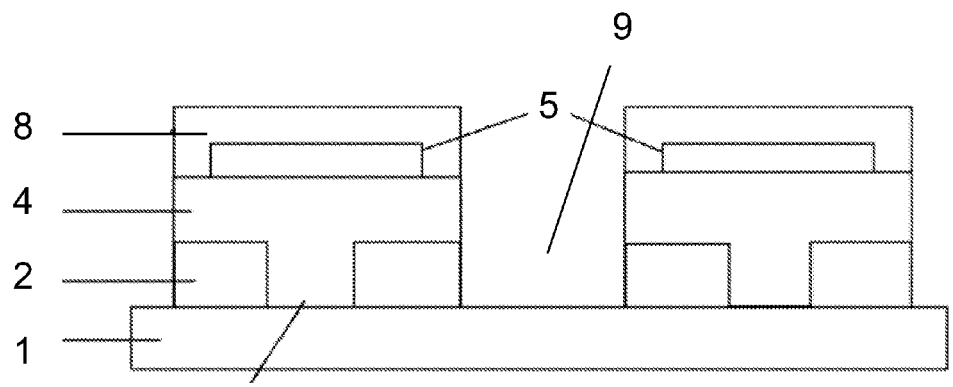
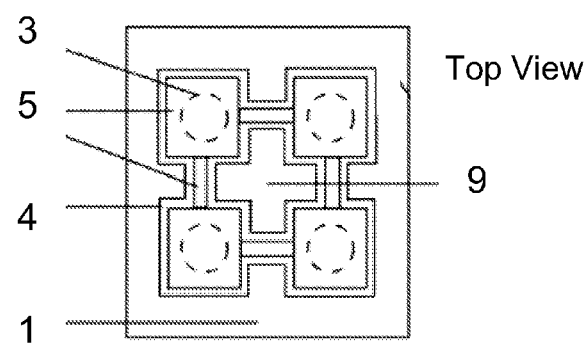
*FIG. 8*
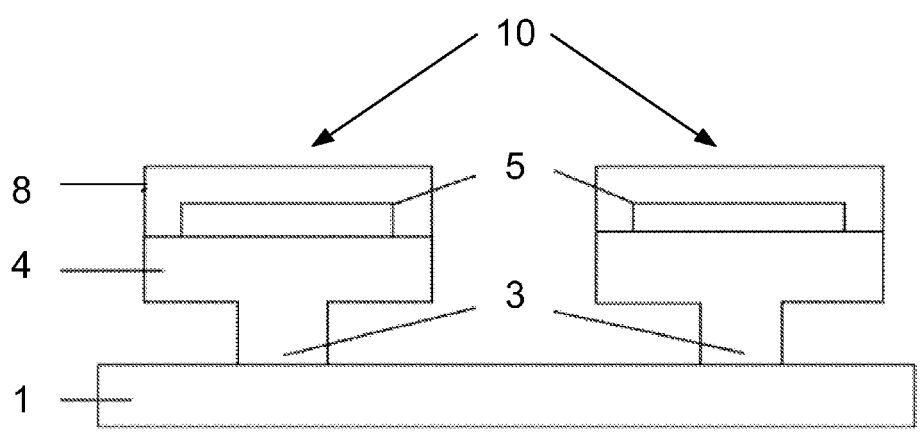
*FIG. 9*

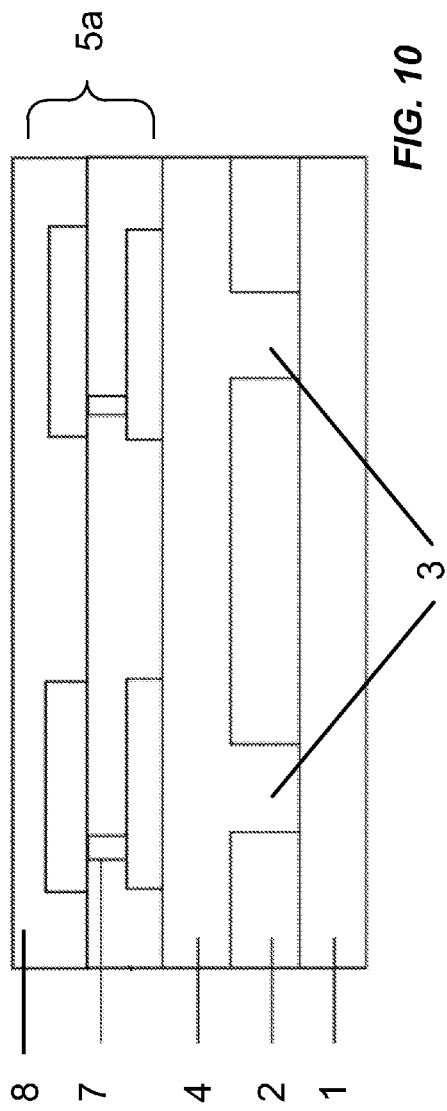
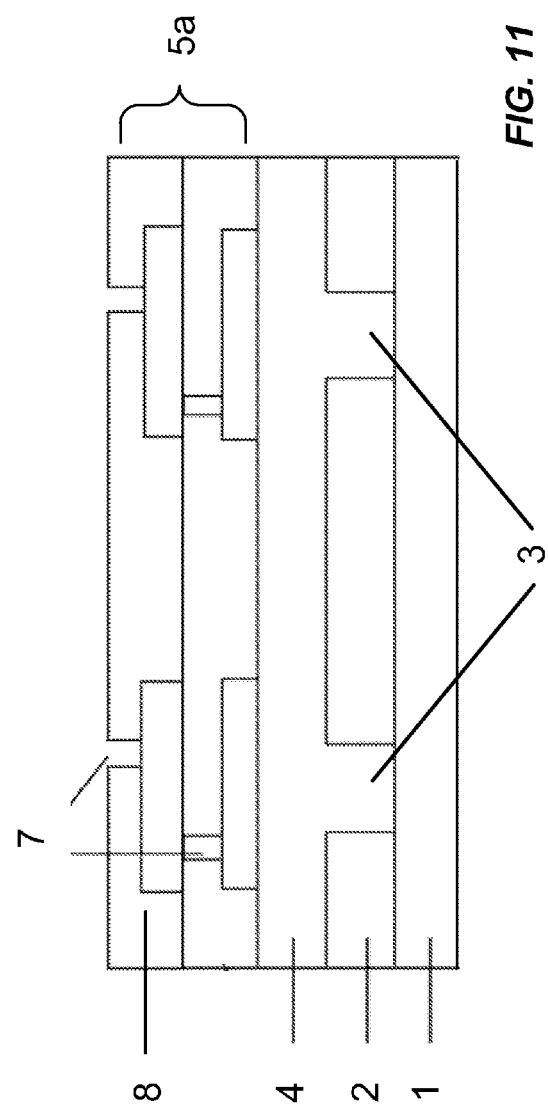

FLEXIBLE ELECTRONIC STRUCTURE

CROSS-REFERENCE TO RELATED APPLICATIONS

This application claims priority to and benefit of U.S. Provisional Application No. 61/490,826, filed on May 27, 2011, entitled "METHODS FOR FABRICATING ELECTRONIC, OPTICAL AND/OR MECHANICAL APPARATUS AND SYSTEMS," which provisional application is incorporated herein by reference in its entirety, including drawings.

BACKGROUND

Flexible electronics are expected to revolutionize the next generation of devices. Due to the high degree of flexibility of flexible electronics, they can be integrated into many different shapes. This flexibility and diverse integration options can provide for a large number of useful device configurations that would not be possible with the more rigid electronics that are fabricated based on silicon. Applications envisioned for flexible electronics include thin, flexible mobile devices, bendable and conformable displays, rollable and foldable flexible displays, and paper-like displays. Additionally, new forms of flexible electronic enable significant strain or stretch.

Some portions of such flexible electronics may be fabricated in solution. In addition, flexible substrates may be used in the fabrication of the flexible electronics. The flexible substrates enable fabrication by high speed printing techniques capable of generating electronic devices over large substrate at low cost. The flexible electronics also may be fabricated using independent fabricated components followed by assembly onto a single device substrate.

Fabricating flexible electronics that exhibit good electronic performance can be challenging. For example, fabrication techniques developed for the semiconductor fabrication industry are incompatible with some flexible materials. The temperatures used to generate high quality inorganic semiconductor components (for example, temperatures greater than 1000 degrees Celsius) are incompatible with many polymers, plastics and elastomeric materials. In addition, inorganic semiconductors are poorly soluble in the types of solvents that facilitate formation of the flexible electronics. While amorphous forms of silicon are fabricated using lower temperatures, it may not be compatible with the flexible electronic structure. Organic or hybrid organic-inorganic semiconductors can be processed at relatively low temperatures; however these materials do not form electronic structures with the performance capability needed for the next generation of flexible, foldable and bendable products.

Flexible electronics may be formed through incorporating inorganic semiconductor components into a polymer-based matrix. The flexible electronics can be fabricated on a rigid substrate or a flexible substrate. At one or more stages in the fabrication process, the flexible electronics is subjected to processing in solvents that are incompatible with the inorganic components. Therefore, polymer encapsulation of the inorganic device components has been suggested.

A challenge to large-scale production of the flexible electronics is the difficulty with separating the fabricated flexible electronics from the substrate on which the flexible electronics are fabricated. Mechanical removal may damage the flexible electronics by introducing stresses in the structure. Many chemical-based methods of separating the fabricated flexible electronics from the support substrate can cause damage to the flexible electronics.

SUMMARY

In view of the foregoing, the Inventors have recognized and appreciated various significant improvements to fabrication processes for flexible electronics that facilitate higher yield and generally improve the integrity of electronics devices resulting from the fabrication process. One example of such an improvement involves a "sacrificial release layer" disposed on a substrate on which some portion of the flexible electronics are fabricated. In particular, the Inventors have recognized and appreciated that, when fabricating electronic, optical, or mechanical systems, it is desirable to construct the system over a substrate that has a sacrificial release layer disposed on its surface. In one exemplary implementation illustrating the inventive concepts disclosed herein, such an electronic, optical and/or mechanical system is built (i.e., fabricated) on top of the sacrificial release layer, and the sacrificial release layer is then selectively removed (by etching) so that the system is either free-standing, floating or sufficiently de-adhered from the substrate, such that it can be separated from the substrate.

Fabrication processes according to various embodiments of the present invention involving such a sacrificial release layer may be used in the fabrication of stretchable electronic systems. The deformable electronics can be manufactured in a highly planar format, after which the deformable electronics may be separated from the original support substrate via removal of a sacrificial release layer (e.g., by an etch process). In some instances, the removal process involving the sacrificial release layer may be difficult to control and may lead to loss of the deformable electronics upon separation from the original support substrate (e.g., the deformable electronics may float away in an etchant and become twisted, tangled or broken as a result).

To mitigate the foregoing problems that may arise in some fabrication processes involving a sacrificial release layer, various embodiments of the invention disclosed herein relate generally to fabrication methods in which a loss of deformable electronics arising from separation of the deformable electronics from their original support substrate (e.g., by over etching) is significantly reduced or substantially prevented. In some embodiments, systems and devices fabricated using these inventive processes are also provided.

For example, according to one embodiment of an inventive fabrication process for deformable electronics involving a sacrificial release layer, a plurality of anchors is formed between an encapsulated electronic device array and a substrate. In one aspect, the anchors serve to adhere the encapsulated electronic device array to the substrate, and keep the encapsulated electronic device array substantially attached to the substrate when the sacrificial layer is removed. In another aspect, the encapsulated electronic device array can be separated from the substrate when a force is applied. In one example implementation, the force is applied using an elastomeric transfer stamp, as disclosed in U.S. Publication No. 20090199960 entitled "Pattern Transfer Printing by Kinetic Control of Adhesion to an Elastomeric Stamp" filed Jun. 9, 2006, which publication is hereby incorporated herein by reference it is entirety.

An example method for fabricating the flexible electronic structures can include applying a first layer to a portion of a substrate, removing selected portions of the first layer to provide a plurality of vias such that a portion of the vias extend substantially to a surface of the substrate, and disposing a second polymer layer, such that portions of the second polymer layer conform to a dimension of at least one of the plurality of vias and forms a plurality of anchors that contact at least a portion of the substrate. The second polymer layer is more resistant to a selective etchant than the first layer. The example method can further include disposing at least one electronic device layer above a portion of the first layer and/or the second polymer layer, forming at least one trench through the second polymer layer and the at least one electronic device layer to expose at least a portion of the first layer, exposing at least a portion of the first layer to the selective etchant through the at least one trench, and removing, by the selective etchant, portions of the first layer, thereby providing the flexible electronic structure. At least one anchor of the plurality of anchors can remains in contact with at least a portion of the substrate.

In an example, a method for fabricating the flexible electronic structure can further include applying a third polymer layer to at least a portion of the at least one electronic device layer; and forming the at least one trench through the third polymer layer, the second polymer layer, and the at least one electronic device layer to expose at least a portion of the first layer.

In an example, the first layer can include polymethylmethacrylate, silicon dioxide, chromium, or titanium. In an example, the second polymer layer can include polyimide, polyethylene naphthalate, polybenzobisoxazole, benzocyclobutene, siloxane, or a liquid crystal polymer.

In an example, an average width of each of the plurality of vias can be in a range from about 10 µm to about 50 µm. In another example, an average width of each of the plurality of vias is in a range from about 0.1 µm to about 1000 µm.

In an example, respective ones of the plurality of vias can be spaced apart by an average separation ranging from about 50 µm to about 1,000 µm. In another example, respective ones of the plurality of vias are spaced apart by an average separation ranging from about 0.2 to about 10,000 µm. In yet another example, respective ones of the plurality of vias are spaced apart by an average separation ranging from about 200 to about 800 µm.

In an example, a method for fabricating the flexible electronic structures can include applying a first layer to a portion of a substrate, removing selected portions of the first layer to provide a plurality of vias such that a portion of the vias extend substantially to a surface of the substrate, and disposing a second polymer layer, such that portions of the second polymer layer conform to a dimension of at least one of the plurality of vias and forms a plurality of anchors that contact at least a portion of the substrate. The second polymer layer is more resistant to a selective etchant than the first layer. The example method can further include disposing at least one electronic device layer above a portion of the first layer and/or the second polymer layer, forming at least one trench through the second polymer layer and the at least one electronic device layer to expose at least a portion of the first layer, exposing at least a portion of the first layer to the selective etchant through the at least one trench, and removing, by the selective etchant, portions of the first layer, thereby providing the flexible electronic structure. At least one anchor of the plurality of anchors can remain in contact with at least a portion of the substrate. The example method can further include separating the flexible electronic structure from the substrate.

A flexible electronic structure fabricated according to one embodiment of an inventive fabrication process can include a second polymer layer having a first surface and a second surface, where the first surface includes a plurality of anchors, and at least one electronic device layer disposed above the second surface of the second polymer layer.

In another example, the flexible electronic structure can include a base polymer layer having a first surface and a second surface, where the first surface includes a plurality of anchors, and at least one electronic device layer disposed above a portion of the second surface of the base polymer.

In another example, the flexible electronic structure can include a base polymer layer having a first surface and a second surface, where the first surface includes a plurality of anchors, at least one electronic device layer disposed above a portion of the second surface of the base polymer, and a top polymer layer that is disposed above at least a portion of the at least one electronic device layer.

In another example, the flexible electronic structure can include a base polymer layer having a first surface and a second surface, where the first surface includes a plurality of anchors, and wherein at least one of the plurality of anchors contacts a substrate, and at least one electronic device layer disposed above a portion of the second surface of the base polymer.

In another example, the flexible electronic structure can include a base polymer layer having a first surface and a second surface, where the first surface includes a plurality of anchors, and wherein at least one of the plurality of anchors contacts a substrate, at least one electronic device layer disposed above a portion of the second surface of the base polymer, and a top polymer layer that is disposed above at least a portion of the at least one electronic device layer.

In another example, a flexible electronic structure disposed on a substrate is provided. The flexible electronic structure can include a first layer disposed on a portion of the substrate and a second polymer layer having a first surface and a second surface. The first surface can include a plurality of anchors. The plurality of anchors can extend through selected portions of the first layer and contact at least a portion of the substrate. The flexible electronic structure can further include at least one electronic device layer disposed above the second surface of the second polymer layer.

In another example, a flexible electronic structure disposed on a substrate can include a first layer disposed on a portion of the substrate, a second polymer layer having a first surface and a second surface, at least one electronic device layer disposed above the second surface of the second polymer layer, and a third polymer layer disposed above at least a portion of the at least one electronic device layer. The first surface of the second layer can include a plurality of anchors. The plurality of anchors extends through selected portions of the first layer and contact at least a portion of the substrate.

A flexible electronic structure disposed on a substrate and fabricated according to one embodiment of an inventive fabrication process herein can include a first layer disposed on a portion of the substrate, a second polymer layer having a first surface and a second surface, and at least one electronic device layer disposed above the second surface of the second polymer layer. The first surface of the second polymer can include a plurality of anchors, and the plurality of anchors can extend through selected portions of the first layer and contact at least a portion of the substrate. The plurality of anchors can have a diameter of about 50 µm and have a pitch ranging from about 200 µm to about 800 µm.

A flexible electronic structure fabricated according to one embodiment of an inventive fabrication process herein can include a base polymer layer having a first surface and a second surface and at least one electronic device layer disposed above the second surface of the base polymer layer. The first surface can include a plurality of anchors that have a diameter of about 50 μm and have a pitch ranging from about 200 μm to about 800 μm.

Any other applicable technique may be employed to fabricate a device according to the principles described herein. As non-limiting examples, the following patent publications (which are hereby incorporated herein by reference in their entireties, including drawings) describe applicable techniques that can be used, all or in part, in tandem with various inventive concepts disclosed herein, for device fabrication according to various embodiments of the present invention:

U.S. publication no. 2006 0038182-A1, published Feb. 23, 2006, filed Jun. 2, 2005, and entitled "STRETCHABLE SEMICONDUCTOR ELEMENTS AND STRETCHABLE ELECTRICAL CIRCUITS;"

U.S. publication no. 2008 0157234-A1, published Jul. 3, 2008, filed Sep. 6, 2006, and entitled "CONTROLLED BUCKLING STRUCTURES IN SEMICONDUCTOR INTERCONNECTS AND NANOMEMBRANES FOR STRETCHABLE ELECTRONICS;"

U.S. publication no. 2010 0002402-A1, published Jan. 7, 2010, filed Mar. 5, 2009, and entitled "STRETCHABLE AND FOLDABLE ELECTRONIC DEVICES;"

U.S. publication no. 2010 0087782-A1, published Apr. 8, 2010, filed Oct. 7, 2009, and entitled "CATHETER BALLOON HAVING STRETCHABLE INTEGRATED CIRCUITRY AND SENSOR ARRAY;"

U.S. publication no. 2010 0116526-A1, published May 13, 2010, filed Nov. 12, 2009, and entitled "EXTREMELY STRETCHABLE ELECTRONICS;"

U.S. publication no. 2010 0178722-A1, published Jul. 15, 2010, filed Jan. 12, 2010, and entitled "METHODS AND APPLICATIONS OF NON-PLANAR IMAGING ARRAYS;"

U.S. publication no. 2010 027119-A1, published Oct. 28, 2010, filed Nov. 24, 2009, and entitled "SYSTEMS, DEVICES, AND METHODS UTILIZING STRETCHABLE ELECTRONICS TO MEASURE TIRE OR ROAD SURFACE CONDITIONS;"

U.S. publication no. 2010-0298895, published Nov. 25, 2010, filed Dec. 11, 2009, and entitled "SYSTEMS, METHODS AND DEVICES USING STRETCHABLE OR FLEXIBLE ELECTRONICS FOR MEDICAL APPLICATIONS;" and PCT publication no. WO 2010/102310, published Sep. 10, 2010, filed Mar. 12, 2010, and entitled "SYSTEMS, METHODS, AND DEVICES HAVING STRETCHABLE INTEGRATED CIRCUITRY FOR SENSING AND DELIVERING THERAPY."

It should be appreciated that all combinations of the foregoing concepts and additional concepts described in greater detail below (provided such concepts are not mutually inconsistent) are contemplated as being part of the inventive subject matter described herein. All combinations of claimed subject matter appearing at the end of this disclosure are contemplated as being part of the inventive subject matter described herein. It should also be appreciated that terminology explicitly employed herein that also may appear in any disclosure incorporated by reference should be accorded a meaning most consistent with the particular concepts described herein.

BRIEF DESCRIPTION OF THE DRAWINGS

The skilled artisan will understand that the figures, described herein, are for illustration purposes only, and that the drawings are not intended to limit the scope of the described teachings in any way. In some instances, various aspects or features may be shown exaggerated or enlarged to facilitate an understanding of the inventive concepts described herein (the drawings are not necessarily to scale, emphasis instead being placed upon illustrating the principles of the teachings). In the drawings, like reference characters generally refer to like features, functionally similar and/or structurally similar elements throughout the various figures.

FIG. 1 shows a cross-sectional view of an example substrate used in an example method for manufacturing an electronic structure.

FIG. 2 shows a cross-sectional view of an example structure formed in an example process for manufacturing an electronic structure.

FIG. 3 shows a cross-sectional view of another example structure formed in an example process for manufacturing an electronic structure.

FIG. 4 shows cross-sectional and top views of another example structure formed in an example process for manufacturing an electronic structure.

FIG. 5 shows a cross-sectional view of another example structure formed in an example process for manufacturing an electronic structure.

FIG. 6 shows cross-sectional and top views of another example structure formed in an example process for manufacturing an electronic structure.

FIG. 7 shows a cross-sectional view of another example structure formed in an example process for manufacturing an electronic structure FIG. 8 shows cross-sectional and top views of another example structure formed in an example process for manufacturing an electronic structure FIG. 9 shows a cross-sectional view of another example structure formed in an example process for manufacturing an electronic structure.

FIG. 10 shows a cross-sectional view of an example electronic structure formed in an example process.

FIG. 11 shows a cross-sectional view of another example electronic structure formed in an example process.

DETAILED DESCRIPTION

Figure 12:
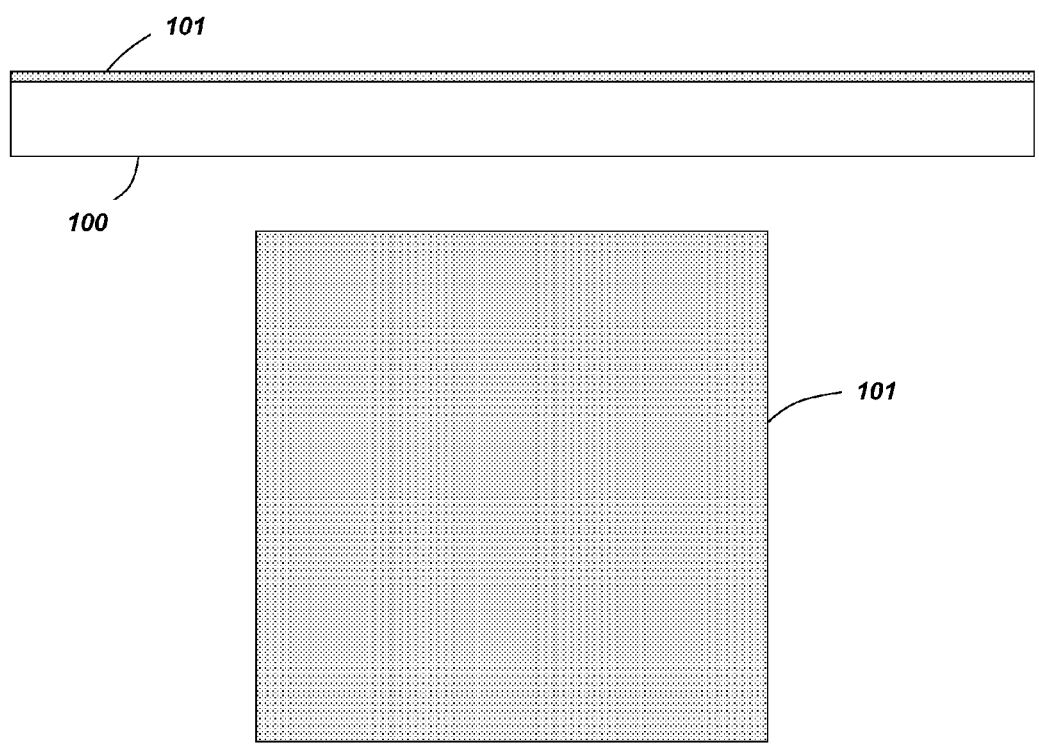
FIG. 12A-12L show cross-sectional views of an example process for manufacturing of an electronic structure.
Figure 12:
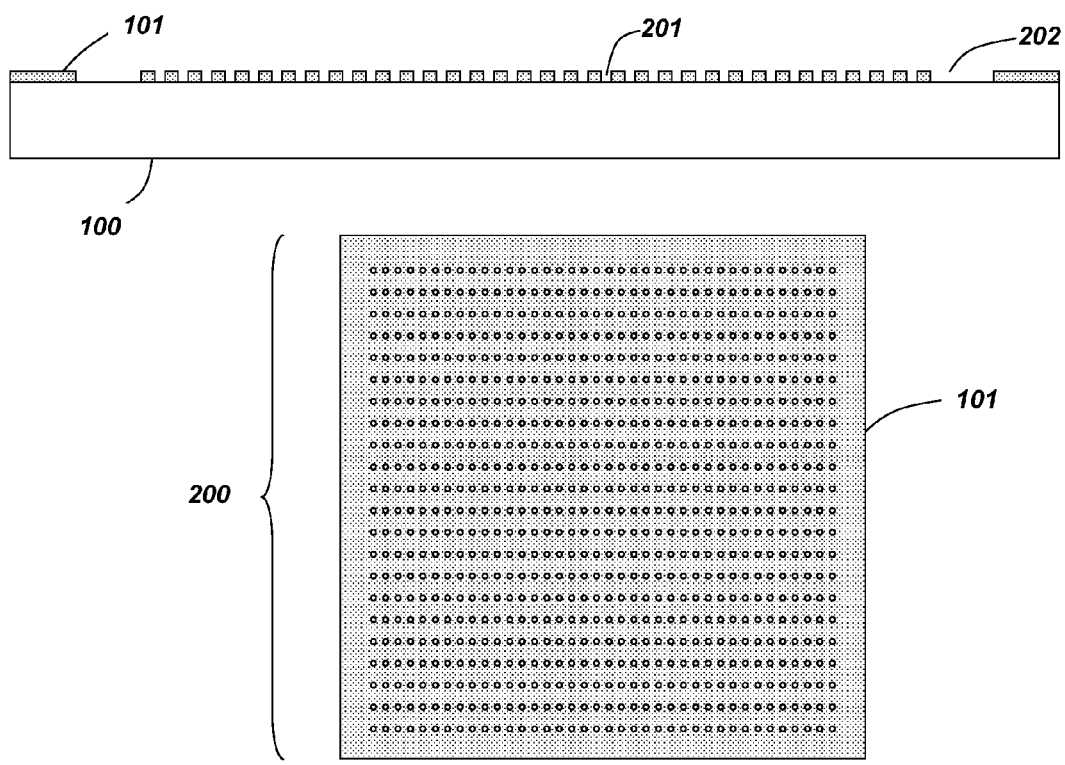
Figure 12:
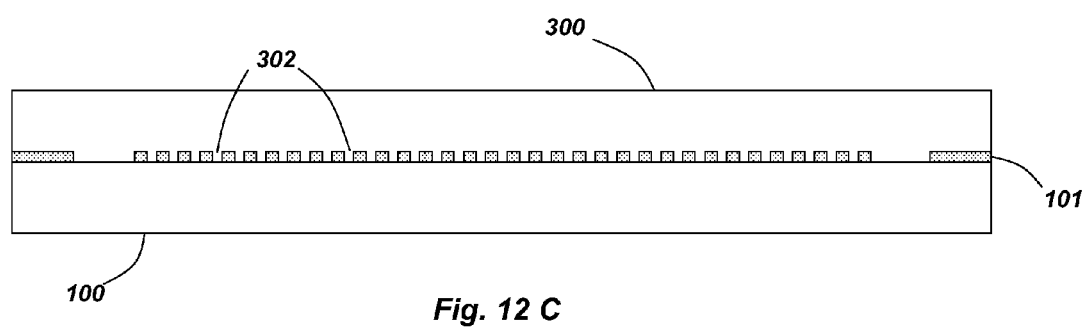
Figure 12:
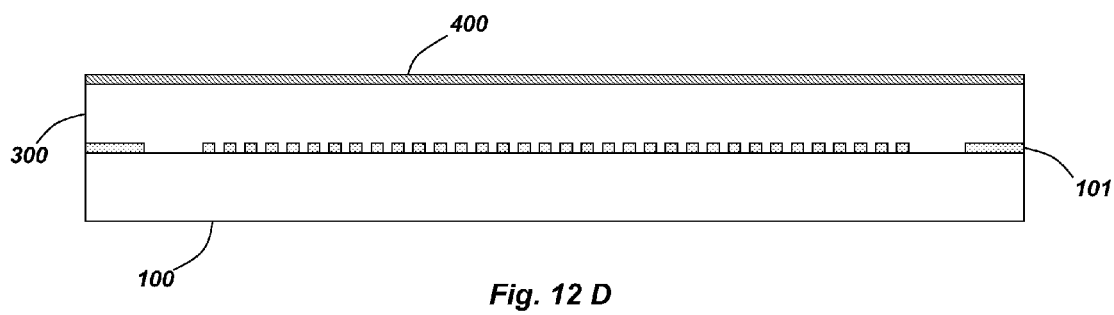
Figure 12:
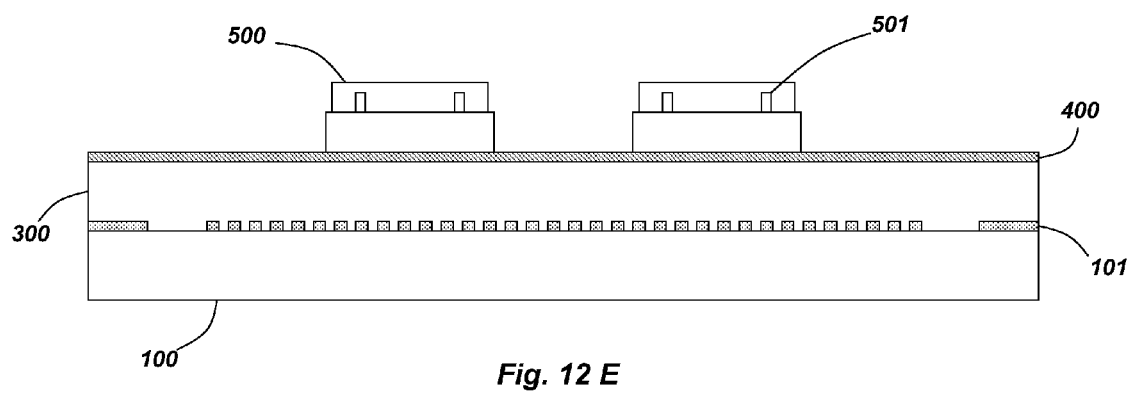
Figure 12:
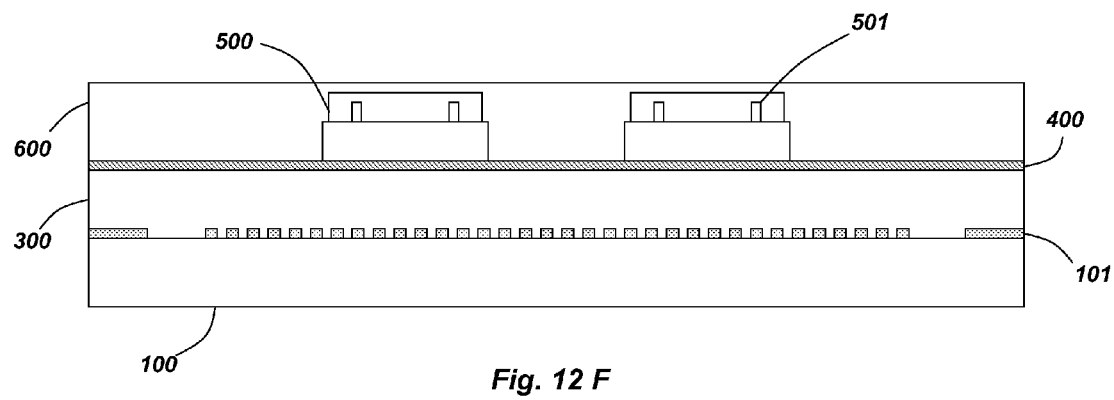
Figure 12:
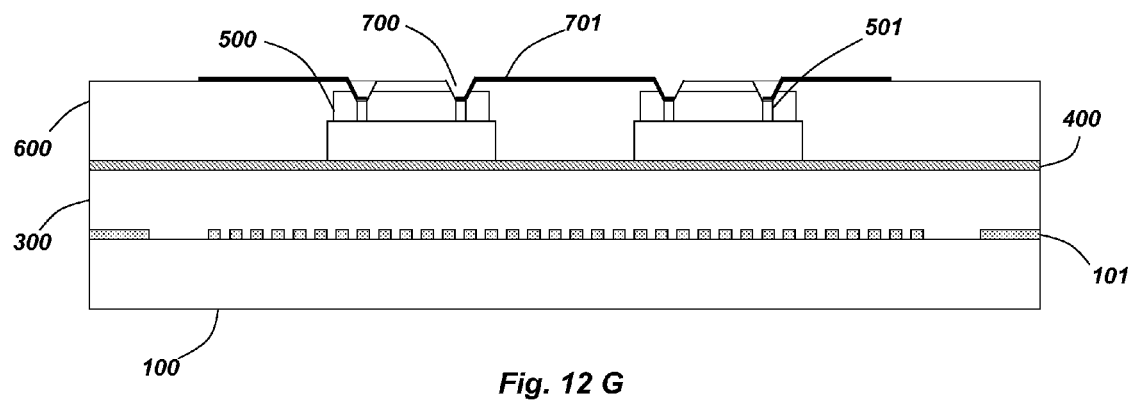
Figure 12:
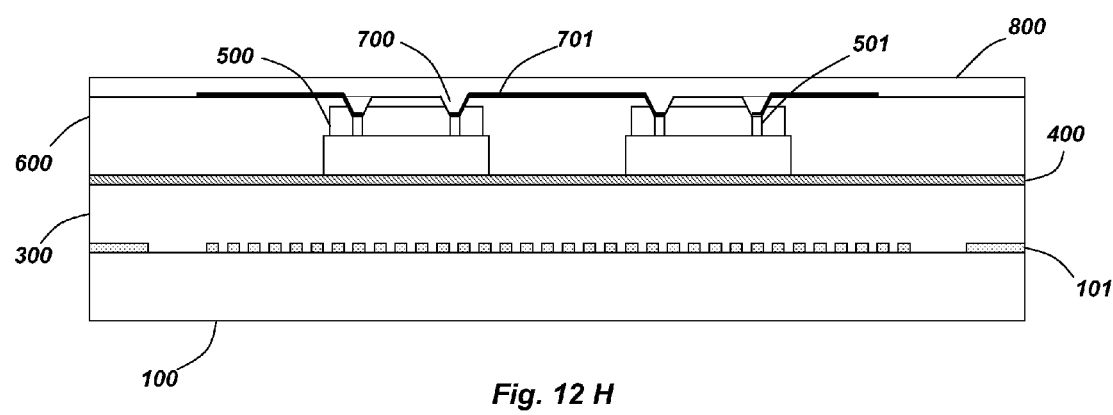
Figure 12:
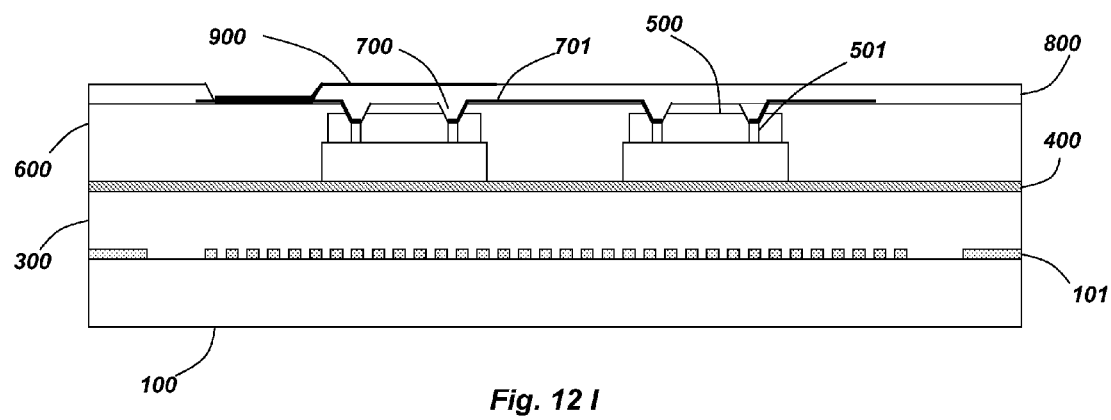
Figure 12:
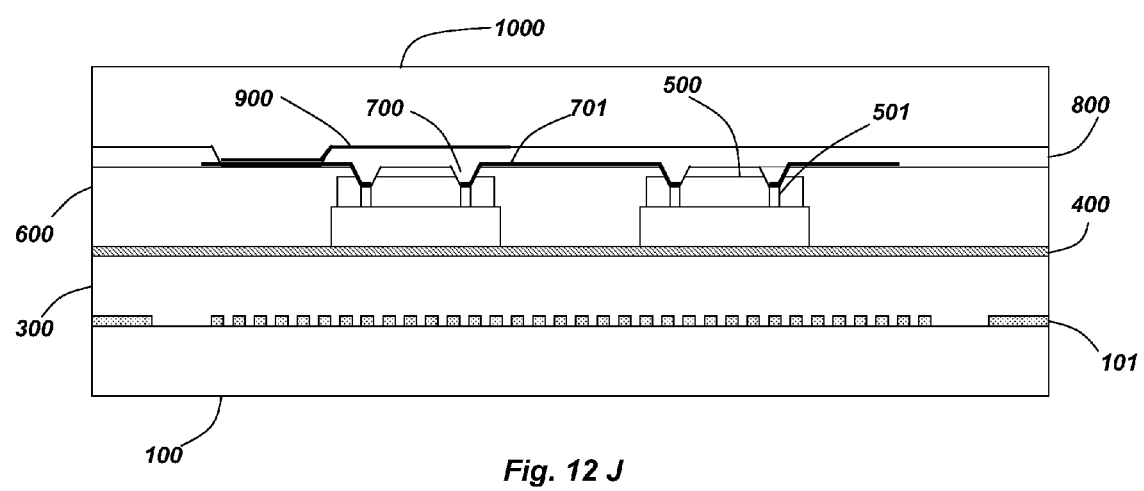
Figure 12:
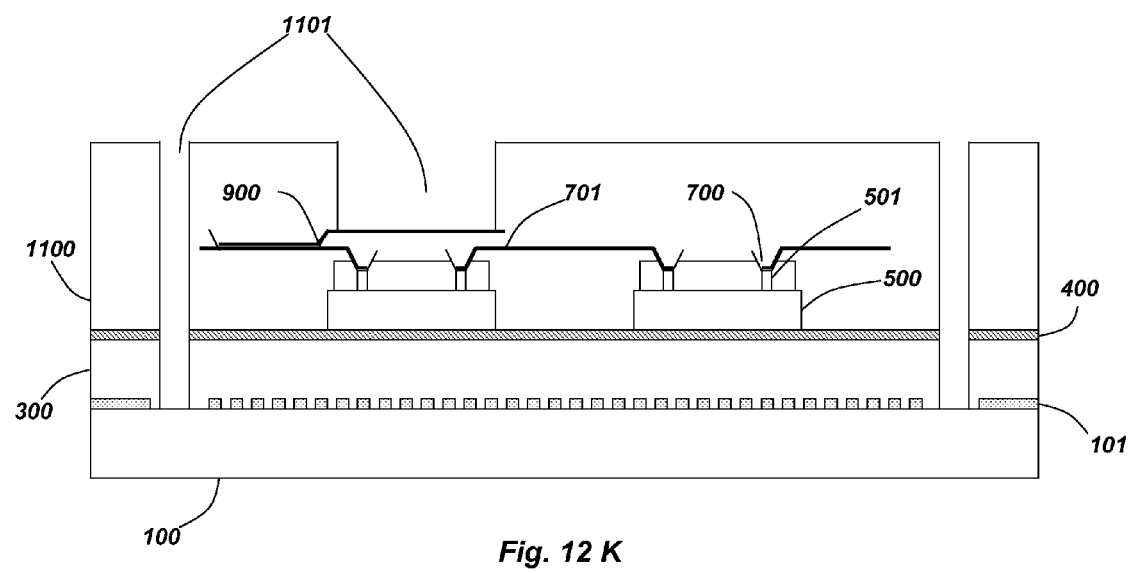
Figure 12:
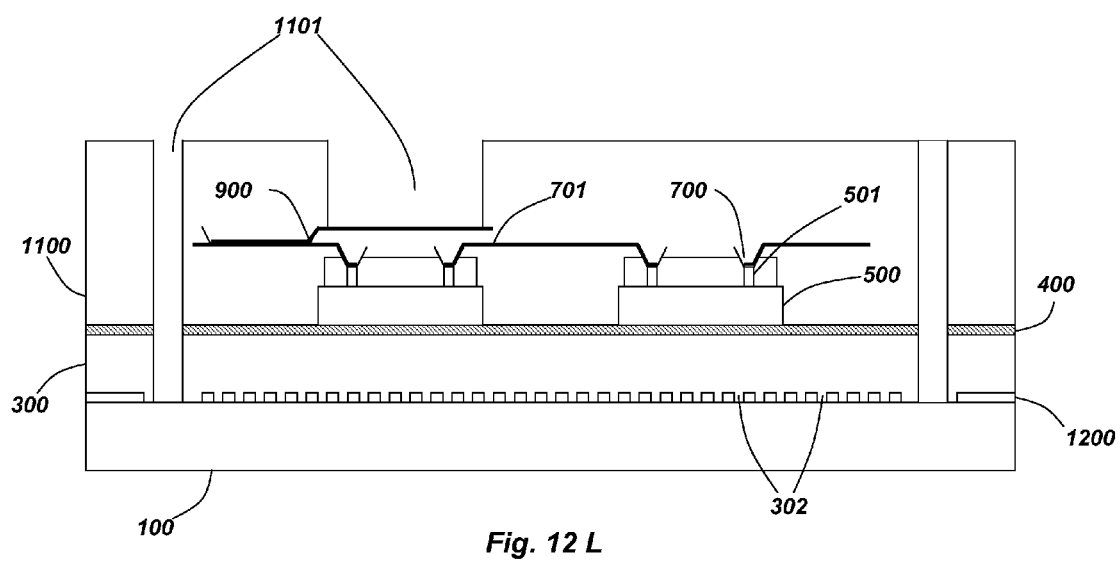

Following below are more detailed descriptions of various concepts related to, and examples of, electronic, optical and/or mechanical apparatus and systems, and methods for fabricating same involving sacrificial release layers and associated anchors. It should be appreciated that various concepts introduced above and described in greater detail below may be implemented in any of numerous ways, as the described concepts are not limited to any particular manner of implementation. Examples of specific implementations and applications are provided primarily for illustrative purposes.

As used herein, the term "includes" means includes but not limited to, the term "including" means including but not limited to. The term "based on" means based at least in part on.

With respect to description herein concerning the surface(s) of a substrate a layer, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom surface of a substrate" does not necessarily require that the indicated surface be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate and each other.

Provided herein are methods for selectively anchoring an array of electronic devices to a supporting substrate. In an example, a method includes providing a sacrificial layer on the supporting substrate, patterning trenches in the sacrificial layer, and providing a first encapsulating layer to support the array of electronic devices whereby the first encapsulating layer comes into contact with the supporting substrate via the trenches. An array of electronic devices is fabricated on the first encapsulating layer. The array of electronic devices are sealed with a second encapsulating layer. The sacrificial layer is removed by immersion in a suitable solvent. The encapsulated electronic devices can remain adhered to the support substrate due to forces of adhesion between the encapsulating layer and the support substrate.

In an example, the electronic structure is a flexible electronic structure.

FIG. 1 shows an example substrate that can be used to fabricate an example electronic structure. FIGS. 2 to 10 show example structures that are formed in the fabrication of the example electronic structure. In FIG. 2, a first layer 2 is applied to the substrate 1. In FIG. 3, selected portions of the first layer 2 are removed to provide a plurality of vias 6 that extend through the first polymer 2 layer substantially to the substrate 1. A second polymer layer 4 is applied to the first layer. As shown in the cross-sectional view of FIG. 4, in an example, portions of the second polymer layer 4 can be caused to conform to a dimension of a number of the vias 6 and to form anchors 3 that contact at least a portion of the substrate 1. In another example, a different polymer material can be caused to conform to a dimension of a number of the vias 6 and form the anchors 3, and the second polymer layer 4 is disposed above the first layer 2 interspersed with the anchors 5. As shown in the top view of FIG. 4, the anchors can be formed in a pattern.

As shown in the cross-sectional view of FIG. 5, at least one electronic device layer 5 is disposed on a portion of the second polymer layer. In a non-limiting example, the electronic device layer 5 may be subjected to further processing steps to fabricate differing types of electronic device components based on the at least one electronic device layer 5. For example, as shown in the cross-sectional view of FIG. 6, portions of the at least one electronic device layer 5 can be removed, e.g., by an etching process, to form electronic device components. As shown in the top view, portions of the at least one electronic device layer 5 may be positioned above the anchors 3. As shown in FIG. 7, a third polymer layer 8 is applied to at least a portion of the at least one electronic device layer 5. The second polymer layer 4 and the third polymer layer 8 are selected so that they are more resistant to a selective etchant than the first layer 2.

In an example, the third polymer layer is the top layer of the electronic structure.

In an example, the thickness of the third polymer layer (or, in an example, the top layer) is configured to cause the location of a resultant neutral mechanical plane of the electronic structure to correspond to strain-sensitive layers of the electronic structure. The neutral mechanical plane is a region of the electronic structure where a strain-sensitive layer can be isolated from stresses and strains applied to the electronic structure, e.g., from bending, rolling, or folding. For example, the thickness of the third polymer layer (or, in an example, the top layer) can be selected such that the at least one electronic device layer is located at or near a neutral mechanical plane of the electronic structure.

At least one trench 9 is formed through the third polymer layer 8 and the second polymer layer 4 to expose at least a portion of the first layer 2 (see cross-sectional view of FIG. 8). In an example, the least one trench 9 can be formed through sections of the structure that does not include portions of the electronic device layer 5. In another example, the at least one trench 9 may be formed through sections of the structure that include portions of the electronic device layer 5. For example, the at least one trench 9 can be formed through portions of the electronic device layer 5 that are not functional or structural components of the electronic device.

The structure of FIG. 8 can be exposed to the selective etchant to provide the structure of FIG. 9. As shown in FIG. 9, portions of the first layer that are exposed to the selective etchant through the trench 9 may be selectively removed by the selective etchant. The anchors 3 remain in contact with the substrate 1 after the etching using the selective etchant. FIG. 9 shows an example of an electronic structure 10 that can be formed according to the methods described herein. The electronic structure 10 can be a flexible electronic structure.

In an example, the flexible electronic structure can include an integrated circuit, a semiconductor, a transistor, a diode, a logic gate, arrays of electronic components, an optical system, a temperature sensors, a pressure sensor, electrical-conductivity sensors, electrodes for pH sensors, chemical sensors, sensors for enzymatic activity, resistors, capacitors, passive devices, light emitting diodes (LEDs), photodiodes (PDs), photodetectors, a battery, a transducer, an emitter, a receiver, or a transceiver.

In another example, the at least one electronic device layer includes at least one of a multifunctional sensor (including a temperature, strain, and/or electrophysiological sensor), a microscale light-emitting diode (LED), an active to passive circuit elements (including a transistor, a diode, a resistor, and/or a memristor), wireless power coils, and devices for radio frequency (RF) communications (including a high-frequency inductor, capacitor, oscillator, and/or antenna). The active elements of the at least one electronic device layer can include electronic materials such as silicon and gallium arsenide in the form of filamentary serpentine nanoribbons and micro- and nano-membranes. In an example, the at least one electronic device layer includes may be configured to provide solar cells and/or wireless coils to serve as a power supply.

The electronic structures herein, which can include interconnects, can exhibit ultrathin layouts, and employ neutral mechanical plane configurations and optimized geometrical designs.

In the example of FIG. 9, the electronic structure 10 is contacted with the substrate 1 via the anchors 3. In another example, the electronic structure 10 is separated from the substrate 1. As described in greater detail below, the electronic structure 10 may be removed using a removable medium.

In an example of the process, the electronic device layer 5 may be formed with multiple layers, including several layers and/or several portions of metal, electronic devices, polymers, semiconductor material, dielectric material, and any other material used for creating electronic devices. For example, as shown in FIGS. 10 and 11, a multiple layered electronic device layer 5a can be fabricated above the second polymer layer 4. The different layers of the electronic device layer 5a can be connected by conduits 7. The conduits 7 may be created using any applicable technique in the art, including an oxygen plasma etch. In an example, the oxygen plasma etch can be an oxygen reactive ion etch. The third polymer layer 8 can be applied to the electronic device layer 5a. For example, the third polymer layer 8 can be applied through spin coating. However, other techniques, including, e.g., spray coating, lamination, casting, or vapor deposition may be used to apply the third polymer layer.

As shown in FIGS. 10 and 11, a conduit 7 also can be formed in the third polymer layer 8. As described in connection with FIGS. 8 and 9, at least one trench can be formed in structures of FIGS. 10 and 11 to expose at least one portion of the first layer, and a selective etchant can be used to remove the remaining portions of the first layer, forming an electronic structure that is in contact with the substrate 1. The electronic structure may be removed using a removable medium.

In an example, the first polymer 2 is a sacrificial release layer. Removal of the sacrificial release facilitates the fabrication of the electronic structure. In an example, the electronic structure 10 is a stretchable electronic system. In the manufacture of a stretchable electronic system, deformable electronics can fabricated initially in a planar format and are released from the original substrate 1 by an etch process. This etch process can be difficult to control and may lead to loss of electronic arrays that may float away in the etchant, and become twisted, tangled or broken as a result. The processes, systems and devices described herein can prevent this loss of devices by preventing over etching. The anchors 3 can be created from portions of the second polymer layer 4 or can be formed from a different polymer material. The second polymer layer 4 can be an electric/electronic array encapsulation. The anchors 3 provide enough adhesion to keep the stretchable electronic system arrays attached to the support substrate 1 when the sacrificial layer is removed. The stretchable electronic system arrays may be readily separated from the support substrate 1 when an external force is applied (as a non-limiting example, a force applied by elastomeric transfer stamp as disclosed in United States Published Patent Application No. 20090199960 entitled "Pattern Transfer Printing by Kinetic Control of Adhesion to an Elastomeric Stamp" filed Jun. 9, 2006, which is incorporated herein by reference it is entirety).

In an example, vias 6 are patterned in the sacrificial layer 2 prior to fabrication of the electronic device layer 5. The vias 6 may begin at the surface of the sacrificial layer and end at the interface with the support substrate 1. The support substrate 1 may be a silicon wafer in an example. A non-limiting example of a suitable material to form a first layer, and in some examples, to serve as a sacrificial layer, is polymethylmethacrylate (PMMA). In another non-limiting example, the first layer is formed from silicon dioxide, chromium, or titanium. A non-limiting example of a suitable material to form a second polymer layer, and in some examples, to serve as an encapsulation layer, is polyimide. In another non-limiting example, the second polymer layer can be formed from polyethylene naphthalate, polybenzobisoxazole, benzocyclobutene, siloxane, or a liquid crystal polymer The Young's modulus of the substrate can be greater than that of the first layer (e.g., PMMA with a Young's modulus of 1800-3100 MPa) and the second polymer layer (e.g., polyimide with a Young's modulus of 2.5 GPa).

The PMMA can be selectively etched in acetone without affecting the polyimide. In a non-limiting example, the vias 6 (shown in FIG. 3) may be etched into the first layer of the PMMA by using an oxygen plasma etch through a stencil hardmask or a photolithographically patterned mask. Other applicable techniques in the art can be used to pattern the PMMA to form the vias 6. For example, direct exposure with a 220-250 nm wavelength laser light source through a mask followed by development (e.g., in a solvent). The vias 6 provide a path for the second polymer layer 4 material, e.g., the encapsulation layer material (including a polyimide) to come in contact with the support substrate 1, creating the anchors 6. The anchors 6 provide the anchoring force to retain the electronic structure substantially in contact with the substrate during the release step. In an example, the second polymer material (the encapsulation material) is spun-on. In another example, the second polymer material (the encapsulation material) may be deposited by spray coating or vapor deposition.

The vias or anchors may be in any two-dimensional geometry. As a non-limiting example, they can be formed as a circular cross-section, which may be easier to fabricate. Any other cross-sectional geometry of the vias or anchors is within the scope of this disclosure, such as but not limited to a hexagonal, oval or rectangular cross-section, or any polygonal or non-polygonal shape. In an example, the diameter of this circular cross-section can be between about 10 μm and about 50 μm. In an example, the width of the vias (or anchors) is selected such that the anchors provide sufficient adhesive force with the substrate to not separate during the etching of the first layer. In an example, the width of the vias (or anchors) also can be selected such that the anchors do not generate an adhesive force that prevents the array of electronics structure from being separated from the substrate, such as but not limited to in a transfer printing step, after the sacrificial release layer is removed. Although the range of the width of the vias or anchors can be between about 10 μm and about 50 μm, smaller diameters and larger diameters can be used. For example, the width of the vias or anchors can be selected based on the adhesive strength between the material of the anchor (such as but not limited to polyimide) and the substrate (such as but not limited to silicon). In an example, the width of the vias or anchors can range from about 0.1 μm to about 1000 μm.

The spacing of the vias or anchors also can be selected based on the intended adhesive strength between the anchors and the substrate. In an example, the number and spacing of vias or anchors can be determined based on the adhesive force to maintain the geometry of the array of electronic structures, and to substantially prevent distorting during the etching to remove the first layer (e.g., a sacrificial release layer). In an example, the number and spacing of vias or anchors is determined such that the total adhesive force of the anchors does not prevent separation of the array of electronic structures from the substrate, e.g., in a later transfer printing after the sacrificial etch. The exact pattern and placement of the vias or anchors can depend on the geometry of the array of electronic structures (including on the geometry of the array of electronic device layer 5). As a non-limiting example, the vias or anchors may be placed along the pattern of interconnected device islands. In an example, the vias or anchors can have a pitch between about 50 μm and about 1000 μm, i.e., they vias or anchors can be spaced apart by an average distance of between about 50 μm and about 1000 μm. In another example, the vias or anchors can be spaced apart by an average distance (a pitch) of between about 0.2 μm and about 10000 μm.

In a non-limiting example, the vias or anchors are cylindrical in shape, have a diameter of about 50 μm, and are spaced apart with spacing (a pitch) ranging from about 200 μm to about 800 μm. These anchors may be positioned along the pattern of interconnected device islands.

When a second polymer layer material is deposited onto the first layer, it can conform to the dimensions of the vias and contact the support substrate to form the anchor 3 (see, for example, FIG. 4). Any number of metal, semiconductor, dielectric, and device layers can be disposed above the second polymer layer of the second polymer layer using any applicable technique in the art. A third polymer layer 8 may be disposed above the electronic device layer 5. For example, the third polymer layer 8 may be an encapsulation layer that protects the electronic device layer 5 during a later etching process or other processing. In an example, the at least one electronic device layer 5 is formed a multiple electronic device layers. Each of the multiple electronic device layers can include electronic devices and electronic device components. One or more of the electronic device layers 5 can be encapsulated in a polymer material. In an example, conduits 7 may be formed, e.g., by etching, and used to create contact pads to the functional portions of at least one of the electronic device layers.

In an example, a mask may be deposited onto the topmost layer of the electronic structure before further processing. In an example, the mask is created using a photolithographic patterning and etching process. In an example, the mask is an oxide layer. The mask can be used to control the further processing. For example, the mask can be used to prevent over-etching of an encapsulant polymer region that is being used to protecting the electronic devices and interconnects of the at least one electronic device layer 5.

In an example, an adhesion-promoting layer can be included between the first layer and the substrate (e.g., when it is used as a sacrificial layer). For example, where the first layer is PMMA, adhesion-promoting layer can be included between the PMMA and the substrate to ensure adequate bonding of the PMMA to the substrate. In an example, the substrate is a Si support substrate. In the absence of an adhesion-promoting layer, the vias patterned into the PMMA may distort. For example, the width of the vias in the PMMA may expand by a factor of about 5 to about 10 when the second polymer layer material is subjected to further processing. The coefficient of thermal expansion of PMMA is higher than polyimide or silicon; therefore it may undergo greater dimensions or volume changes than the polyimide or the silicon with temperature. As a result, portions of the structure may delaminate from the silicon substrate. In a non-limiting example, where the second polymer layer is a polyimide encapsulation layer, and the vias are formed in PMMA, curing the polyimide (e.g., at greater than 140° C., and more typically about 200-250° C.) can cause the change in dimension of the resulting anchors as compared to the original width of the vias. As a result, the anchors may not be formed with the intended dimensions. In a non-limiting example, the adhesion-promoting layer can be formed from hexamethyldisilazane (HMDS).

In an example where the second layer is cured at a higher temperature than the first layer, precautions can be taken to avoid out gassing, which can induce roughness in the encapsulating layer. For example, polyimide, which can be used to form the second polymer layer, cures at 250° C., whereas PMMA (which can be used to form the first layer) may be cured at a lower temperature, e.g., at 180° C. To avoid outgassing of the first layer if a curing is performed on the second polymer layer, the first layer first may be cured at the cure temperature of the second polymer layer to evolve the more volatile components that may evaporate at the higher temperature. As a result, little or no out-gassing can occur from the first layer. There is less disturbance of the second polymer layer, creating an advantageously smoother surface for the deposition and patterning of electronic materials in the at least one electronic device layer 5.

In another example, a slow ramped baking (e.g., about 100° C. per hour) from room temperature to the cure temperature of the second polymer layer (e.g., 250° C. for polyimide) also can improve the uniformity of the second polymer layer.

After any encapsulation, patterning, and isolation steps are complete in the fabrication, the first layer can then be removed using a selective etchant. The selective etchant is selected such that the other polymer materials in the structure are more resistant to the selective etchant than the first layer. As non-limiting examples, the selective etchant can be a solvent, a mixture of solvents, a plasma technique, or any other applicable technique in the art that can be used to selectively remove the first layer. For example, where the first layer is formed from PMMA, hot acetone may be used as the selective etchant to effectively separate the electronic structure from the substrate. In an example where the first layer is a silicon dioxide, the selective etchant can include hydroflouric acid. In an example where the first layer is a chromium, the selective etchant can include cerric ammonium nitrate. In an example where the first layer is a titanium, the selective etchant can include hydroflouric acid or hydrochloric acid. During the process for removing the first layer, the anchors are configured to remain substantially undisturbed and effectively hold the array of electronic structures in place relative to one another and to the substrate.

In an example, the structures can be subjected to a longer process for removing the first layer. For example, the structures may be left in a release bath for a long time the array of electronic structures being separated from the substrate or losing registration with the substrate. This process of preparing flexible electronics structures, which in an example includes stretchable electronics structures, is suited for subsequent transfer printing using any applicable technique in the art.

FIGS. 12A-12L show another non-limiting example process for fabricating an array of electronic structures on a substrate. In FIG. 12A, a first layer 101 is applied to a substrate 100. An example of the first layer can be a PMMA sacrificial layer. The first layer 101 can be patterned using any number of techniques in the art and depending on the type of material in the first layer. The patterning facilitates the selective removal of portions of the first layer to form the vias 201 (shown in FIG. 12B). For an example where the first layer is formed from PMMA, the vias 201 may be formed in the PMMA using an oxygen plasma etch through a stencil hardmask or a photolithographically patterned mask. Other techniques in the art for selectively removing portions of the PMMA, including direct exposure to laser light of wavelength between 220-250 nm through a mask followed by development. In addition, other larger regions of the first layer may be selectively removed, such as feature 202 of FIG. 12B. According to an example, feature 202 is created to allow for test structures, manufacturing structures, piezoelectric structures, and/or lithography alignment marks to be created on the substrate. These features may not be transferred when performing the selective removal of the first layer. The vias 201 can extend substantially from a surface of the first layer to the substrate 100. The second polymer layer can be applied such that it substantially fills a number of the vias 201 and make contact with the substrate 100. As described above, the size (i.e., cross-sectional width) and density (based on the average spacing) of the vias can be varied to derive the desired degree of adhesion of formed anchors to the substrate. As also described above, the degree of adhesion can be selected such that the array of electronic structures maintain contact with the surface during removal of the first layer.

A second polymer layer (e.g., of an encapsulating polymer 300) can be applied to the structure. In an example, the second polymer material is applied to fill a number of the vias 201 and create anchors 302 (shown in FIG. 12C). In an example, the second polymer layer is applied through spin coating. However, other techniques, including, e.g., spray coating, lamination, casting, or vapor deposition may be used to apply the second polymer layer. The second polymer layer can be applied such that it conforms to a dimension of the vias, including filling the width and/or depth of the vias, to forming anchors 302 in contact with the substrate. At least one electronic device layer, including any number of metal, semiconductor, dielectric, and device layers, can be disposed on top of the second polymer layer. The topmost electronic device layer may be protected by a third polymer layer.

The vias 201 or anchors 302 may be in any two-dimensional geometry. For example, as shown in FIG. 12B, the vias 201 may be formed in a two-dimensional grid pattern. Other patterns of arrangement of the vias are applicable. The vias 201 or anchors 302 may be formed with a circular cross-section for easier fabrication, but any other cross-sectional geometry is within the scope of this disclosure. In an example, the diameter of the vias 201 or anchors 302 can be between about 10 μm and about 50 μm. In an example, the width of the vias 201 (or anchors 302) is selected such that the anchors 302 provide sufficient adhesive force with the substrate 100 to not separate during the etching of the first layer. In an example, the width of the vias 201 (or anchors 302) also can be selected such that the anchors 302 do not generate an adhesive force that prevents the array of electronics structures from being separated from the substrate after the sacrificial release layer is removed. The further processing can be, but not limited to, transfer printing step. In an example, the width of the vias 201 (or anchors 302) can be selected based on the adhesive strength between the material of the anchor 302 and the material of the substrate 100. In an example, the width of the vias 201 (or anchors 302) can range from about 0.1 μm to about 1000 μm.

The spacing of the vias 201 (or anchors 302) also can be selected based on the intended adhesive strength between the anchors 302 and the substrate 100. For example, the number and spacing of vias 201 (or anchors 302) can be selected to provide sufficient adhesive force to maintain the geometry of the array of electronic structures, and to substantially prevent distortion during removal of the first layer 101. In another example, the number and spacing of vias 201 (or anchors 302) is determined such that the total adhesive force of the anchors 302 does not impede separation of the array of electronic structures from the substrate 100. The pattern and placement of the vias 201 (or anchors 302) can depend on the geometry of the array of electronic structures. As a non-limiting example, the vias 201 (or anchors 302) may be placed along the pattern of interconnected device islands. In an example, the vias 201 (or anchors 302) may be spaced apart (i.e., have a pitch) by an average distance of between about 50 μm and about 1000 μm. In another example, the vias 201 (or anchors 302) may be spaced apart by an average distance of between about 0.2 μm and about 10000 μm.

In a non-limiting example, the vias 201 (or anchors 302) are cylindrical in shape, have a diameter of about 50 μm, and are spaced apart with spacing ranging from about 200 μm to about 800 μm.

As described above, an adhesion-promoting layer may be applied to ensure adequate bonding of the first layer 101 to the substrate 100. In an example where the first layer 101 is PMMA, the adhesion-promoting layer can be formed from a polymeric material. As a non-limiting example, the adhesion-promoting layer can be formed from hexamethyldisilazane (HMDS).

As described above, where the second polymer layer material 300 has a higher cure temperature than the first layer material 101, the first layer can be cured at the cure temperature of the second polymer layer material prior to application of the second polymer layer.

In an example, as shown in FIG. 12D, an adhesive layer 400 can be applied to prior to disposing the electronic device layer above the first layer and the second polymer layer. The adhesive layer may be formed from a dilute polyimide or a similar polymeric material. The adhesive layer 400 may be applied by a spin-coating or spray coating. Adhesive layer 400 assists in securing components of the at least one electronic device layer. For example, adhesive layer 400 assists in securing components 500. Once components 500 have been positioned on the adhesive layer 400, the structure may be cured to set the placement of the components 500.

In a non-limiting example, the at least one electronic device layer can include a metal, a semiconductor, a dielectric, a micro electro mechanical system (MEMS) component, and any other device component. FIGS. 12E to 12J show cross-sectional views of the structure as different electronic device layers are disposed on the structure. The electronic device layers include device islands 500 (with electronic component 501), interconnects 701, and contacts 900. As illustrated in FIGS. 12F and 12H, layers 600 and 800 of an encapsulant material, e.g., a polymer layer or an oxide layer, may be applied in regions of the electronic device layer prior to disposing another component of the layer. Layers 600 and 800 also may be used to planarize portions of the electronic device layer prior to addition of other components of the electronic device layer.

An oxide or polymer layer, such as layer 600 or layer 800, can be deposited prior to photolithographic patterning and etching, or other processing. The oxide or polymer layer helps to control the etch process and prevents over etching of the encapsulating regions of the electronic device layer, thus protecting the electronic devices and interconnects that are part of the electronic device layer.

As illustrated in FIGS. 12F and 12H, specific portions of the polymer can be removed to allow for fabrication of device interconnects. For example, using an etching technique, such as oxygen plasma etching, electrical vias 700 can be created in polymer layer 800. These electrical vias 700 can be used to expose a bare conductive pad 501 of a component. Once the conductive pads 501 are exposed, the interconnects 701 can be deposited using any applicable technique in the art, including physical vapor deposition, lithography, etching, plating, and direct platting. FIGS. 12H to 12I show the multilevel interconnects that can be created in an electronic device layer by applying additional layers of polymer 800, creating electrical vias 700, and then depositing electrical interconnects 701. The process of applying additional layers of electrical interconnects may be repeated as many times as needed to fully interconnect the components of the at least one electronic device layers.

As shown in FIG. 12 J, an additional layer, polymer layer 1000, may be applied. In this example, polymer layer 1000 can be the third polymer layer. Polymer layer 1000 can serve to encapsulate the at least one electronic device layers.

As shown in FIG. 12 K, trenches 1101 can be created in polymer layer 1000 to provide access to the contact pads and facilitate segmentation. For example, trenches 1101 may be created by lithography and etching, using laser ablation, by mechanical cutting or using pure photopatterning. In another example, trenches 1101 could be created by photodefining one or more layers as the system is additively manufactured. The segmentation process, creating trenches 1101, allows for direct access of the selective etchant to the first layer 101. The etching time to remove the first layer may be greatly reduced by creating multiple access holes (including other trenches) throughout the device.

Once chemical access to the first layer is created, the selective etchant can act to remove remaining portions of the first layer. This results in cavities 1200 being formed beneath the electronic structure and exposing the anchors 302 (see FIG. 12L). The selective etchant removes much of the remaining portions of the first layer without harming the materials exposed in the electronic structure. In an example where the first layer is formed from PMMA, hot acetone can be used as the selective etchant to effectively separate the electronic structure (i.e., the encapsulated devices) from the substrate. During this process, the anchors 302 remain substantially undisturbed and effectively maintain the encapsulated electronic devices in substantially the same position relative to each other and to the substrate.

Transfer printing may be performed using any applicable technique in the art to separate the electronic structure described herein from the substrate after removal of the remaining portions of the first layer. In an example, the transfer printing can be performed using a removable medium, including an elastomeric stamp or cylinder, a selectively adhesive tape, or a tape that can be removed, after transfer, with an oxygen plasma etch, UV light, application of heat, or dissolving in a solvent or mixture of solvents (including water). In an example, regions of the electronic structure where large bulk areas of the polymer layer are in contact with the substrate may not be removed during a transfer process.

In an example, the transfer printing can be performed to transfer the arrays of the electronic structures from one substrate to another, e.g, from a carrier substrate to a final device substrate. For example, the arrays of the electronic structures may be fabricated on a rigid substrate and then transferred using transfer printing to a soft, flexible, and or stretchable substrate (including polydimethylsiloxane (PDMS,), ECOFLEX® (BASF Chemical Company, Florham Park, N.J.), or any other elastomer, rubber, plastic, fabric or polymer material). The transfer process may introduce additional defects (including breakage and incomplete transfer), resulting in low yield. The operation can be sensitive to differences in the adhesive forces between the array-to-stamp interface and the anchor-to-substrate interface. They may be difficult to accurately and consistently control. In addition, transferring the array from the stamp to the second (stretchable) substrate may require that the adhesive forces for the array-to-second substrate contact are greater than the forces at the array-to-stamp contact. The stamp-to-second substrate adhesive forces can be small enough to remove the stamp without damaging the second substrate. Covalent bonding forces may be used between a silicon dioxide layer on the array and an oxygen-terminated surface of the second (stretchable) substrate to obtain a strong bond for device mechanical durability. This process can result in the stamp becoming too strongly bonded to the second (stretchable) substrate, and as a result, removing the stamp can damage the array.

A removable medium can be used to separate the array of electronic structure from the support substrate. The removable medium can present a large adhesion force. For example, the removable medium to array adhesive forces can be greater than the pattern to substrate forces. Therefore, the removable medium can be used to separate the array from the substrate. In addition, where the removable medium is a water-dissolvable medium, it can be dissolved in water. Therefore, the second transfer process (i.e., from removable medium to ECOFLEX® substrate may not depend on any difference in forces whatsoever. In addition, if a strong bond (i.e., oxygen bonding as described above) is used for the second transfer process, the removable medium is removed easily and substantially without residue, using only water regardless of the strength of the removable medium to second substrate bond strength.

In a non-limiting example, the arrays of the electronic structures may be removed from the substrate using a removable medium. In an example, the removable medium may be a selectively adhesive tape, a tape that can be removed by exposure to UV light, with application of heat, using an oxygen plasma etch, or by dissolving in a solvent or mixture of solvents (including water). In an example, the removable medium may be an elastomeric stamp or cylinder. In an example, the removable medium is a water-dissolvable tape.

In an example, the electronic structures are separated from the substrate by applying a removable medium on a portion of the top layer of the electronic structure, and applying a force to the removable medium to separate the anchors of the electronic structure from the substrate. The removable medium can be selected such that its adhesion strength to the top layer of the electronic structure is greater than the adhesion strength of the anchors to the substrate.

Figure 13:
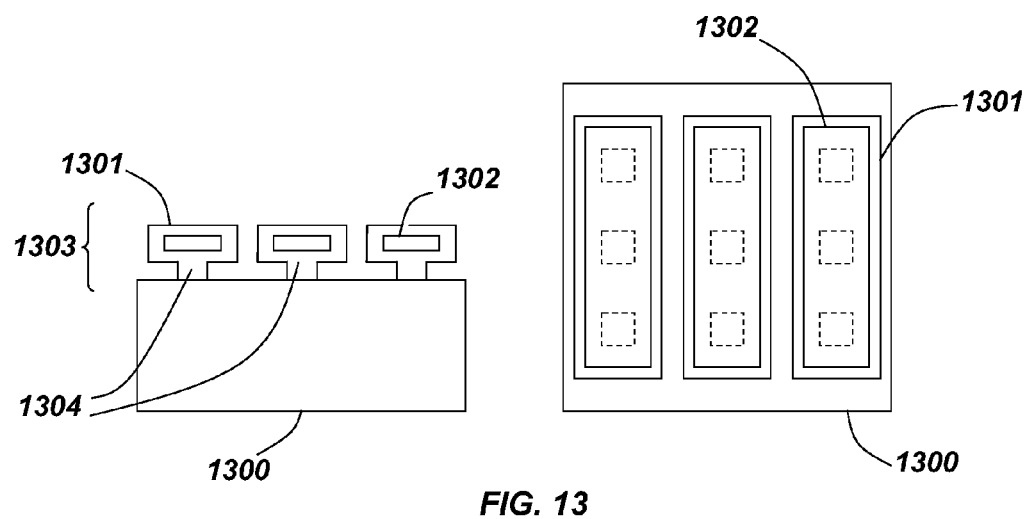
FIG. 13 shows an example substrate with a fabricated array of electronic structures.
Figure 14:
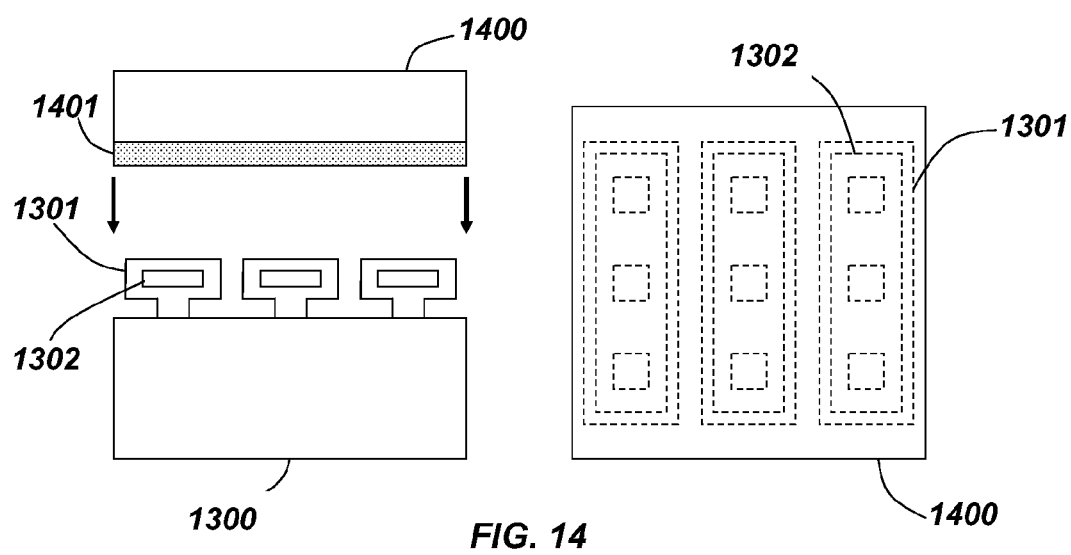
FIG. 14 shows an example of the application of a removable medium to a substrate with a fabricated array of electronic structures.
Figure 15:
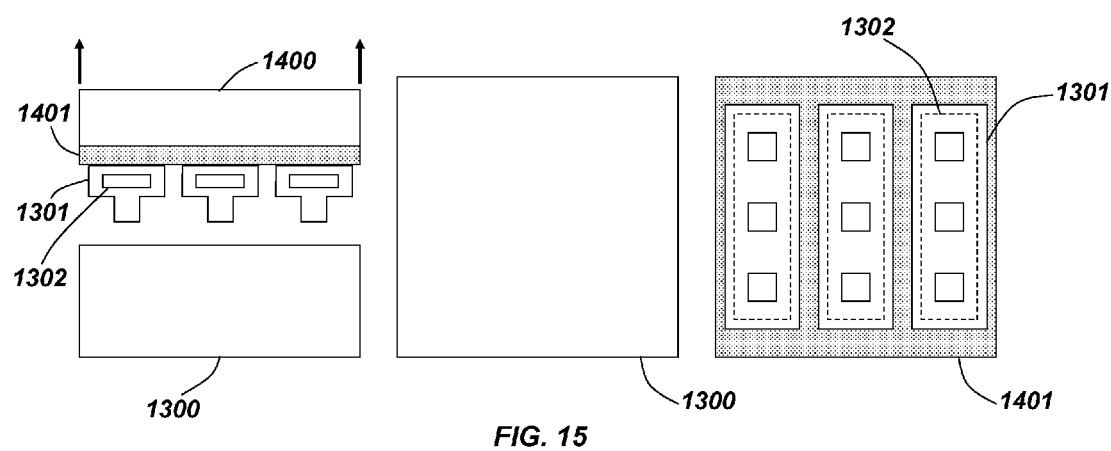
FIG. 15 shows an example of the removal of an array of electronic structures from a substrate using a removable medium.

FIGS. 13-20 show non-limiting examples of the use of a removable medium. FIG. 13 shows an array of electronic structures 1303 that are formed according to a principle herein. Anchors 1304 of an array of the electronic structures 1303 maintains contact with a substrate 1200. The array of the electronic structures 1303 can include electronic device layers 1302 encapsulated in a polymer 1301. In this example, a removable medium 1400 with an adhesive layer 1401 is applied to the arrays of the electronic structures (as shown in FIG. 14). After securing the removable medium 1400 to the array of electronic structures 1400, force is applied to the removable medium to detach the array of electronic structures from the substrate (as shown in FIG. 15).

A removable medium 1400 can be selected based on its adhesion characteristics for a specific layer material. For example, removable medium 1400 can be selected based on its adhesion characteristics such that the removable medium to electronic structure adhesion force is greater than the anchors to substrate force. The arrays of electronic structures 1303 may be removed from the substrate, and remain contacted with the removable medium 1400, without causing defects in the electronic devices of the electronic structure or causing breakage.

Figure 16:
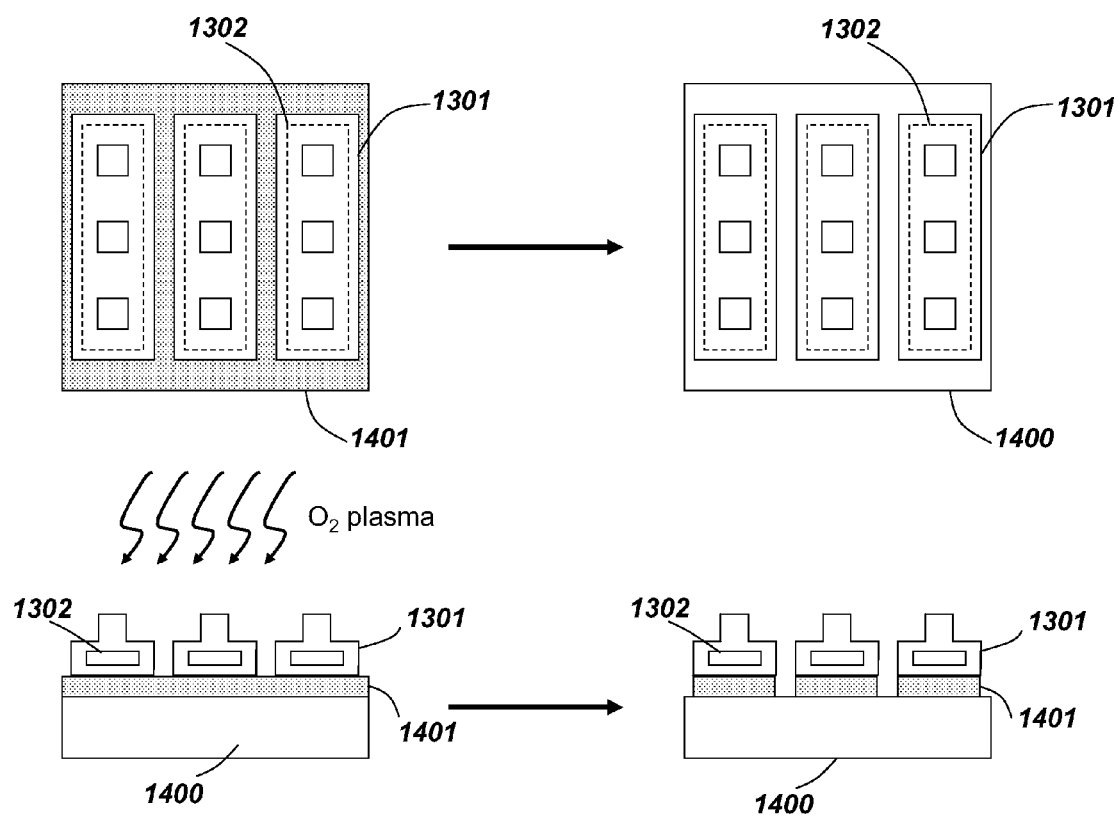
FIG. 16 shows an example of the exposure of a removable medium to an oxygen plasma.

As shown in FIG. 16, the removable medium 1400 and the electronic structures 1303 can be exposed to an oxygen plasma to remove the portions of the adhesive layer 1401 from the areas not covered by the arrays of the electronic structures 1303. In an example, the oxygen plasma can be applied at a 40-sccm oxygen flow rate, with 100-W rf power, and a 30-sec treatment. As shown in the cross-sectional view of FIG. 16, the oxygen plasma removes the portions of the adhesive layer 1401 that are not contacting the electronic structure 1303.

Figure 17:
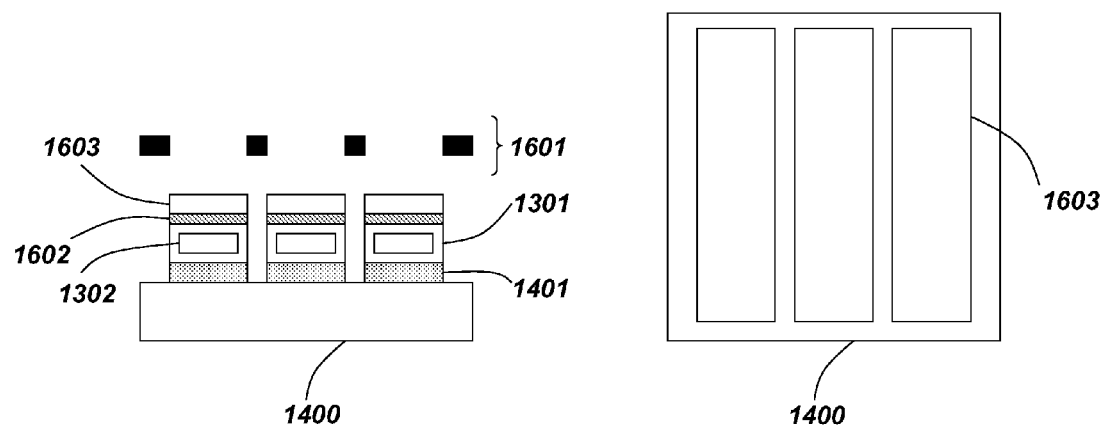
FIG. 17 shows an example of the deposition of a metal followed by an oxide using a shadow mask.

As shown in FIG. 17, a metal layer and/or an oxide layer may be deposited on the electronic structure. In an example, the metal layer is a 3-nm Titanium layer, and the oxide layer is a 30-nm $SiO_2$ layer. The metal layer and/or oxide layer can be evaporated onto the surface of the arrays of the electronic structures 1303 that is away from the removable medium 1400. In an example, a shadow mask 1601 is used to confine the evaporation to solely the arrays of the electronic structures.

Figure 18:
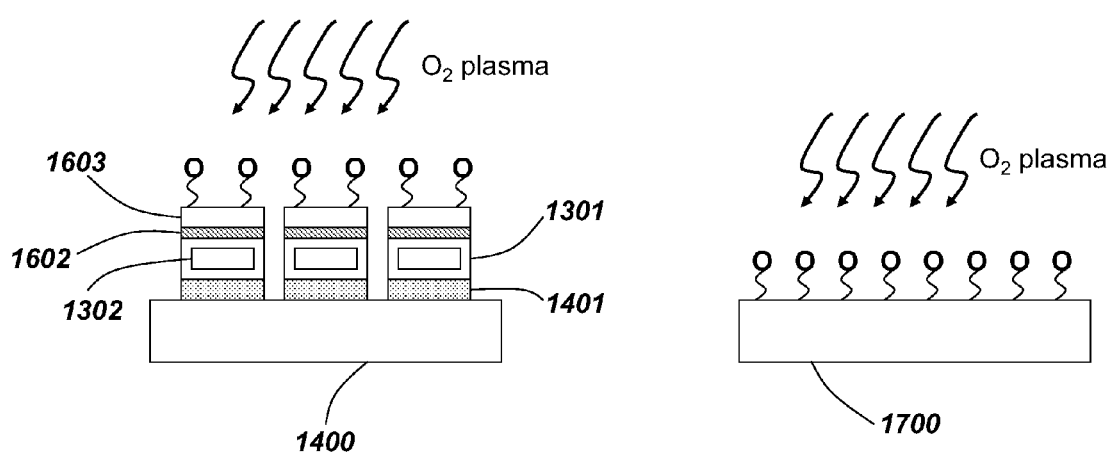
FIG. 18 shows an example process for exposing an array of electronic structures, a medium, and a second substrate to an oxygen plasma.

In FIG. 18, the removable medium 1400, arrays of the electronic structures 1303, and a second substrate 1700 are exposed to an oxygen plasma to create highly oxygen-terminated surfaces. In an example, the oxygen plasma is applied at a 40-sccm oxygen flow rate, and using 100-W rf power, for a 30-sec treatment. In some examples, the second substrate 1700 may be a flexible material or a stretchable material. For example, the second substrate 1700 can be a polymer, including but not limited to ECOFLEX®.

Figure 19:
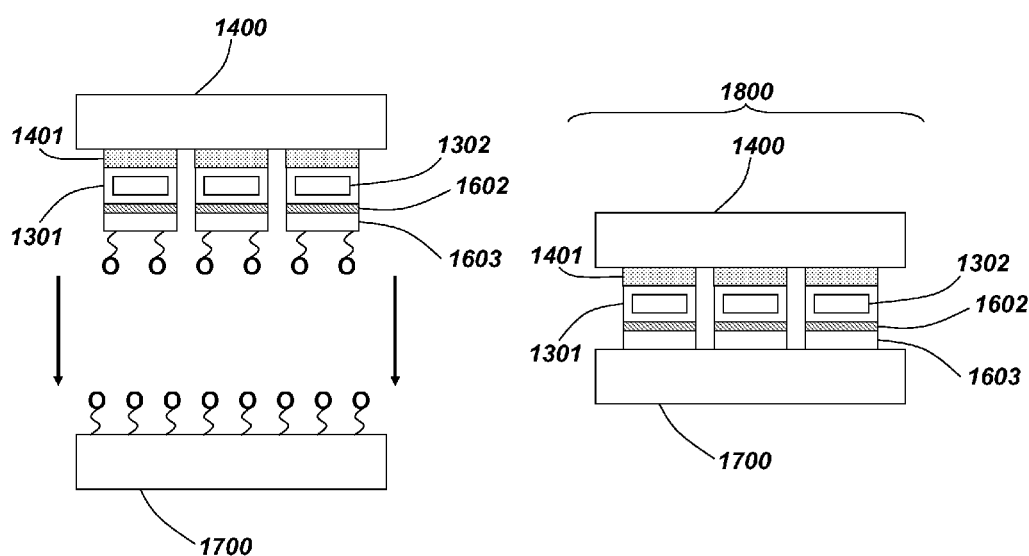
FIG. 19 shows an example application of a removable medium and an array of electronic structures to a second substrate.

In FIG. 19, the highly oxygen-terminated surface of the second surface is contacted with the highly oxygen-terminated surface of the electronic structure, to provide a component 1800. In an example, a pressure is applied to ensure contact between second substrate 1700 and the electronic structures 1303.

Figure 20:
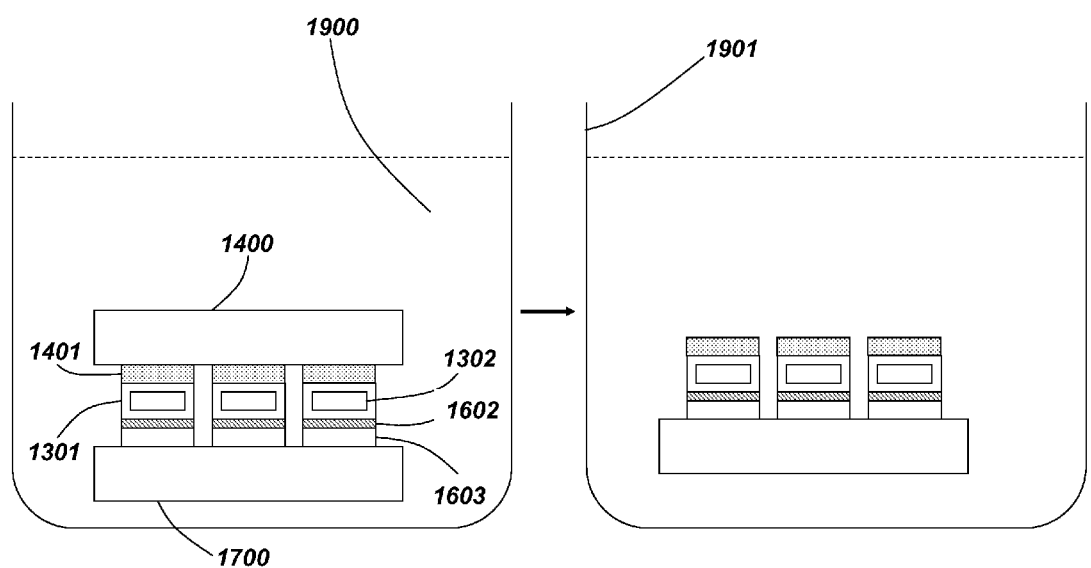
FIG. 20 shows an example of the removal of a removable medium from an array of electronic structures.

FIG. 20 shows an example of the removal of the removable medium 1400. In an example, the removable medium 1400 is a water-dissolvable tape. The arrays of the electronic structures 1303, the removable medium 1400, and the second substrate are placed in a containment vessel 901 with 100° C. water 900 for 30 minutes. In this embodiment, exposure of the removable medium to water dissolves the removable medium and removes any residue left on the arrays of the electronic structures.

EXAMPLE IMPLEMENTATION

A non-limiting example of a process for fabricating an electronic structure that is contacted to a substrate using anchors is as follows:
1 RCA clean silicon wafer
2 Spin coat PMMA sacrificial layer coating (~100 nm)
3 Cure PMMA at 250° C.
4 Pattern PMMA
5 Spin coat PI to create posts in PMMA vias (~10 μm)
6 Cure PI at 250° C.
7 Deposit Cr/Au (~100 Å/5000 Å)
8 Spin coat photoresist (PR)
9 Soft bake PR
10 Expose PR using patterned mask of metal design
11 Develop PR
12 Rinse wafers
13 Etch gold in potassium iodide
14 Etch chromium in cerric ammonium nitrate
15 Rinse wafers in De-ionised Water (DIW)
16 Strip PR
17 Spin coat PI to encapsulate gold pattern (~10 μm)
18 Cure PI at 250° C.
19 Deposit $SiO_2$ hard mask layer (50-100 nm)
20 Spin PR
21 Softbake PR
22 Expose PR using patterned mask of PI encapsulation design
23 Develop PR
24 Rinse wafers in DIW
25 Etch SiO2 layer/PI exposed by PR pattern in $CF_4/O_2$ Reactive Ion Etch (RIE) respectively
26 Etch PMMA layer using hot acetone bath
27 Remove encapsulated metal from Si support by suitable transfer printing methods (e.g., Soft Lithography or tape)

Another non-limiting example of a process fabricate an electronic structure that is contacted to a substrate using anchors is as follows:
1 Clean rigid carrier substrate
2 Apply sacrificial layer material
3 Anneal sacrificial layer @T1 (where T1 is a cure temperature for a material in the electronic structure)
4 Pattern sacrificial layer to create vias to the substrate
5 Apply base layer polymer to create posts in sacrificial layer vias
6 Cure polymer layer @T1 or lower
7 Electronic processing (varying levels of complexity)
  Embedding active devices
  Multiple layers of interconnects
8 Apply top layer polymer to encapsulate electronics
9 Cure polymer layer @T1 or lower
10 Deposit masking material
11 Pattern masking material
12 Etch trenches to define device geometry and access sacrificial layer
13 Etch sacrificial layer using selective etchant that won't attack any of the device elements
14 Remove encapsulated electronic system from carrier substrate support by suitable transfer printing methods (e.g., soft Lithography or tape)

Any other applicable technique may be employed to fabricate a device according to the principles described herein.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology described above. The computer readable medium or media can be transportable, such that the program or programs stored thereon can be loaded onto one or more different computers or other processors to implement various aspects of the present technology as described above.

The terms "program" or "software" are used herein in a generic sense to refer to any type of computer code or set of computer-executable instructions that can be employed to program a computer or other processor to implement various aspects of the present technology as described above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:
1. A flexible electronic structure, comprising:
a base polymer layer having a first surface and a second surface, wherein the first surface comprises a plurality of electrically non-conductive anchors;
at least one electronic device layer disposed above a portion of the second surface of the base polymer, the electronic device layer comprising:
two or more device islands; and
at least one stretchable interconnect electrically coupling the two or more device islands; and a second polymer layer disposed above a portion of the at least one electronic device layer;

wherein at least one anchor of the plurality of electrically non-conductive anchors is disposed beneath at least one of the two or more device islands; and wherein the flexible electronic structure is configured such that a strain-sensitive layer of the electronic device layer is at a neutral mechanical plane of the flexible electronic structure.

2. The flexible electronic structure of claim 1, wherein an average width of the plurality of electrically non-conductive anchors is in a range from about 10 μm to about 50 μm.

3. The flexible electronic structure of claim 1, wherein an average width of the plurality of electrically non-conductive anchors is in a range from about 0.1 μm to about 1000 μm.

4. The flexible electronic structure of claim 1, wherein at least some of the plurality of electrically non-conductive anchors have a substantially circular cross-section, a substantially hexagonal cross-section, a substantially oval cross-section, a substantially rectangular cross-section, a polygonal cross-section, or a non-polygonal cross-section.

5. The flexible electronic structure of claim 1, wherein the plurality of electrically non-conductive anchors are formed in a two-dimensional array.

6. The flexible electronic structure of claim 1, wherein an average width of the plurality of vias is in a range from about 10 μm to about 50 μm.

7. The flexible electronic structure of claim 1, wherein an average width of the plurality of vias is in a range from about 0.1 μm to about 1000 μm.

8. The flexible electronic structure of claim 1, wherein the plurality of vias have a pitch with an average separation ranging from about 50 μm to about 1,000 μm.

9. The flexible electronic structure of claim 1, wherein the plurality of vias have a pitch with an average separation ranging from about 0.2 to about 10,000 μm.

10. The flexible electronic structure of claim 1, wherein the plurality of vias have a pitch with an average separation ranging from about 200 to about 800 μm.

11. The flexible electronic structure of claim 1, wherein the second polymer layer comprises polyimide, polyethylene naphthalate, polybenzobisoxazole, benzocyclobutene, siloxane, or a liquid crystal polymer.

12. The flexible electronic structure of claim 1, wherein the at least one electronic device layer comprises a transistor, a light emitting diode, a transducer, a sensor, a battery, an integrated circuit, a semiconductor, a diode, arrays of electronic components, an optical system, a temperature sensors, a pressure sensor, an electrical-conductivity sensor, a chemical sensor, a resistor, a capacitor, a passive device, a photodiode, a photodetector, an emitter, a receiver, or a transceiver.

13. A flexible electronic structure, comprising:
a base polymer layer having a first surface and a second surface, wherein the first surface comprises a plurality of electrically non-conductive anchors;
at least one electronic device layer disposed above a portion of the second surface of the base polymer, the electronic device layer comprising:
two or more device islands; and
at least one stretchable interconnect electrically coupling the two or more device islands; and
a top polymer layer that is disposed above at least a portion of the at least one electronic device layer,
wherein at least one anchor of the plurality of electrically non-conductive anchors is disposed beneath at least one of the two or more device islands; and wherein a thickness of the top polymer layer or a thickness of the base layer is configured such that a strain-sensitive layer of the electronic device layer is at a neutral mechanical plane of the flexible electronic structure.

14. The flexible electronic structure of claim 13, wherein the thickness of the top polymer layer is configured such that the strain-sensitive layer of the at least one electronic device layer is at a neutral mechanical plane of the flexible electronic structure.

15. A flexible electronic structure, comprising:
a base polymer layer having a first surface and a second surface, wherein the first surface comprises a plurality of electrically non-conductive anchors, and wherein at least one of the plurality of electrically non-conductive anchors contacts a substrate;
at least one electronic device layer disposed above a portion of the second surface of the base polymer, the electronic device layer comprising:
two or more device islands; and
at least one stretchable interconnect electrically coupling the two or more device islands; and
a second polymer layer disposed above a portion of the at least one electronic device layer;
wherein at least one anchor of the plurality of electrically non-conductive anchors is disposed beneath at least one of the two or more device islands; and
wherein the flexible electronic structure is configured such that a strain-sensitive layer of the electronic device layer is at a neutral mechanical plane of the flexible electronic structure.

16. The flexible electronic structure of claim 15, wherein an average width of each anchor of the plurality of electrically non-conductive anchors is in a range from about 10 μm to about 50 μm.

17. The flexible electronic structure of claim 15, wherein an average width of each anchor of the plurality of electrically non-conductive anchors is in a range from about 0.1 μm to about 1000 μm.

18. The flexible electronic structure of claim 15, wherein at least some of the plurality of electrically non-conductive anchors have a substantially circular cross-section, a substantially hexagonal cross-section, a substantially oval cross-section, a substantially rectangular cross-section, a polygonal cross-section, or a non-polygonal cross-section.

19. The flexible electronic structure of claim 15, wherein the plurality of electrically non-conductive anchors are formed in a two-dimensional array.

20. The flexible electronic structure of claim 15, wherein an average width of each of the plurality of vias is in a range from about 10 μm to about 50 μm.

21. The flexible electronic structure of claim 15, wherein an average width of each of the plurality of vias is in a range from about 0.1 μm to about 1000 μm.

22. The flexible electronic structure of claim 15, wherein the plurality of vias have a pitch with an average separation ranging from about 50 μm to about 1,000 μm.

23. The flexible electronic structure of claim 15, wherein the plurality of vias have a pitch with an average separation ranging from about 0.2 to about 10,000 μm.

24. The flexible electronic structure of claim 15, wherein the plurality of vias have a pitch with an average separation ranging from about 200 to about 800 μm.

25. The flexible electronic structure of claim 15, wherein the second polymer layer comprises polyimide, polyethylene naphthalate, polybenzobisoxazole, benzocyclobutene, siloxane, or a liquid crystal polymer.

26. The flexible electronic structure of claim 25, wherein the at least one electronic device layer comprises a transistor, a LED, a transducer, a sensor, a battery, an integrated circuit, a semiconductor, a diode, arrays of electronic components, an optical system, a temperature sensors, a pressure sensor, an electrical-conductivity sensor, a chemical sensor, a resistor, a capacitor, a passive device, a photodiode, a photodetector, an emitter, a receiver, or a transceiver.

27. A flexible electronic structure, comprising:
- a base polymer layer having a first surface and a second surface, wherein the first surface comprises a plurality of electrically non-conductive anchors, and wherein at least one of the plurality of electrically non-conductive anchors contacts a substrate;
- at least one electronic device layer disposed above a portion of the second surface of the base polymer, the electronic device layer comprising:
  - two or more device islands; and
  - at least one stretchable interconnect electrically coupling the two or more device islands; and
- a top polymer layer that is disposed above at least a portion of the at least one electronic device layer
- wherein at least one anchor of the plurality of electrically non-conductive anchors is disposed beneath at least one of the two or more device islands; and
- wherein a thickness of the top polymer layer or a thickness of the base layer is configured such that a strain-sensitive layer of the electronic device layer is at a neutral mechanical plane of the flexible electronic structure.

28. The flexible electronic structure of claim 27, wherein the thickness of the top polymer layer is configured such that the strain-sensitive layer of the at least one electronic device layer is at a neutral mechanical plane of the flexible electronic structure.

29. A flexible electronic structure, comprising:
- a base polymer layer having a first surface and a second surface, wherein:
  - the first surface comprises a plurality of electrically non-conductive anchors;
  - the plurality of electrically non-conductive anchors have a diameter of about 50 μm and have a pitch ranging from about 200 μm to about 800 μm; and
- at least one electronic device layer disposed above the second surface of the base polymer layer, the electronic device layer comprising:
  - two or more device islands; and
  - at least one stretchable interconnect electrically coupling the two or more device islands; and
- a second polymer layer disposed above a portion of the at least one electronic device layer;
- wherein at least one anchor of the plurality of electrically non-conductive anchors is disposed beneath at least one of the two or more device islands; and
- wherein the flexible electronic structure is configured such that a strain-sensitive layer of the electronic device layer is at a neutral mechanical plane of the flexible electronic structure.

* * * * *